United States Patent
Knowles et al.

(10) Patent No.: US 7,218,661 B2
(45) Date of Patent: May 15, 2007

(54) LINE SELECTED $F_2$ TWO CHAMBER LASER SYSTEM

(75) Inventors: David S. Knowles, San Diego, CA (US); Daniel J. W. Brown, San Diego, CA (US); Richard L. Sandstrom, Encinitas, CA (US); German E. Rylov, Murrieta, CA (US); Eckehard D. Onkels, San Diego, CA (US); Herve A. Besaucele, San Diego, CA (US); David W. Myers, Poway, CA (US); Alexander I. Ershov, San Diego, CA (US); William N. Partlo, Poway, CA (US); Igor V. Fomenkov, San Diego, CA (US); Richard C. Ujazdowski, Poway, CA (US); Richard M. Ness, San Diego, CA (US); Scot T. Smith, San Diego, CA (US); William G. Hulburd, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 335 days.

(21) Appl. No.: 10/854,614

(22) Filed: May 25, 2004

(65) Prior Publication Data
US 2004/0258122 A1 Dec. 23, 2004

Related U.S. Application Data

(60) Division of application No. 10/056,619, filed on Jan. 23, 2002, now Pat. No. 6,801,560, which is a continuation-in-part of application No. 10/036,727, filed on Dec. 21, 2001, now Pat. No. 6,865,210, which is a continuation-in-part of application No. 10/036,676, (Continued)

(51) Int. Cl.
*H01S 3/22* (2006.01)

(52) U.S. Cl. .......................................... 372/55
(58) Field of Classification Search ............ 372/55–57; 375/55, 57
See application file for complete search history. filed

(56) References Cited

U.S. PATENT DOCUMENTS

| | | | |
|---|---|---|---|
| 4,223,279 A | 9/1980 | Bradford, Jr. et al. | 331/94.5 |
| 4,455,658 A | 6/1984 | Sutter et al. | 372/38 |
| 4,959,840 A | 9/1990 | Akins et al. | 372/57 |

(Continued)

*Primary Examiner*—Tim T. Vo
*Assistant Examiner*—Hung Tran Vy
(74) *Attorney, Agent, or Firm*—William C. Cray

(57) ABSTRACT

An injection seeded modular gas discharge laser system capable of producing high quality pulsed laser beams at pulse rates of about 4,000 Hz or greater and at pulse energies of about 5 mJ or greater. Two separate discharge chambers are provided, one of which is a part of a master oscillator producing a very narrow band seed beam which is amplified in the second discharge chamber. The chambers can be controlled separately permitting separate optimization of wavelength parameters in the master oscillator and optimization of pulse energy parameters in the amplifying chamber. A preferred embodiment in a $F_2$ laser system configured as a MOPA and specifically designed for use as a light source for integrated circuit lithography. In the preferred MOPA embodiment, each chamber comprises a single tangential fan providing sufficient gas flow to permit operation at pulse rates of 4000 Hz or greater by clearing debris from the discharge region in less time than the approximately 0.25 milliseconds between pulses. The master oscillator is equipped with a line selection package for selecting the strongest $F_2$ spectral line.

77 Claims, 48 Drawing Sheets

Related U.S. Application Data on Dec. 21, 2001, now Pat. No. 6,882,674, which is a continuation-in-part of application No. 10/012,002, filed on Nov. 30, 2001, now Pat. No. 6,625,191, which is a continuation-in-part of application No. 10/006,913, filed on Nov. 29, 2001, now Pat. No. 6,535,531, which is a continuation-in-part of application No. 10/000,991, filed on Nov. 14, 2001, now Pat. No. 6,795,474, which is a continuation-in-part of application No. 09/970,503, filed on Oct. 3, 2001, now abandoned, which is a continuation-in-part of application No. 09/943,343, filed on Aug. 29, 2001, now Pat. No. 6,567,450, which is a continuation-in-part of application No. 09/879,311, filed on Jun. 6, 2001, now Pat. No. 6,590,922, and a continuation-in-part of application No. 09/854,097, filed on May 11, 2001, now Pat. No. 6,757,316, which is a continuation-in-part of application No. 09/848,043, filed on May 3, 2001, now Pat. No. 6,549,551, which is a continuation-in-part of application No. 09/829,475, filed on Apr. 9, 2001, now Pat. No. 6,765,945, and a continuation-in-part of application No. 09/771,789, filed on Jan. 29, 2001, now Pat. No. 6,539,042, which is a continuation-in-part of application No. 09/768,753, filed on Jan. 23, 2001, now Pat. No. 6,414,979, which is a continuation-in-part of application No. 09/684,629, filed on Oct. 6, 2000, now Pat. No. 6,442,181, which is a continuation-in-part of application No. 09/473,795, filed on Dec. 28, 1999, now Pat. No. 6,381,257, which is a continuation-in-part of application No. 09/473,852, filed on Dec. 27, 1999, now Pat. No. 6,539,046, which is a continuation-in-part of application No. 09/459,165, filed on Dec. 10, 1999, now Pat. No. 6,370,174, which is a continuation-in-part of application No. 09/309,478, filed on May 10, 1999, now Pat. No. 6,556,612, which is a continuation-in-part of application No. 09/855,310, filed on May 14, 2001, now Pat. No. 6,556,600.

(56) References Cited

U.S. PATENT DOCUMENTS

| | | | |
|---|---|---|---|
| 5,023,884 A | 6/1991 | Akins et al. | 372/57 |
| 5,025,445 A | 6/1991 | Anderson et al. | 372/20 |
| 5,025,446 A | 6/1991 | Kuizenga | 372/21 |
| 5,189,678 A | 2/1993 | Ball et al. | 372/28 |
| 5,313,481 A | 5/1994 | Cook et al. | 372/37 |
| 5,315,611 A | 5/1994 | Ball et al. | 372/56 |
| 5,359,620 A | 10/1994 | Akins | 372/58 |
| 5,448,580 A | 9/1995 | Birx et al. | 372/38 |
| 5,471,965 A | 12/1995 | Kapich | 123/565 |
| 5,852,621 A | 12/1998 | Sandstrom | 372/25 |
| 5,863,017 A | 1/1999 | Larson et al. | 248/176.1 |
| 5,953,360 A | 9/1999 | Vitruk et al. | 372/87 |
| 5,978,394 A | 11/1999 | Newman et al. | 372/32 |
| 6,005,879 A | 12/1999 | Sandstrom et al. | 372/25 |
| 6,016,325 A | 1/2000 | Ness et al. | 372/38 |
| 6,018,537 A | 1/2000 | Hofmann et al. | 372/25 |
| 6,028,880 A | 2/2000 | Carlesi et al. | 372/58 |
| 6,067,311 A | 5/2000 | Morton et al. | 372/57 |
| 6,094,448 A | 7/2000 | Fomenkov et al. | 372/102 |
| 6,104,735 A | 8/2000 | Webb | 372/37 |
| 6,109,574 A | 8/2000 | Pan et al. | 248/176.1 |
| 6,128,323 A | 10/2000 | Myers et al. | 372/38 |
| 6,151,349 A | 11/2000 | Gong et al. | 372/58 |
| 6,164,116 A | 12/2000 | Rice et al. | 73/1.72 |
| 6,192,064 B1 | 2/2001 | Algots et al. | 372/99 |
| 6,208,674 B1 | 3/2001 | Webb et al. | 372/57 |
| 6,208,675 B1 | 3/2001 | Webb | 372/58 |
| 6,212,211 B1 | 4/2001 | Azzola et al. | 372/23 |
| 6,219,368 B1 | 4/2001 | Govorkov | 372/59 |
| 6,240,117 B1 | 5/2001 | Gong et al. | 372/58 |
| 6,317,447 B1 | 11/2001 | Partlo et al. | 372/57 |
| 6,414,979 B2 | 7/2002 | Ujazdowski et al. | 372/87 |
| 6,477,193 B2 | 11/2002 | Oliver et al. | 372/58 |
| 6,493,374 B1 | 12/2002 | Fomenkov et al. | 372/102 |
| 6,556,612 B2 | 4/2003 | Ershov et al. | 372/103 |
| 6,567,450 B2 * | 5/2003 | Myers et al. | 372/55 |
| 6,618,421 B2 | 9/2003 | Das et al. | 372/55 |
| 6,625,191 B2 * | 9/2003 | Knowles et al. | 372/55 |
| 6,782,031 B1 | 8/2004 | Hoffmann et al. | |
| 6,801,560 B2 * | 10/2004 | Smith et al. | 372/55 |
| 2002/0154668 A1 * | 10/2002 | Knowles et al. | 372/55 |
| 2003/0099269 A1 * | 5/2003 | Ershov et al. | 372/55 |

* cited by examiner

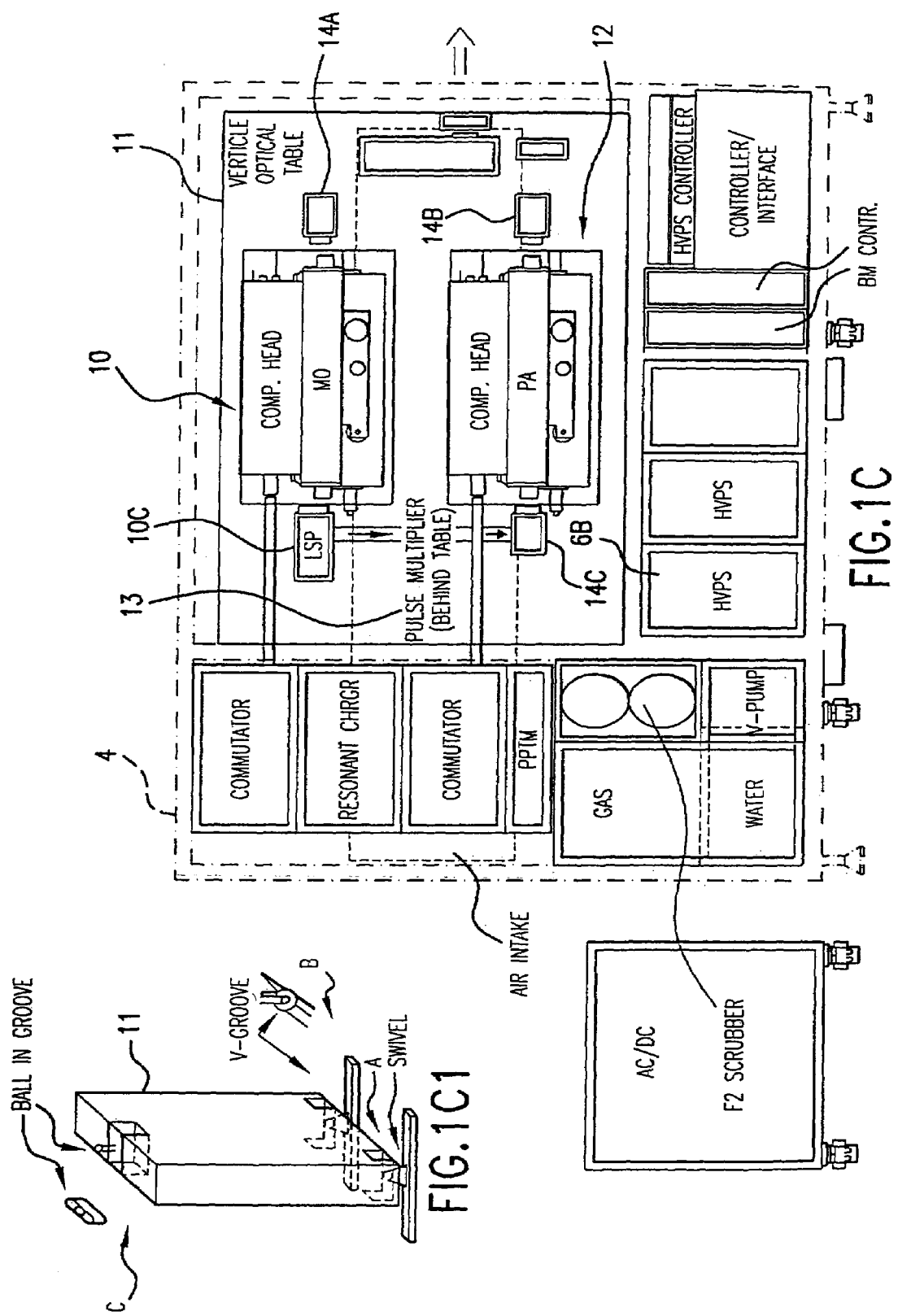

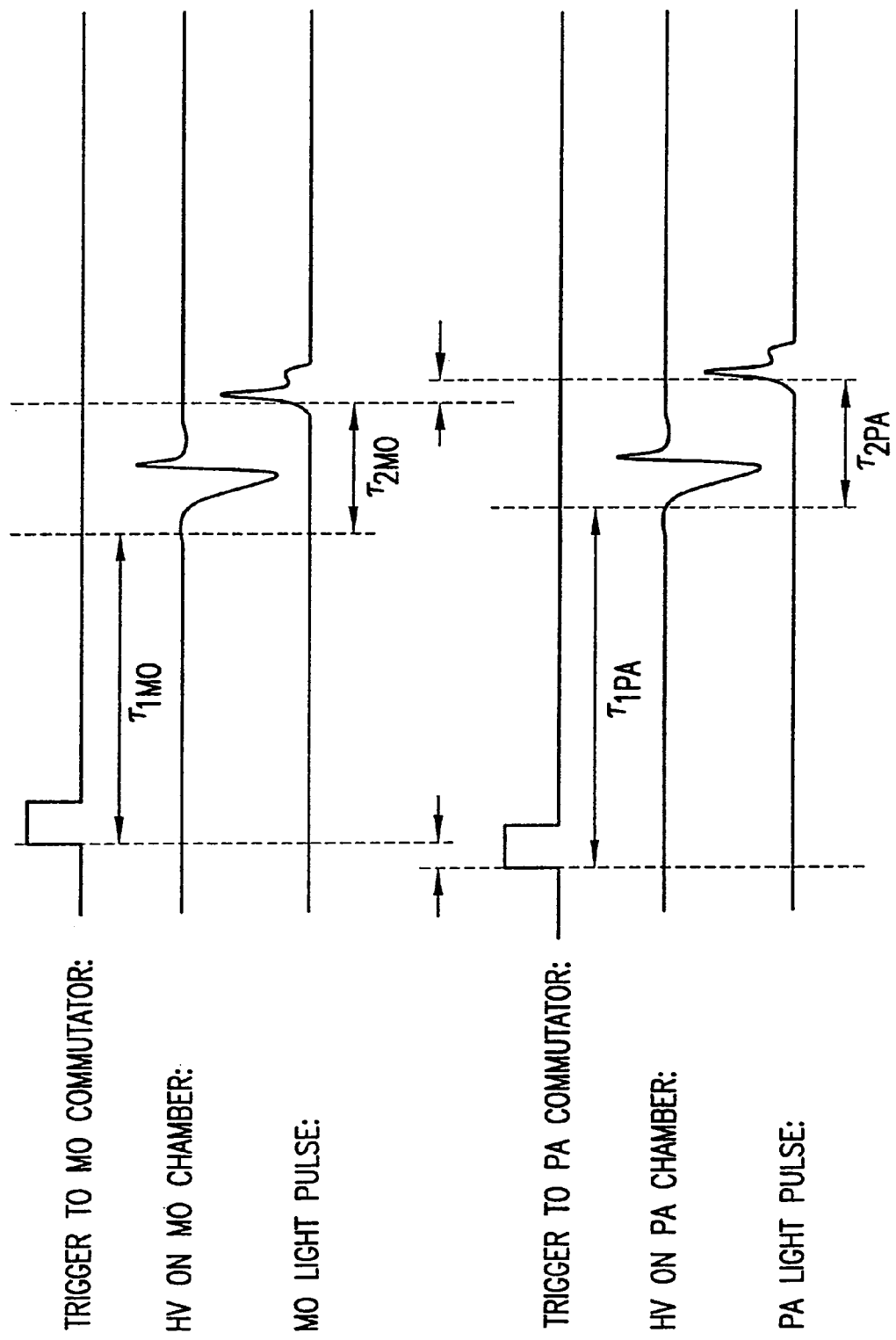

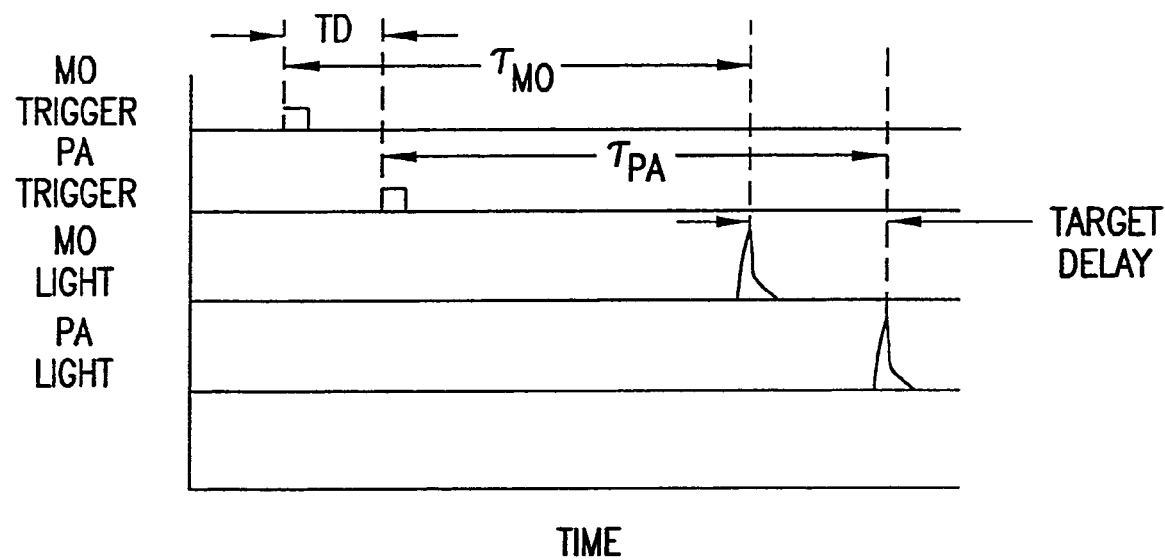
FIG.4D1

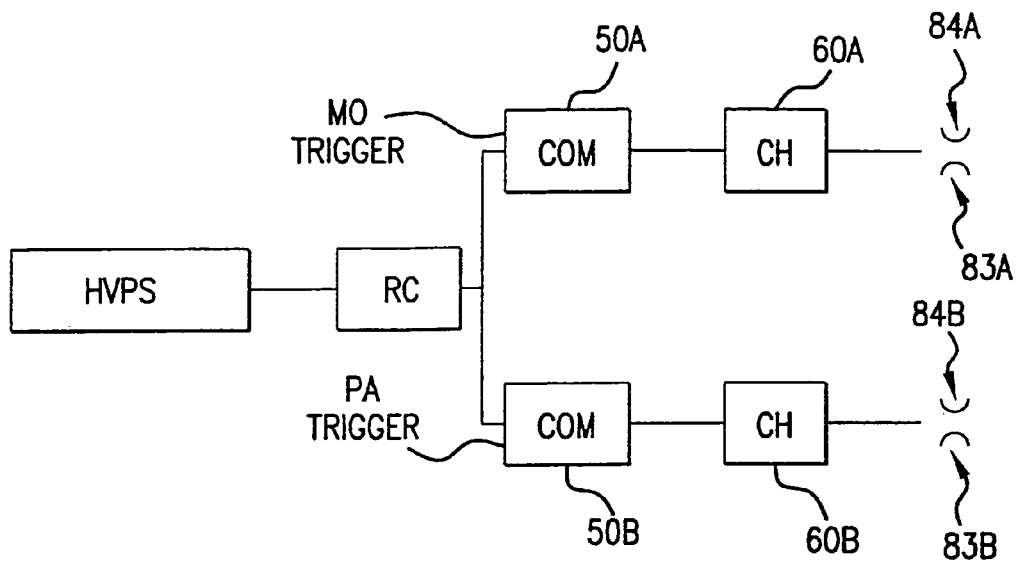
FIG.5C1
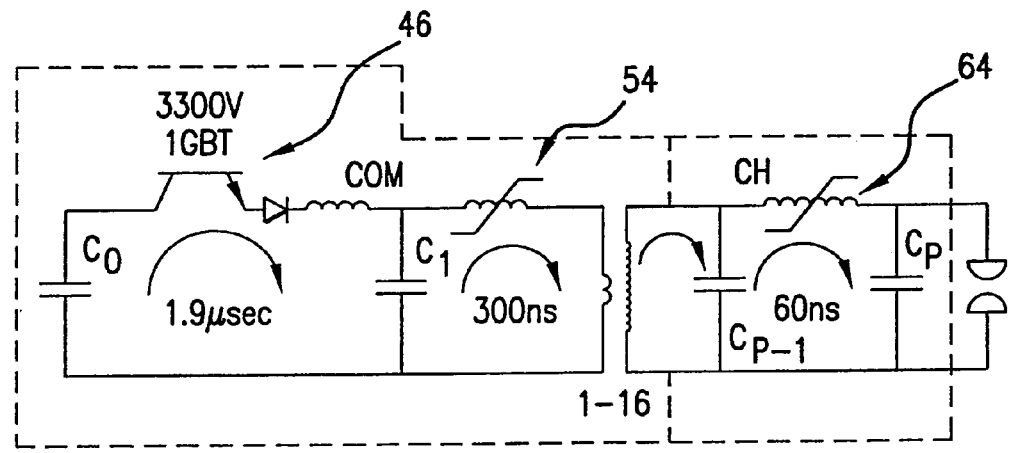
FIG.5C2
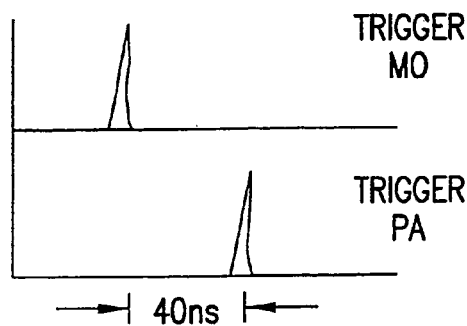
FIG.5C3

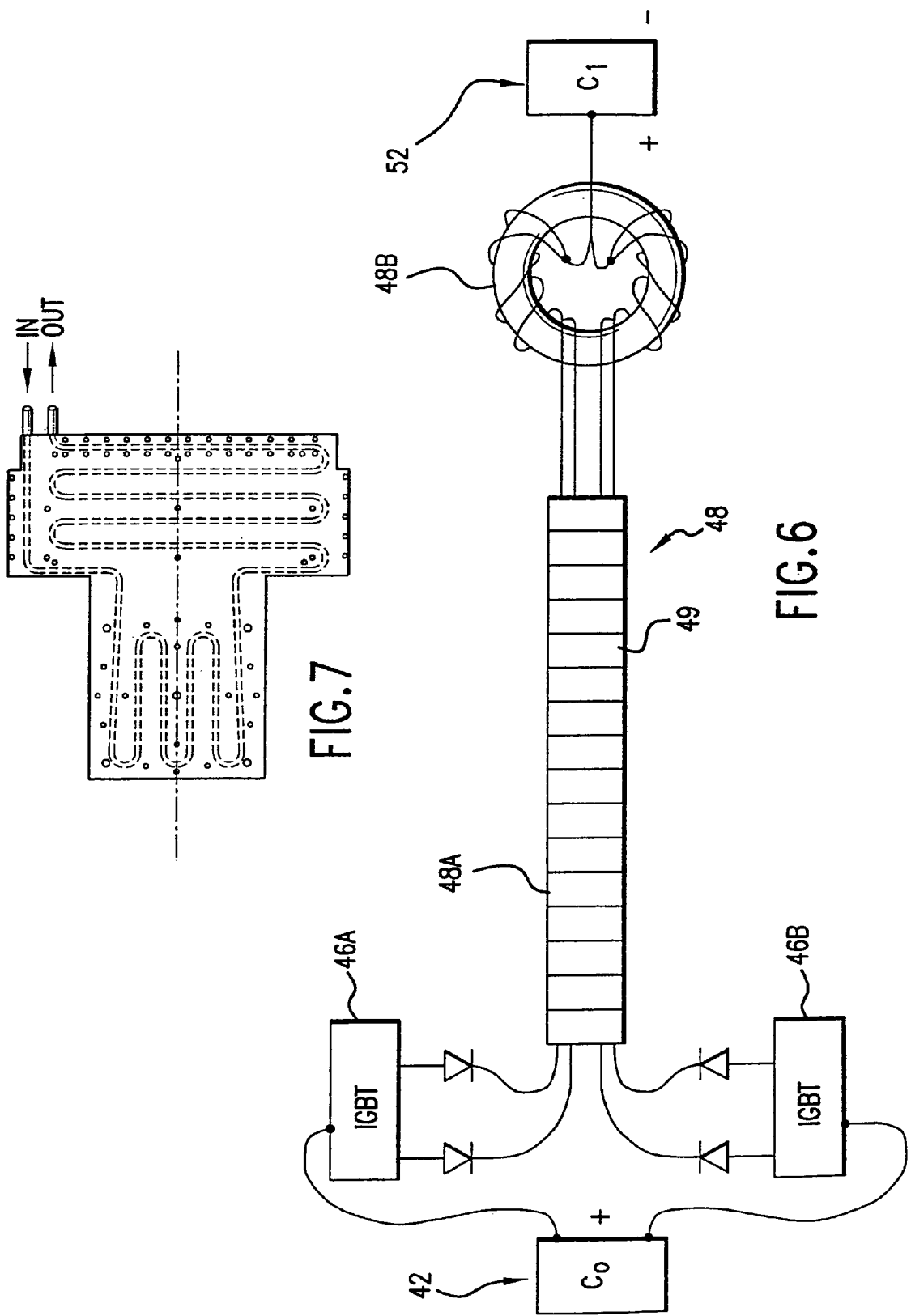

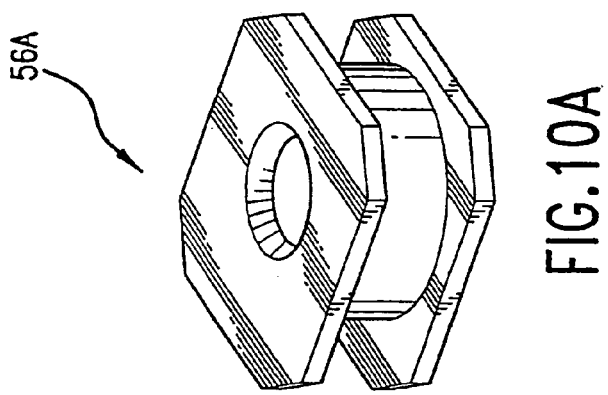
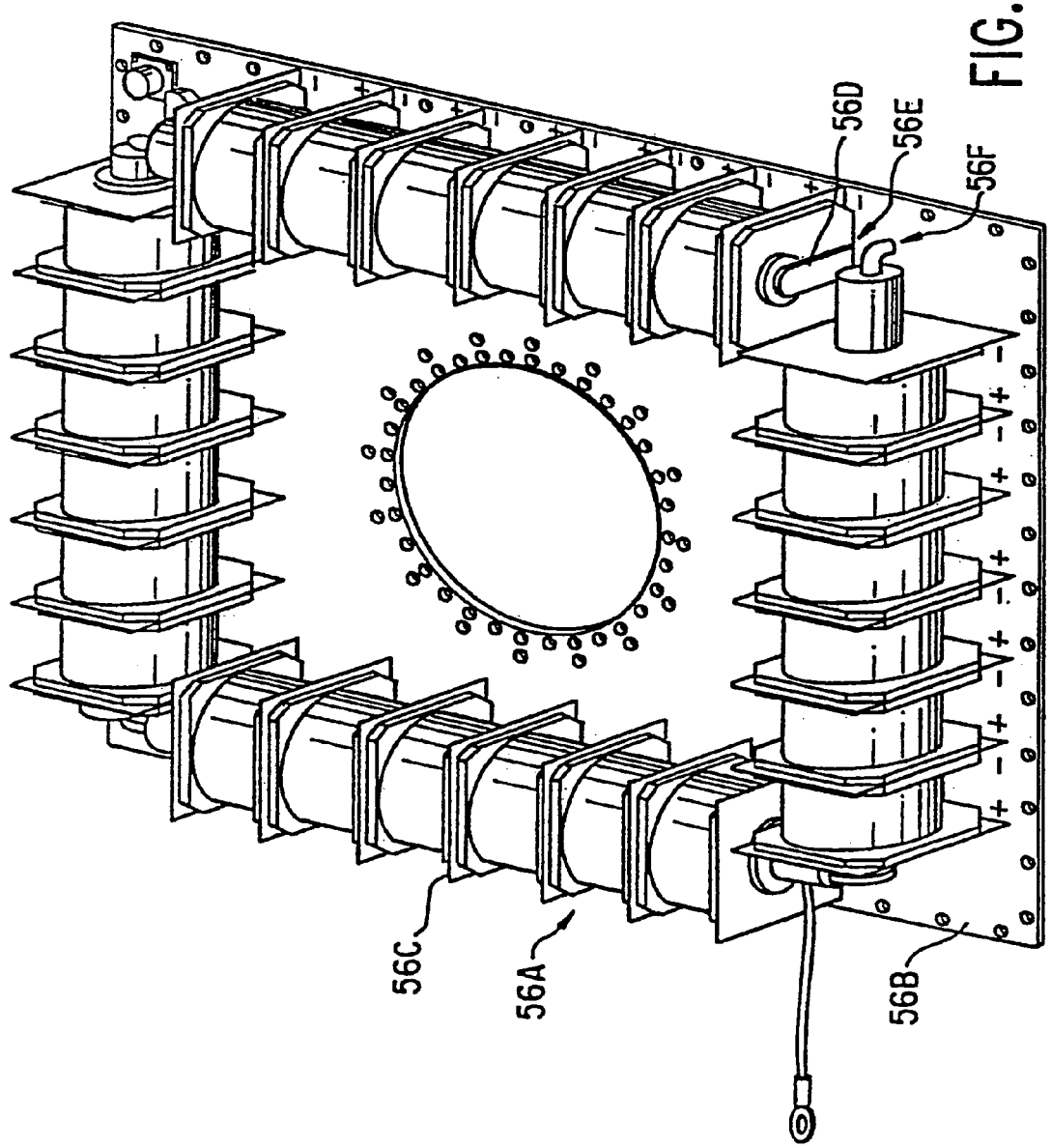

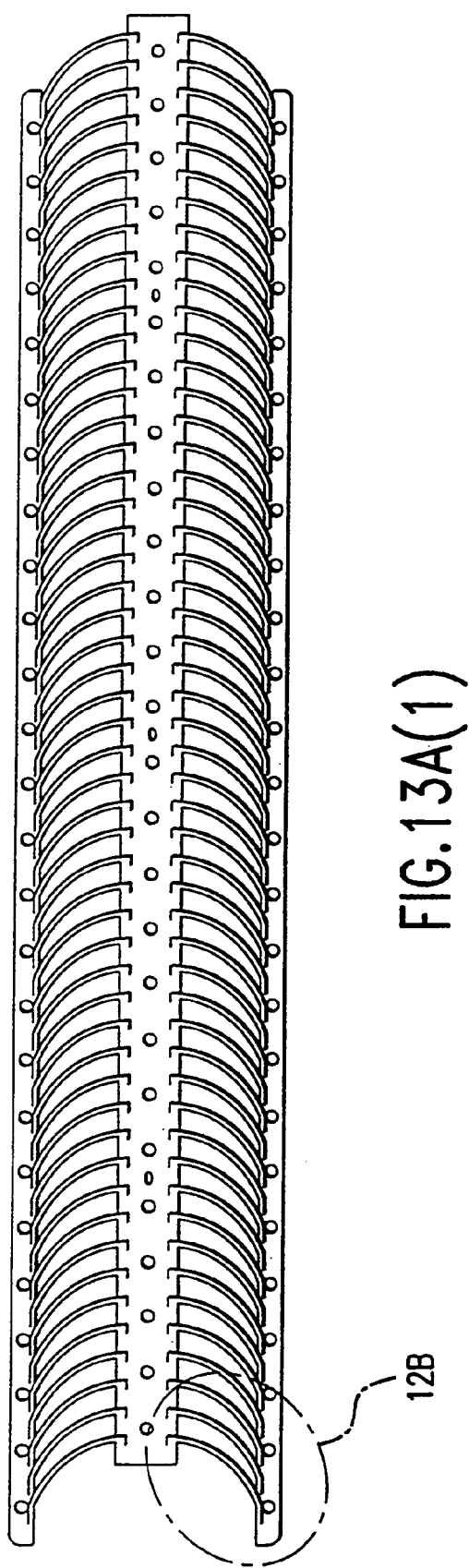
FIG.13A(1)

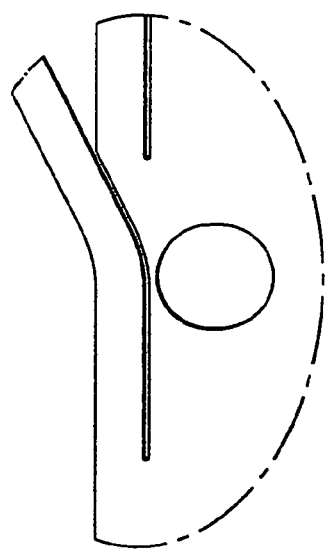
FIG.13A(4)
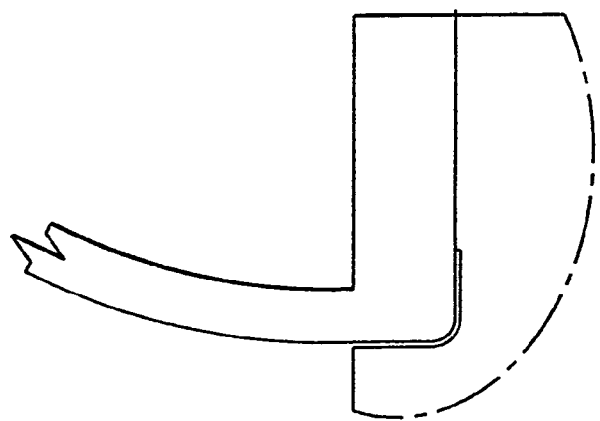
FIG.13A(3)
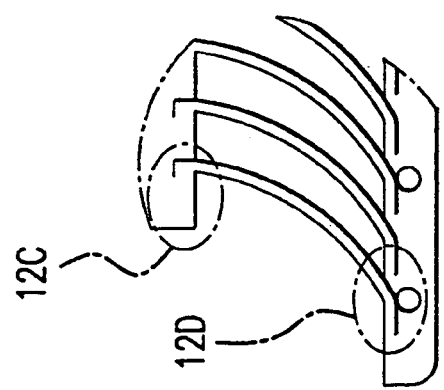
FIG.13A(2)

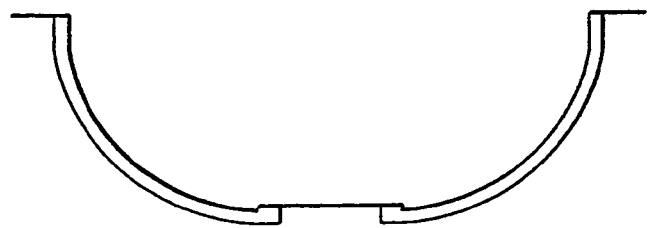
FIG.13A(6)
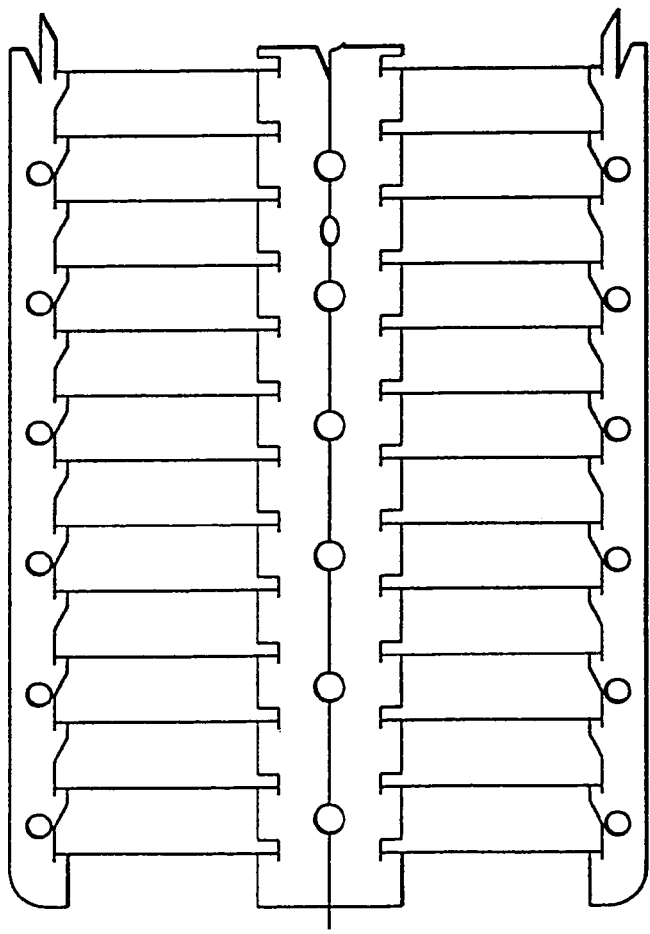
FIG.13A(5)

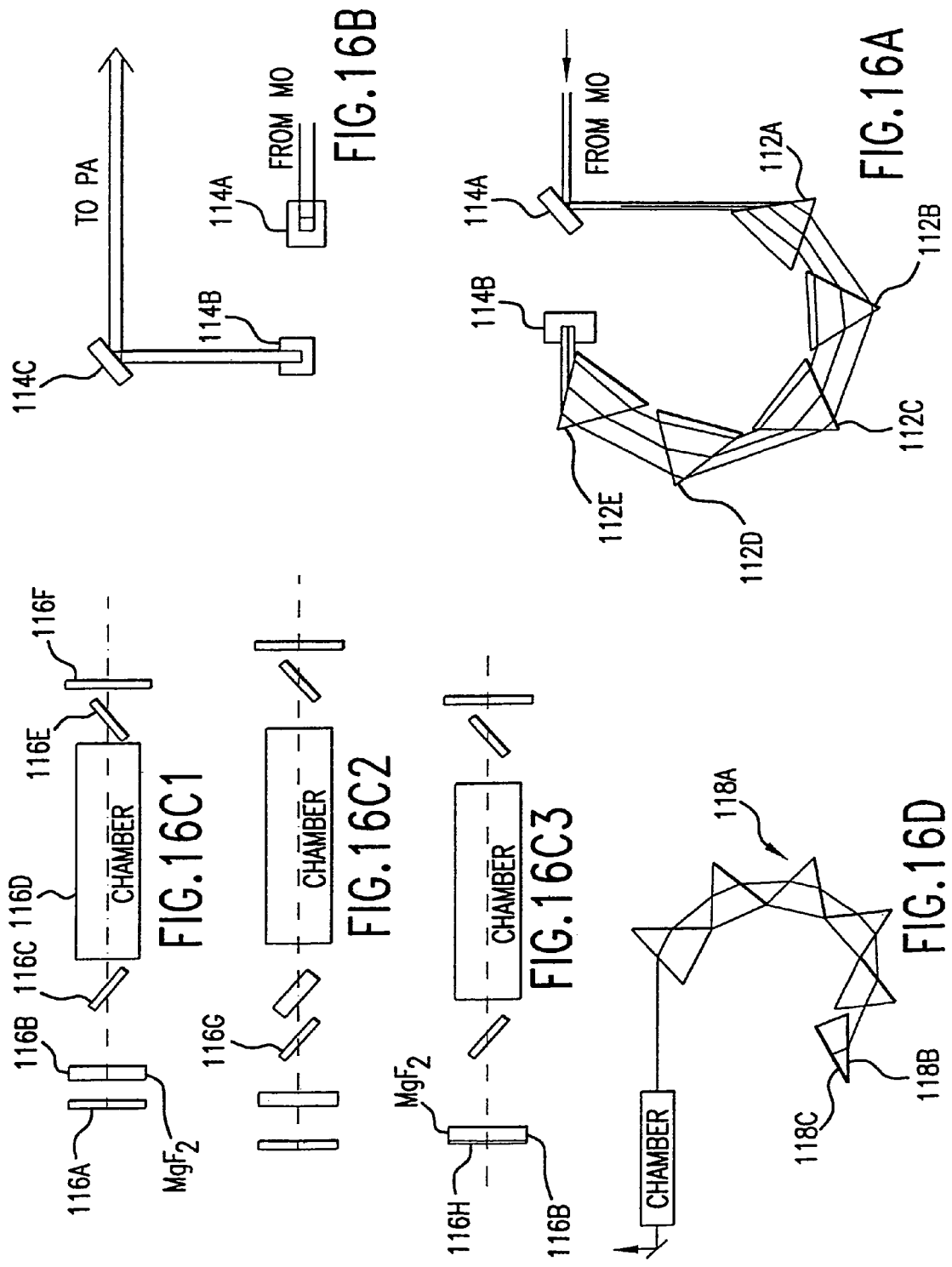

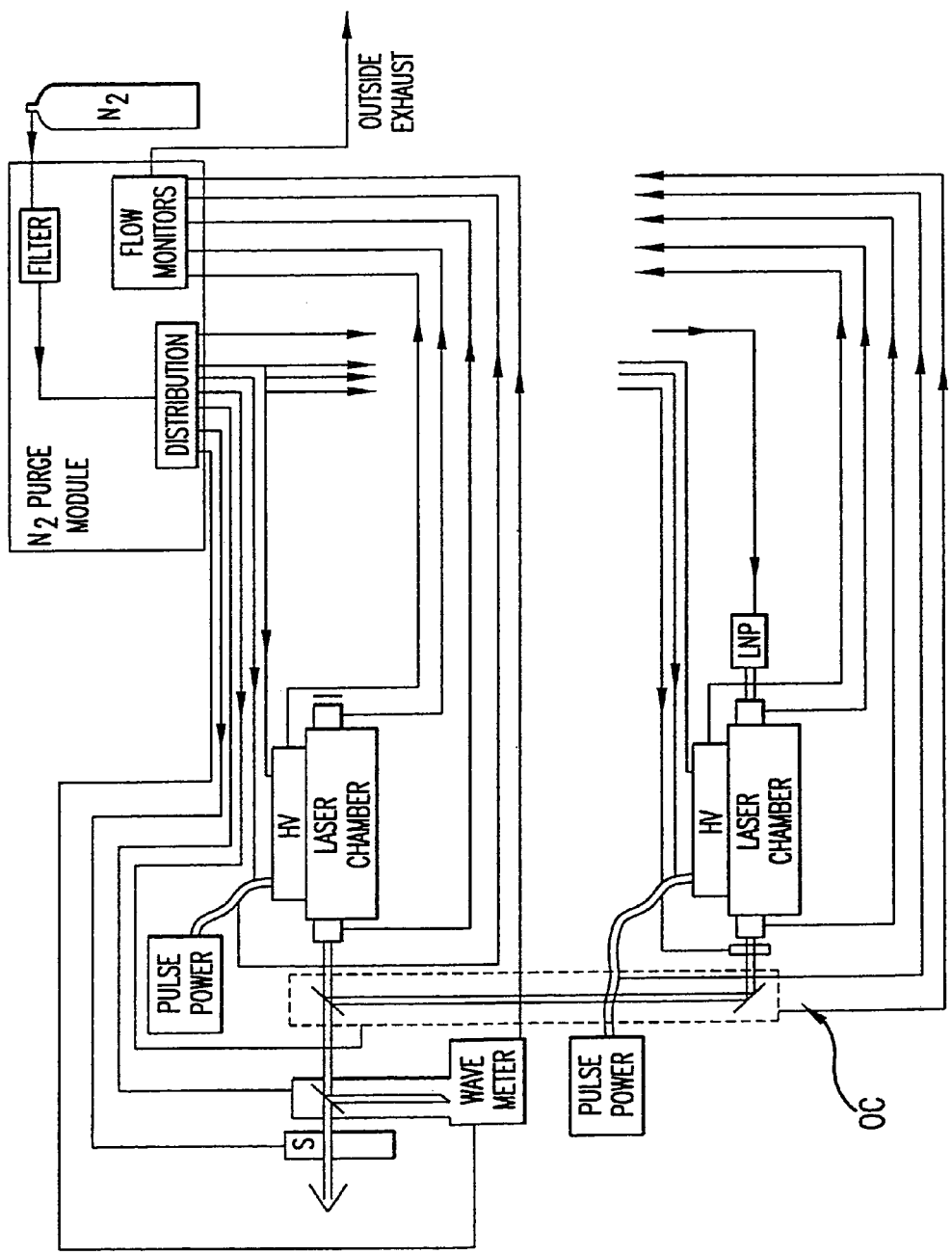

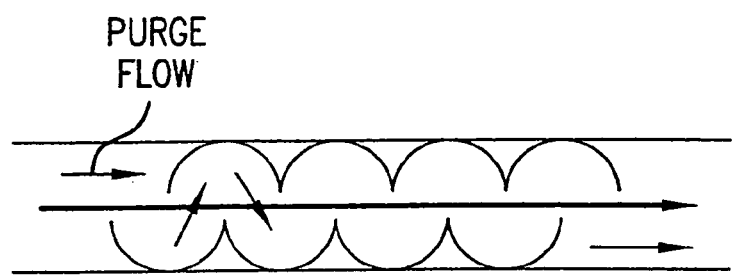
FIG.19C1
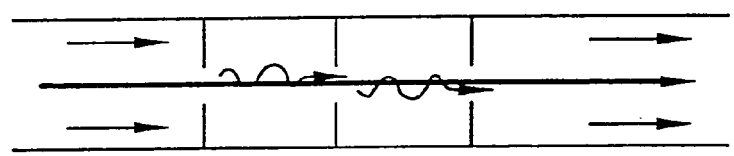
FIG.19C2
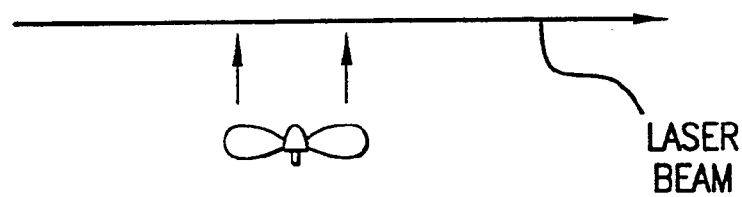
FIG.19C3
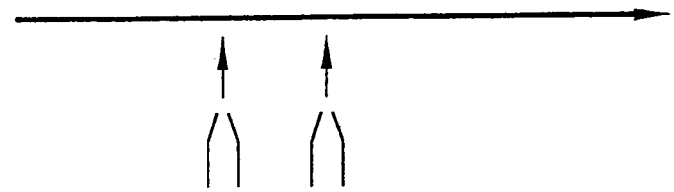
FIG.19C4

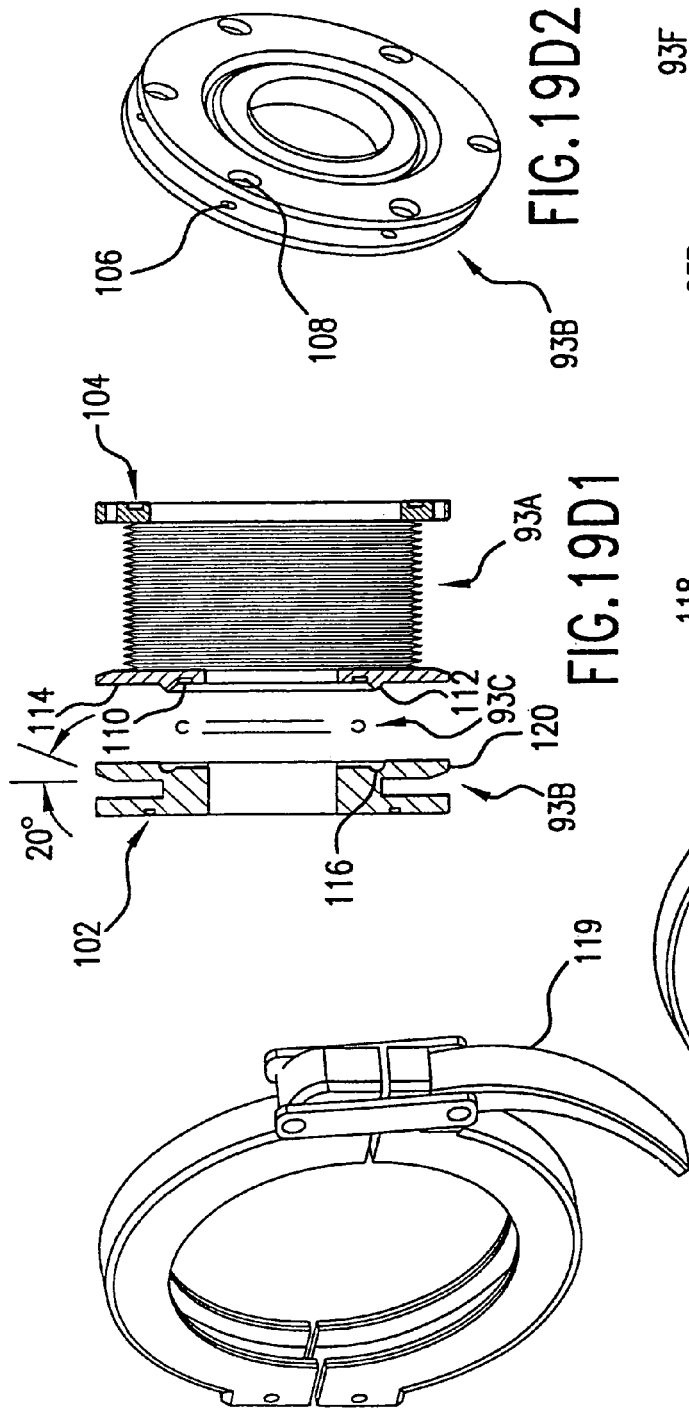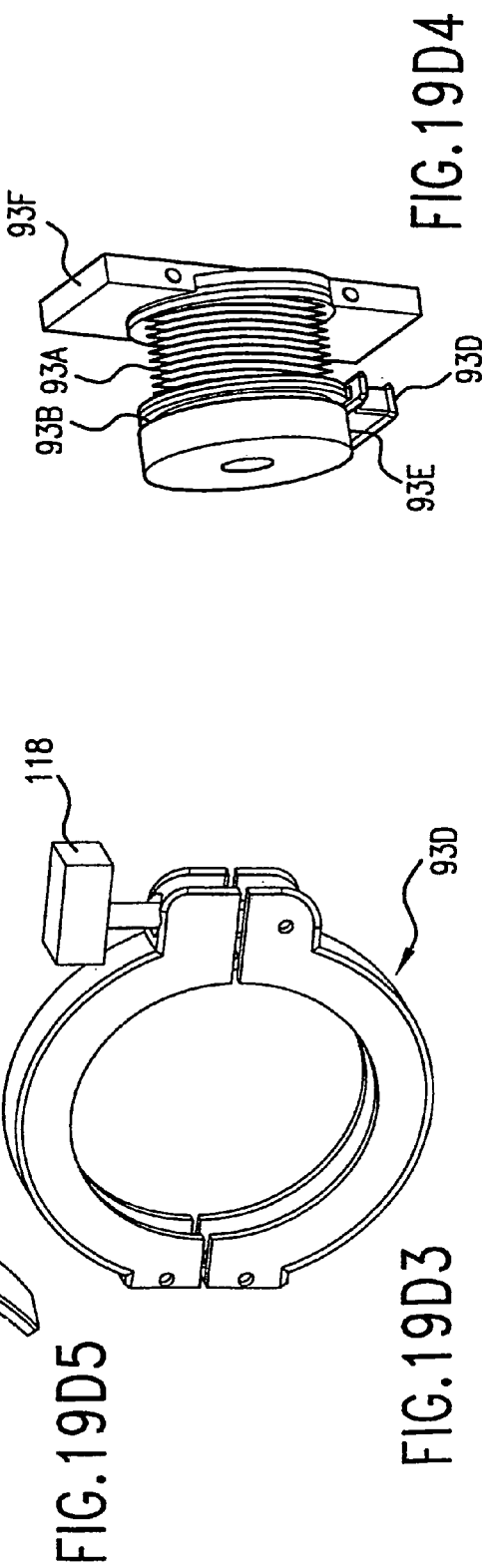

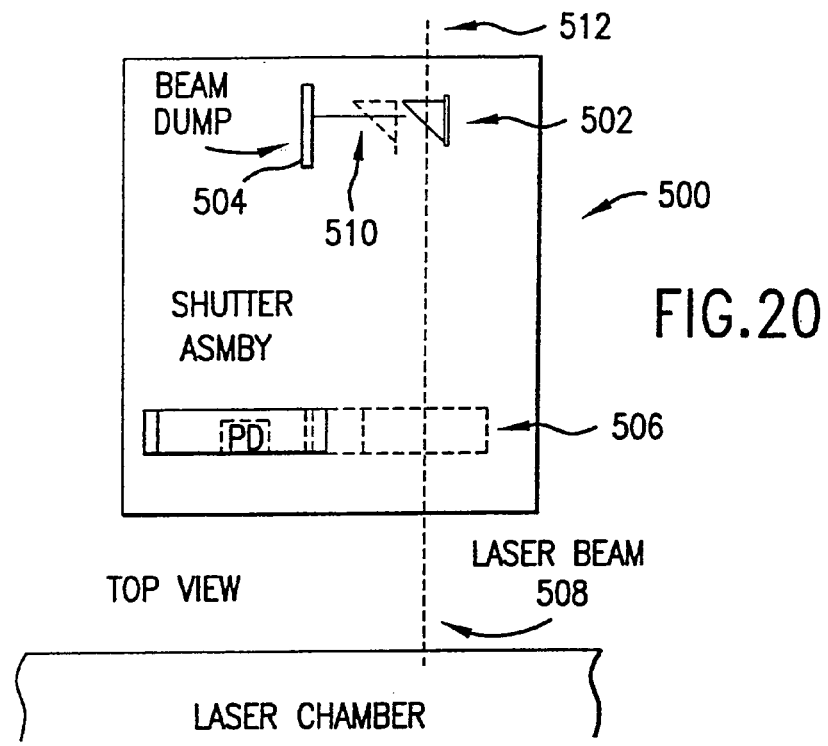
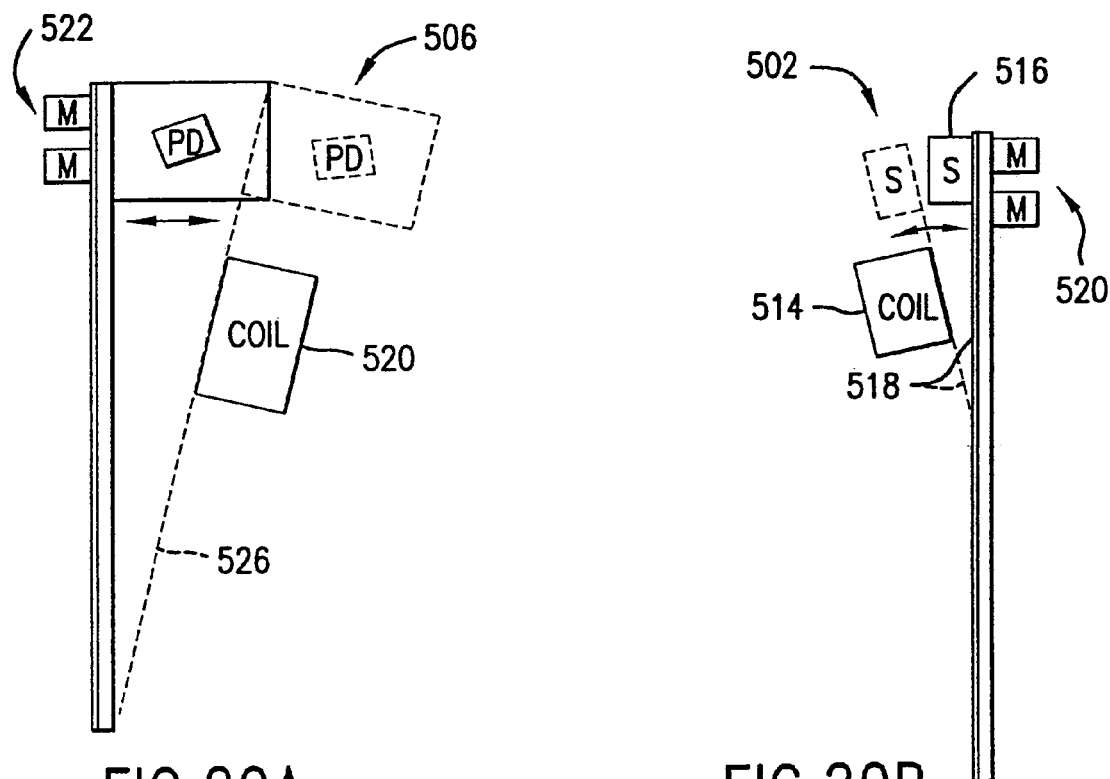

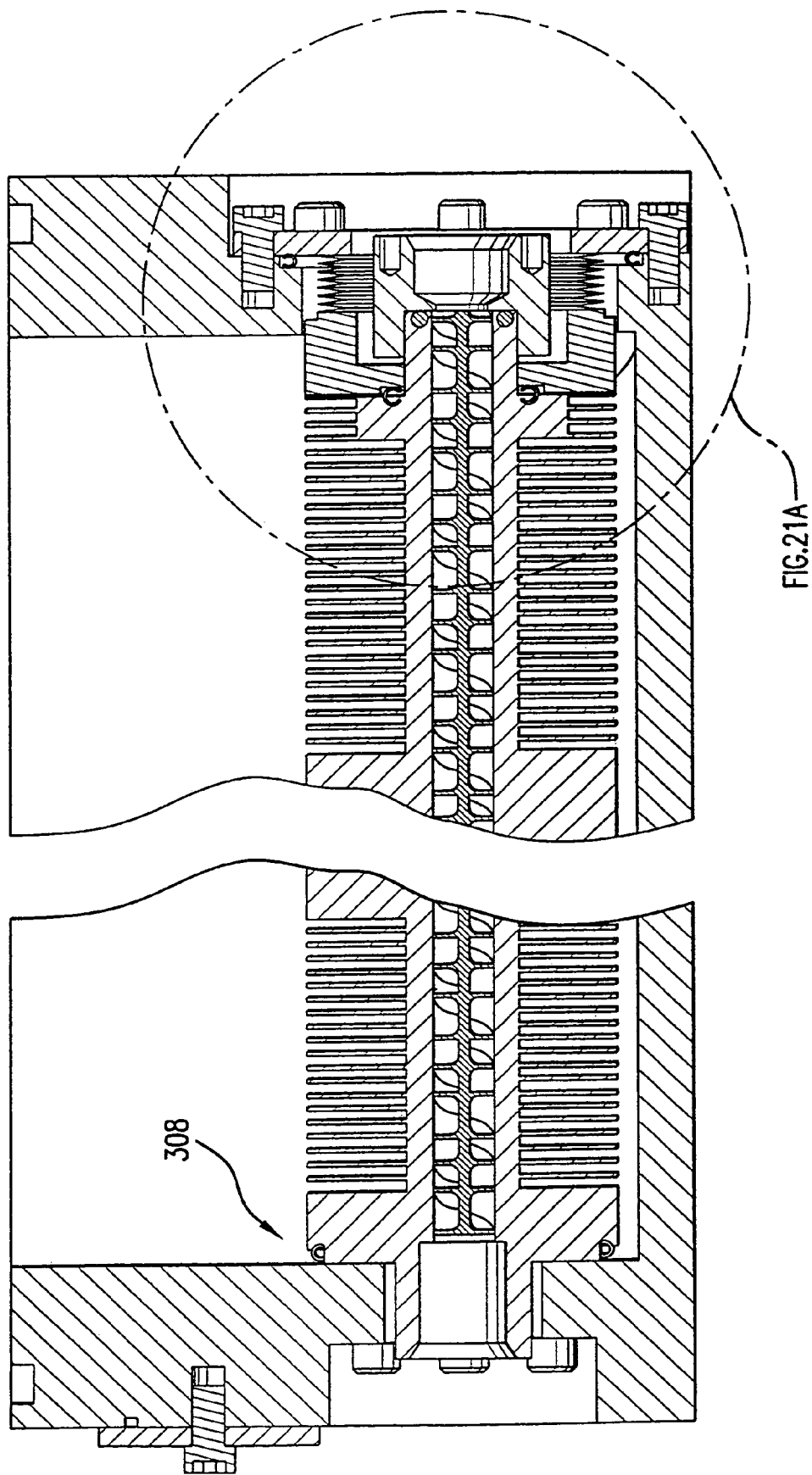

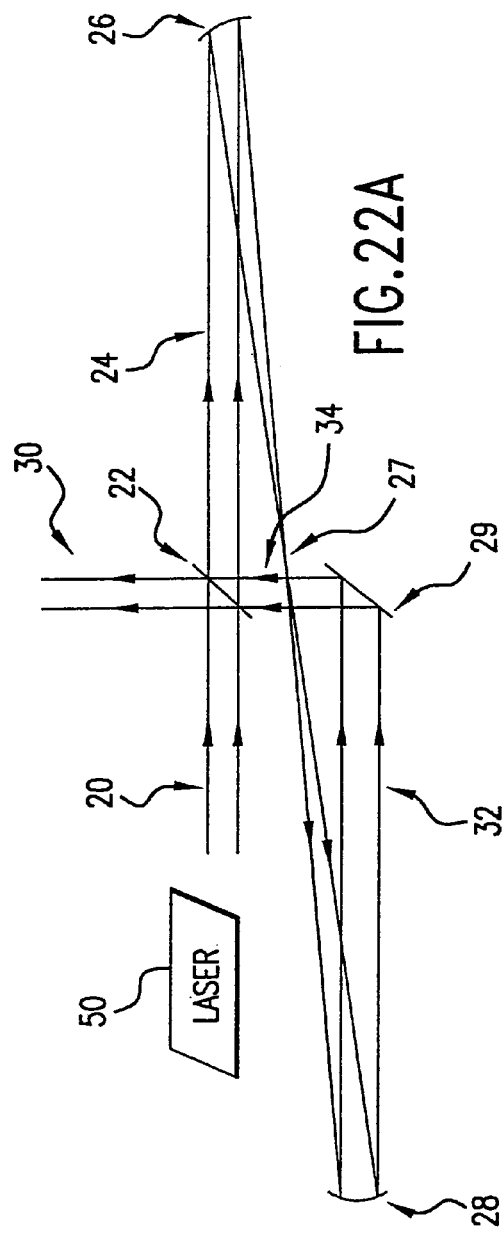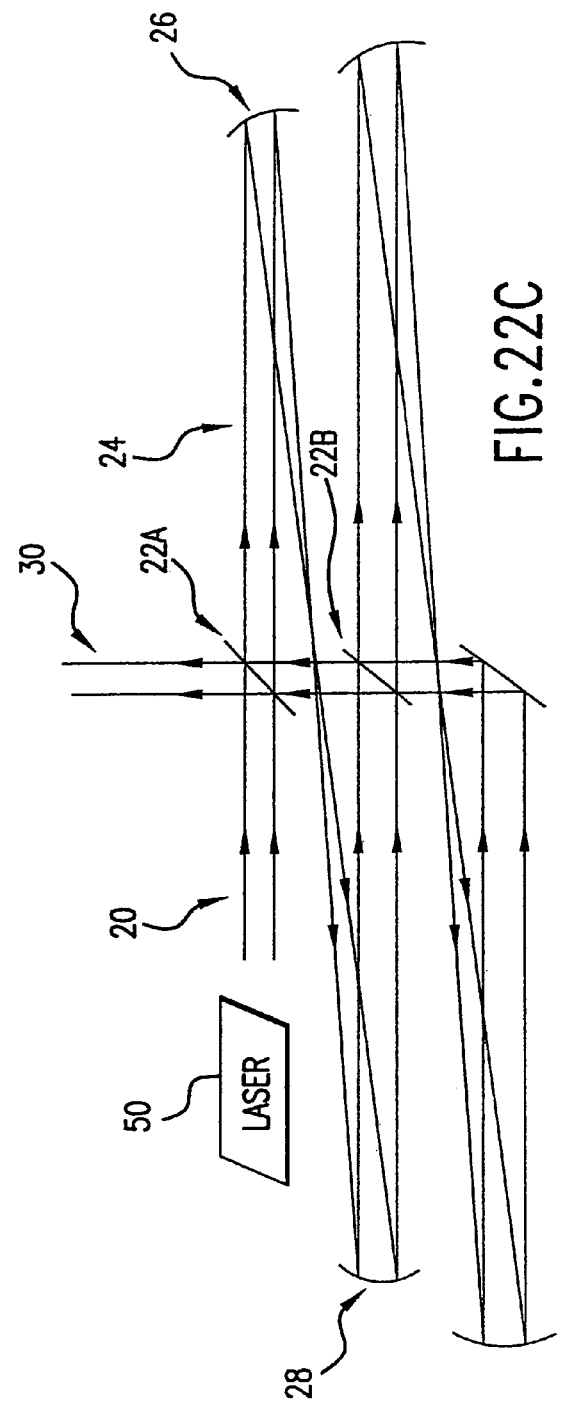

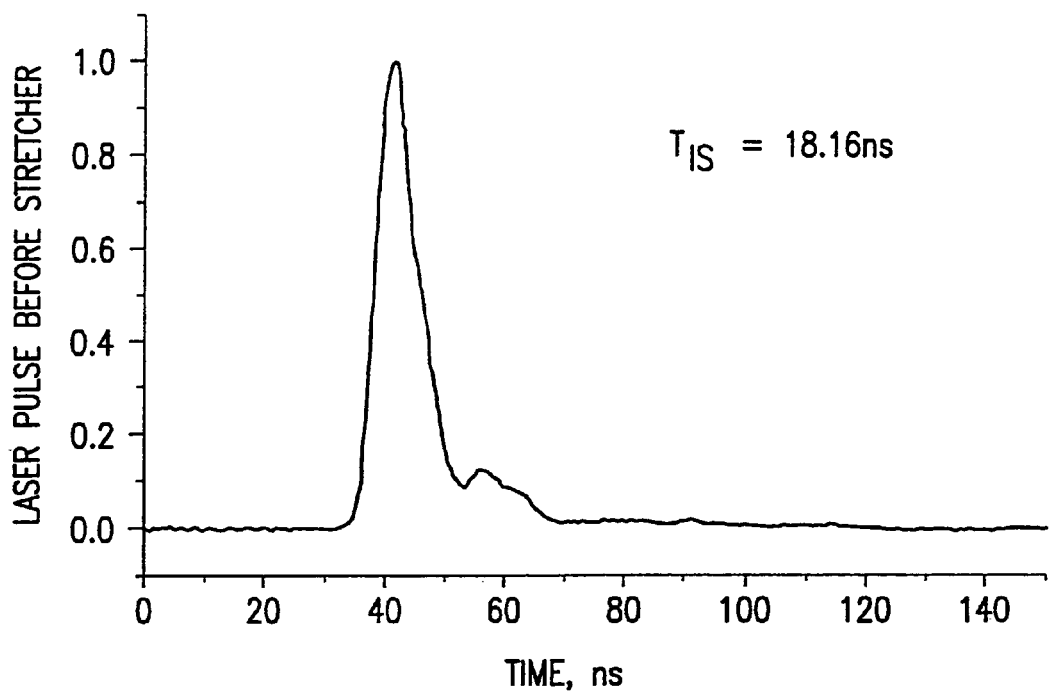
FIG.22B1
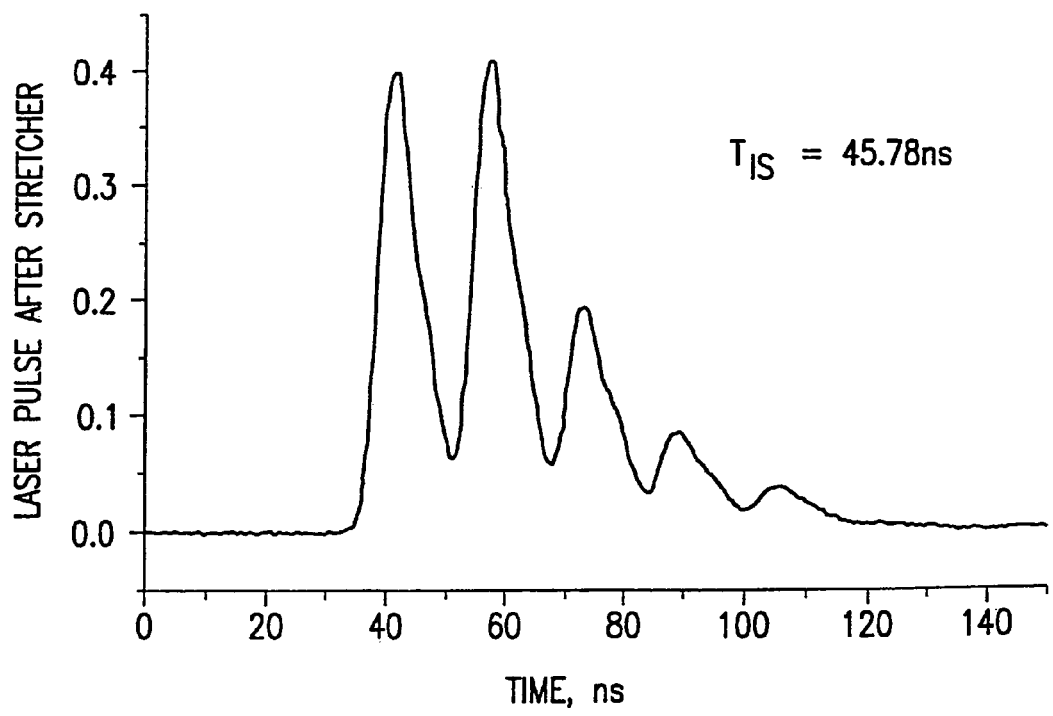
FIG.22B2

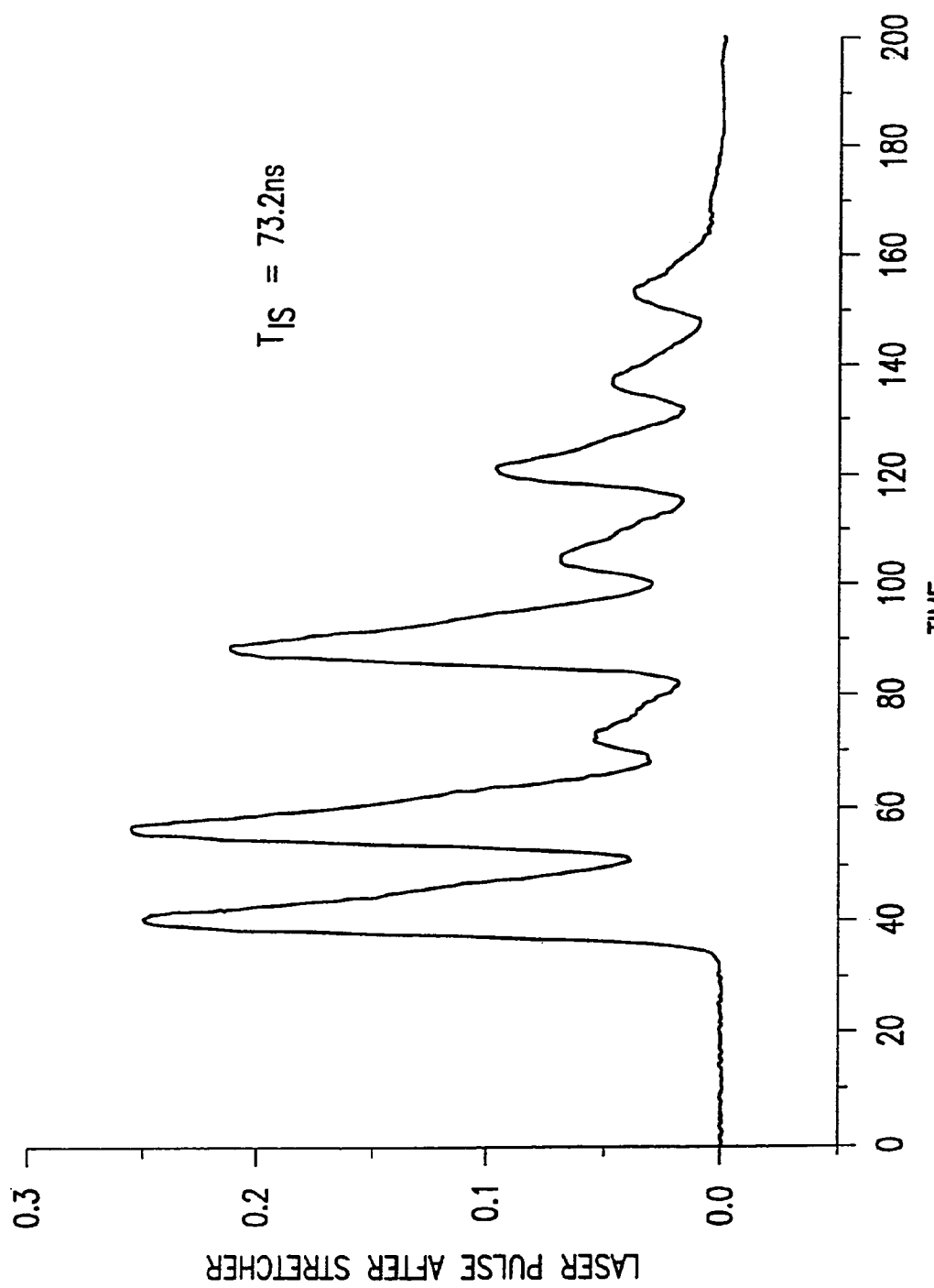

LINE SELECTED F₂ TWO CHAMBER LASER SYSTEM

The present invention is a divisional of Ser. No. 10/056,619, filed on Jan. 23, 2002 wich is a continuation-in-part of Ser. No. 10/036,676, filed Dec. 21, 2001, Ser. No. 10/036,727, filed Dec. 21, 2001, Ser. No. 10/012,002, filed Nov. 30, 2001, Ser. No. 10/006,913, filed Nov. 29, 2001, Ser. No. 10/000,991, filed Nov. 14, 2001, Ser. No. 09/970,503, filed Oct. 3, 2001, Ser. No. 09/943,343, filed Aug. 29, 2001, Ser. No. 09/879,311, filed Jun. 6, 2001, Ser. No. 09/855,310, filed May 14, 2001, Ser. No. 09/854,097, filed May 11, 2001, Ser. No. 09/848,043, filed May 3, 2001, Ser. No. 09/829,475, filed Apr. 9, 2001, Ser. No. 09/771,789, filed Jan. 29, 2001, Ser. No. 09/768,753, filed Jan. 23, 2001, Ser. No. 09/684,629, filed Oct. 6, 2000, Ser. No. 09/473,795, filed Dec. 28, 1999, Ser. No. 09/473,852, filed Dec. 27, 1999, Ser. No. 09/459,165, filed Dec. 10, 1999 and Ser. No. 09/309,478, filed May 10, 1999. This invention relates to electric discharge gas lasers and in particular to high repetition rate $F_2$ lasers.

BACKGROUND OF THE INVENTION

Electric Discharge Gas Lasers

Electric discharge gas lasers are well known and have been available since soon after lasers were invented in the 1960s. A high voltage discharge between two electrodes excites a laser gas to produce a gaseous gain medium. A resonance cavity containing the gain medium permits stimulated amplification of light which is then extracted from the cavity in the form of a laser beam. Many of these electric discharge gas lasers are operated in a pulse mode.

Excimer Lasers

Excimer lasers are a particular type of electric discharge gas laser and they have been known since the mid 1970s. A description of an excimer laser, useful for integrated circuit lithography, is described in U.S. Pat. No. 5,023,884 issued Jun. 11, 1991 entitled "Compact Excimer Laser." This patent has been assigned to Applicants' employer, and the patent is hereby incorporated herein by reference. The excimer laser described in Patent '884 is a high repetition rate pulse laser. These excimer lasers, when used for integrated circuit lithography, are typically operated in a fabrication line "around-the-clock" producing many thousands of valuable integrated circuits per hour; therefore, down-time can be very expensive. For this reason most of the components are organized into modules which can be replaced within a few minutes. Excimer lasers used for lithography typically must have its output beam reduced in bandwidth to a fraction of a picometer. Electric discharge gas lasers of the type described in Patent '884 utilize an electric pulse power system to produce the electrical discharges, between the two electrodes. In such prior art systems, a direct current power supply charges a capacitor bank called "the charging capacitor" or "$C_0$" to a predetermined and controlled voltage called the "charging voltage" for each pulse. The magnitude of this charging voltage may be in the range of about 500 to 1000 volts in these prior art units. After $C_0$ has been charged to the predetermined voltage, a solid state switch is closed allowing the electrical energy stored on $C_0$ to ring very quickly through a series of magnetic compression circuits and a voltage transformer to produce high voltage electrical potential in the range of about 16,000 volts (or greater) across the electrodes which produce the discharges which lasts about 20 to 50 ns.

Major Advances in Lithography Light Sources

Excimer lasers such as described in the '884 patent have during the period 1989 to 2001 become the primary light source for integrated circuit lithography. More than 1000 of these lasers are currently in use in the most modern integrated circuit fabrication plants. Almost all of these lasers have the basic design features described in the '884 patent. This is:

(1) a single, pulse power system for providing electrical pulses across the electrodes at pulse rates of about 100 to 2500 pulses per second;
(2) a single resonant cavity comprised of a partially reflecting mirror-type output coupler and a line narrowing unit consisting of a prism beam expander, a tuning mirror and a grating;
(3) a single discharge chamber containing a laser gas (either KrF or ArF), two elongated electrodes and a tangential fan for circulating the laser gas between the two electrodes fast enough to clear the discharge region between pulses, and
(4) a beam monitor for monitoring pulse energy, wavelength and bandwidth of output pulses with a feedback control system for controlling pulse energy, energy dose and wavelength on a pulse-to-pulse basis.

During the 1989–2001 period, output power of these lasers has increased gradually and beam quality specifications for pulse energy stability, wavelength stability and bandwidth have also become increasingly tighter. Operating parameters for a popular lithography laser model used widely in integrated circuit fabrication include pulse energy at 8 mJ, pulse rate at 2,500 pulses per second (providing an average beam power of up to about 20 watts), bandwidth at about 0.5 pm (FWHM) and pulse energy stability at +/−0.35%.

$F_2$ Lasers $F_2$ lasers are well known. These lasers are similar to the KrF and ArF lasers. The basic differences are the gas mixture which in the $F_2$ laser is a small portion of $F_2$ with helium and/or neon as a buffer gas. The natural output spectrum of the $F_2$ laser is concentrated in two spectral lines of narrow bandwidth, a relatively strong line centered at about 157.63 nm and a relatively weak line centered at about 157.52 nm.

$F_2$ Lasers Bandwidth

A typical KrF laser has a natural bandwidth of about 300 pm measured full width half maximum (FWHM) centered at about 248 nm and for lithography use, it is typically line narrowed to less than 0.6 pm. (In this specification bandwidth values will refer to the FWHM bandwidths unless otherwise indicated.) ArF lasers have a natural bandwidth of about 500 centered at about 193 nm and is typically line narrowed to less than 0.5 pm. These lasers can be relatively easily tuned over a large portion of their natural bandwidth using the grating based line narrowing module referred to above. $F_2$ lasers, as stated above, typically produce laser beams with most of its energy in two narrow spectral features (referred to herein sometimes as "spectral lines") centered at about 157.63 nm and 157.52 nm. Often, the less intense of these two spectral lines (i.e., the 157.52 nm line)

is suppressed and the laser is forced to operate at the 157.63 nm line. The natural bandwidth of the 157.63 nm line is pressure and gas content dependent and varies from about 0.6 to 1.2 pm (FWHM). An $F_2$ laser with a bandwidth in this range can be used with lithography devices with a catadiophic lens design utilizing both refractive and reflective optical elements, but for an all-refractive lens design the laser beam bandwidth may have to be reduced to about 0.1 pm to produce desired results.

Injection Seeding

A well-known technique for reducing the band-width of gas discharge laser systems (including excimer laser systems) involves the injection of a narrow band "seed" beam into a gain medium. In one such system, a laser producing the seed beam called a "master oscillator" is designed to provide a very narrow bandwidth beam in a first gain medium, and that beam is used as a seed beam in a second gain medium. If the second gain medium functions as a power amplifier, the system is referred to as a master oscillator, power amplifier (MOPA) system. If the second gain medium itself has a resonance cavity (in which laser oscillations take place), the system is referred to as an injection seeded oscillator (ISO) system or a master oscillator, power oscillator (MOPO) system in which case the seed laser is called the master oscillator and the downstream system is called the power oscillator. Laser systems comprised of two separate systems tend to be substantially more expensive, larger and more complicated than comparable single chamber laser systems. Therefore, commercial application of these two chamber laser systems has been limited.

What is needed is a better laser design for a pulse gas discharge $F_2$ laser for operation at repetition rates in the range of about 4,000 pulses per second or greater, permitting precise control of all beam quality parameters including wavelength and pulse energy.

SUMMARY OF THE INVENTION

The present invention provides an injection seeded modular gas discharge laser system capable of producing high quality pulsed laser beams at pulse rates of about 4,000 Hz or greater and at pulse energies of about 5 to 10 mJ or greater for integrated outputs of about 20 to 40 Watts or greater. Two separate discharge chambers are provided, one of which is a part of a master oscillator producing a very narrow band seed beam which is amplified in the second discharge chamber. The chambers can be controlled separately permitting optimization of wavelength parameters in the master oscillator and optimization of pulse energy parameters in the amplifying chamber. A preferred embodiment is a $F_2$ laser system configured as a MOPA and specifically designed for use as a light source for integrated circuit lithography. In this preferred embodiment, both of the chambers and the laser optics are mounted on a vertical optical table within a laser enclosure. In the preferred MOPA embodiment, each chamber comprises a single tangential fan providing sufficient gas flow to permit operation at pulse rates of 4000 Hz or greater by clearing debris from the discharge region in less time than the approximately 0.25 milliseconds between pulses. The master oscillator is equipped with a line selection package for selecting the strongest $F_2$ spectral line. This preferred embodiment also includes a pulse multiplying module dividing each pulse from the power amplifier into either two or four pulses in order to reduce substantially the deterioration rates of lithography optics. Preferred embodiments of this invention utilize a "three wavelength platform". This includes an enclosure optics table and general equipment layout that is the same for each of the three types of discharge laser systems expected to be in substantial use for integrated circuit fabrication during the early part of the 21$^{st}$ century, i.e., KrF, ArF, and $F_2$ lasers.

BRIEF DESCRIPTION OF THE DRAWINGS

FIGS. 1C and 1C1 show a second preferred embodiment.
FIGS. 4 and 4A through 4E show features of a preferred pulse power system.
FIGS. 5A, 5B, 5C1, 5C2, 5C3 and 5D show additional pulse power features.
FIGS. 6, 7, 8, 9A, 9B, 10, 10A, 11, 12, 12A, 12B show features of pulse power components.
FIGS. 13A1–13A6 show features of a preferred current return structure.
FIGS. 14A, 14B, 14C and 14D demonstrate a technique for measuring bandwidth.
FIGS. 14E–H show features of etalons used for bandwidth measurement.
FIGS. 16A through 16E show line selection techniques.
FIGS. 19 and 19A through 19D5 show features of a purge system.
FIGS. 20, 20A and 20B show features of a preferred shutter.
FIGS. 21 and 21A show heat exhanger features.
FIGS. 22A through 22D show features of a pulse multiplier unit.

DETAILED DESCRIPTION OF PREFERRED EMBODIMENTS FIRST PREFERRED EMBODIMENT

Three Wavelength Platform

First General Layout

Figure 1:
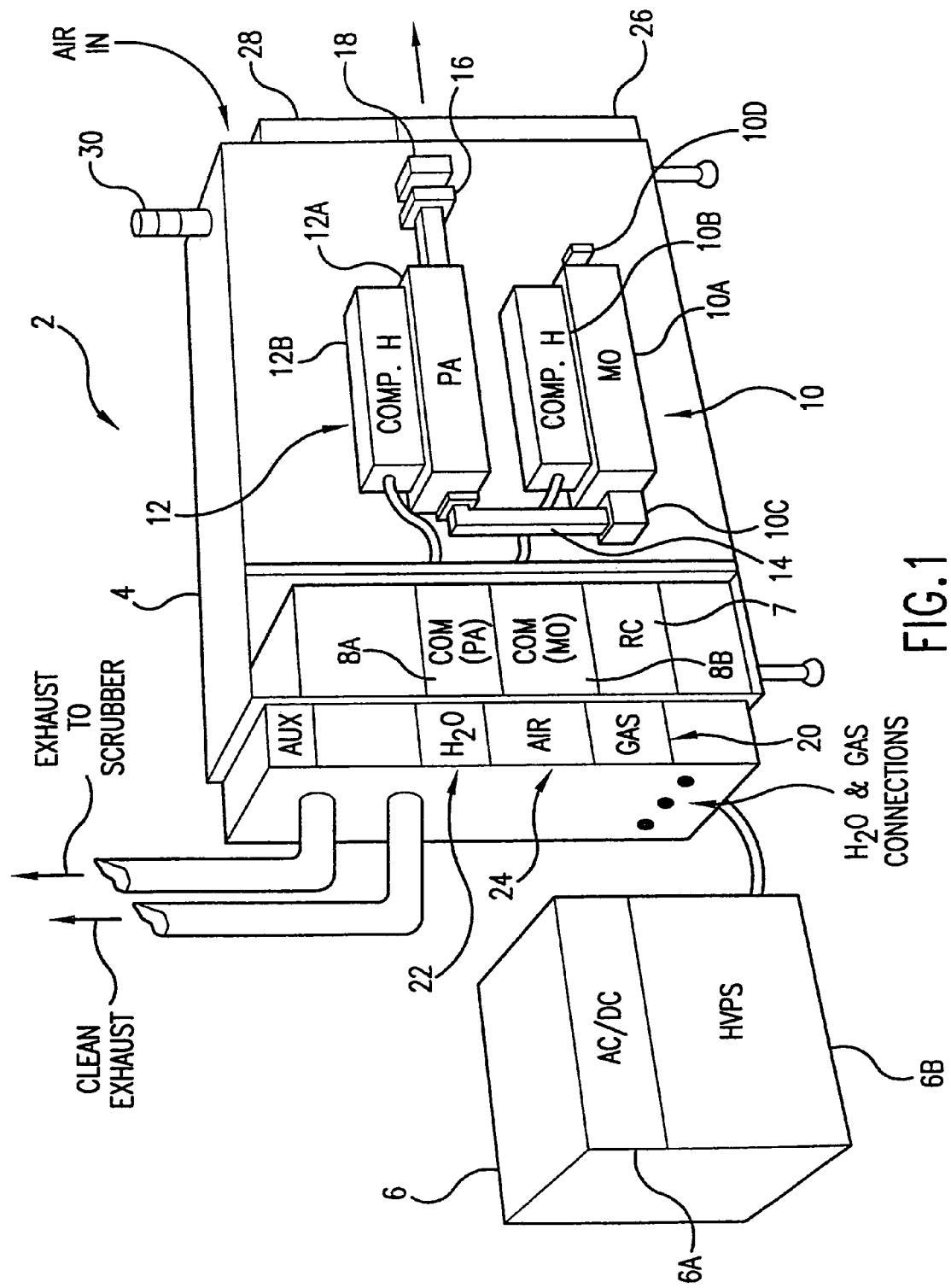
FIG. 1 is a perspective drawing of a preferred embodiment of the present invention.

FIG. 1 is a perspective view of a first preferred embodiment of the present invention. This embodiment is an injection seeded narrow band $F_2$ laser system configured as a MOPA laser system. It is specially designed for use as a light source for integrated circuit lithography. The major improvements in the present invention as exemplified in this embodiment over the prior art lithography lasers is the conversion to the $F_2$ 157.63 nm wavelength light source and the utilization of injection seeding and in particular a master oscillator-power amplifier (MOPA) configuration with two separate discharge chambers.

This first preferred embodiment is an $F_2$ laser system; however, the system utilizes a modular platform configuration which is designed to accommodate either fluorine ($F_2$), krypton-fluoride (KrF), or argon-fluoride (ArF) laser components. This platform design permits use of the same basic cabinet and many of the laser system modules and components for either of these three types of lasers. Applicants refer to this platform as their "three wavelength platform" since the three laser designs produce laser beams with wavelengths of about 248 nm for KrF, about 193 nm for ArF and about 157.63 for $F_2$. This platform is also designed with interface components to make the laser systems at each of the three wavelengths compatible with modern lithography tools of all the major makers of such tools. Preferred $F_2$ product options include:

| Rep Rate | Pulse Energy | Pulse Duration |
|----------|--------------|----------------|
| 4 kHz    | 7 mJ         | 24 ns          |
| 4 kHz    | 7 mJ         | 40 ns          |
| 4 kHz    | 10 mJ        | 24 ns          |
| 4 kHz    | 12 mJ        | 12 ns          |

The major components of this preferred laser system 2 are identified in FIG. 1. These include:
(1) laser system frame 4 which is designed to house all modules of the laser except the AC/DC power supply module,
(2) the AC/DC high voltage power supply module 6,
(3) a resonant charger module 7 for charging two charging capacitor banks to about 1000 volts at rates of 4000 charges per second,
(4) two commutator modules 8A and 8B each comprising one of the charging capacitor banks referred to above and each comprising a commutator circuit for forming very short high voltage electrical pulses, of about 16,000 volts and about 1:s duration from the energy stored on the charging capacitor banks,
(5) two discharge chamber modules mounted in a top bottom configuration in frame 4 consisting of a master oscillator module 10 and a power amplifier module 12. Each module includes a discharge chamber 10A and 12A and a compression head 10B and 12B mounted on top of the chamber. The compression head compresses (time-wise) the electrical pulses from the commutator module from about 1:s to about 50 ns with a corresponding increase in current,
(6) master oscillator optics including rear mirror 100 and line selecting package, LSP, 10C which includes an output coupler and a five-prism line selector,
(7) a wavefront engineering box 14 including optics and instruments for shaping and directing the seed beam into the power amplifier, and monitoring the MO output power,
(8) beam stabilizer module 16 including wavelength, bandwidth and energy monitors,
(9) shutter module 18,
(10) an auxiliary cabinet in which are located a gas control module 20, a cooling water distribution module 22 and an air ventilation module 24,
(11) a customer interface module 26,
(12) a laser control module 28, and
(13) a status lamp 30

For many applications the laser system would preferably include a pulse stretching unit (not shown) to stretch the pulse duration beyond about 12 ns.

U-Shaped Optical Table

Figure 1A:
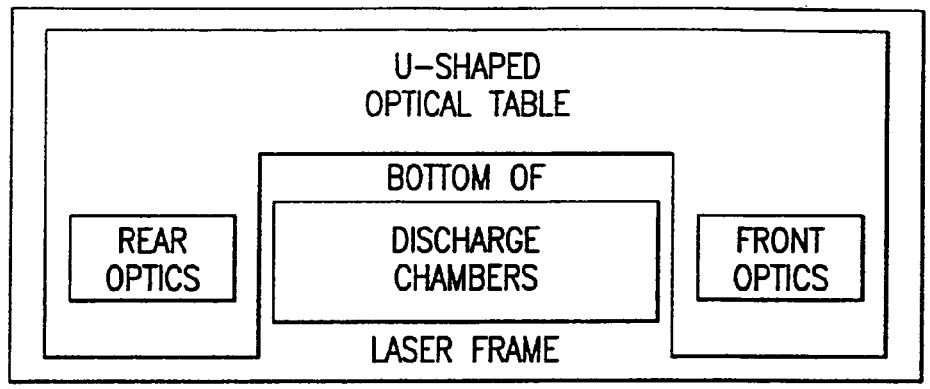
FIGS. 1A and 1B show a U-shaped optical table.
Figure 1B:
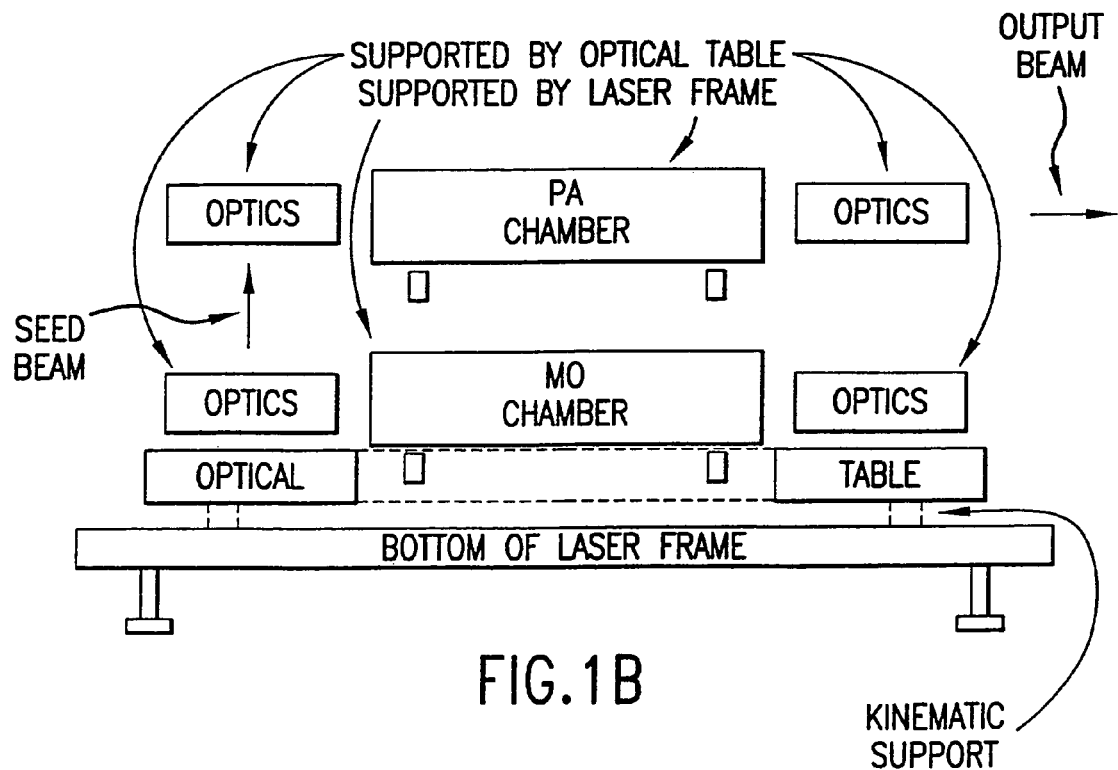

In the FIG. 1 embodiment, the optics of both the MO and the PA are mounted on a U-shaped optical table as shown in FIGS. 1A and 1B. The U-shaped optical table is kinematically mounted to the base of the laser in the manner described in U.S. Pat. No. 5,863,017 incorporated herein by reference. Both chambers of the MO and the PA are not mounted on the table but each is supported by three wheels (two on one side and one on the other) on rails supported from the bottom frame of chamber 2. (The wheel and rails are preferably arranged as described in U.S. Pat. No. 6,109,574 incorporated herein by reference.) This arrangement provides isolation of the optics from chamber caused vibrations.

Second General Layout

A second general layout shown in FIG. 1C is similar to the first general layout described above but including the following features:
(1) the two chambers and the laser optics are mounted on a vertical optical table 11 which is kinematically mounted (as described in a following section) within the laser cabinet 4. The chambers are supported on stiff cantilever arms bolted to the optical table. In this design the master oscillator 10 is mounted above the power amplifier 12.
(2) The high voltage power supply 6B is contained within laser cabinet 4. This two chamber $F_2$ 4000 Hz needs two 1200 volt power supply. The laser cabinet, however, is provided with space for an additional high voltage power supplies which will be needed for a 6000 Hz, $F_2$ laser system.
(3) Each of the two laser chambers and the pulse power supplies for the chambers are very similar to the chamber and pulse power supply utilized in a 4000 Hz single chamber ArF laser system described U.S. patent application Ser. No. 09/854,097 which has been incorporated herein by reference.
(4) A pulse multiplier module 13 located behind the optical table 11 is included in this embodiment to stretch the duration of the pulse exiting the power amplifier.
(5) The master oscillator beam output optics in line selection package 10C directs the output beam from the MO to the power amplifier input optics 14C and for one pass through the power amplifier 12. The short pulse (about 12 ns) output from power amplifier 12 is stretched in pulse stretching unit 13 located behind optical table 11. The entire beam path through the laser system including the pulse stretcher is enclosed in vacuum compatible enclosures (not shown) and the enclosures are purged with nitrogen or helium.

Third General Layout

Figure 1D:
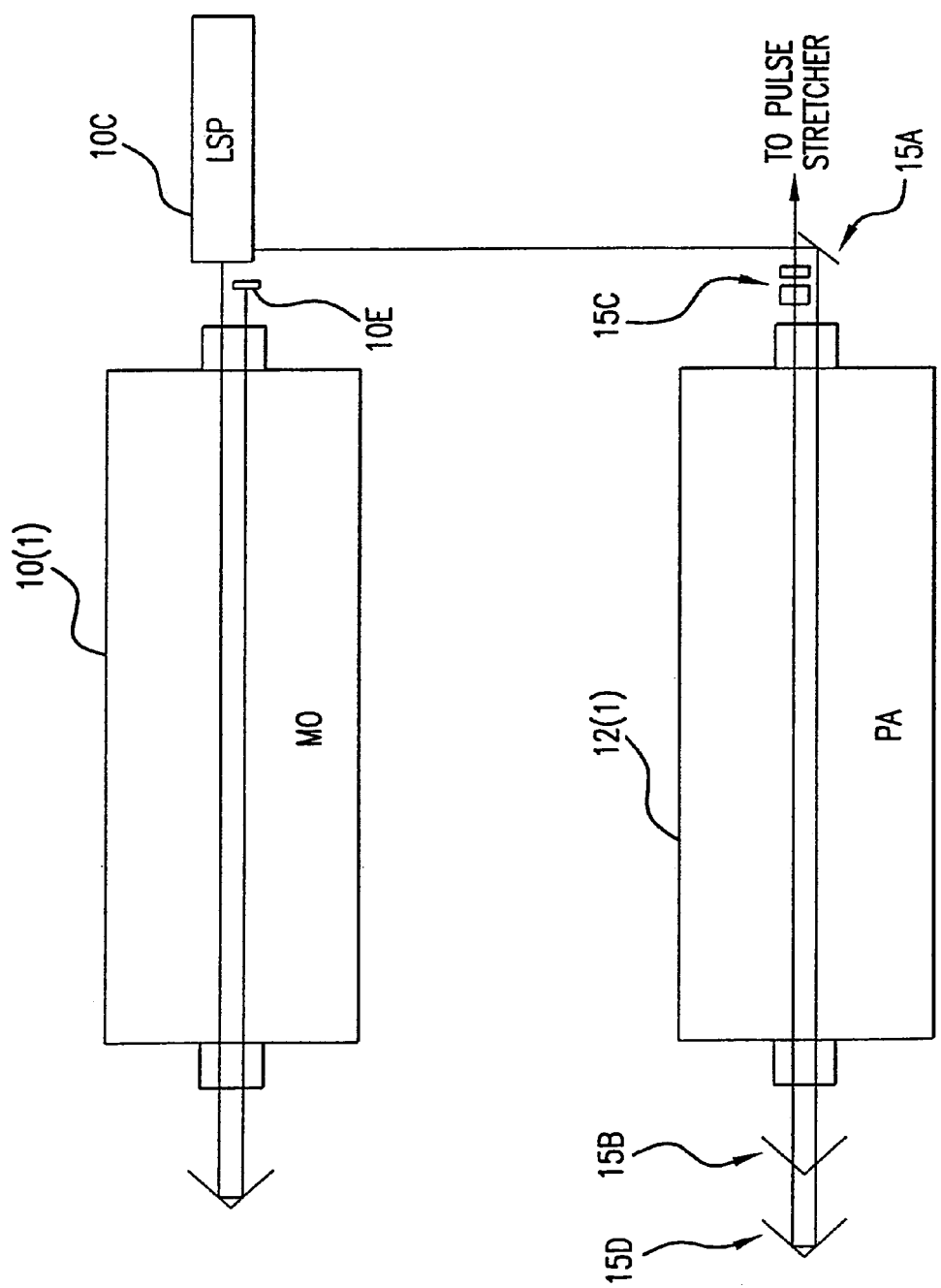
FIG. 1D show a third preferred embodiment.

Portions of a third general layout is shown in FIG. 1D. This layout accommodates an embodiment of the present invention which utilizes laser chambers in which the length of the discharge region is about one-half the length of the discharge region in the first two embodiments. That is, the discharge region length is about 26.5 cm as compared to typical length of about 53 cm. In this case, the resonant cavity of the master oscillator 10(1) is defined by two passes through the discharge region between maximum reflection mirror 10E and an output coupler which is located along with a five prism line selector in LSP 10C. In this layout, the beam makes four passes through the power amplifier 12(1). The first pass after reflection from mirror 15A through the bottom half of the discharge region at an angle with the alignment of the electrodes angling from (for example in the bottom half left to right at an angle of about 10 milliradians). The second pass after reflection from mirrors 15B is through the top half at an angle right to left at an angle of about 4 degrees. The third pass after reflection from two mirrors 15C is aligned with the electrodes through the top half of the discharge region and the last pass after reflection from mirrors 15D is aligned with the electrodes through the bottom half of the discharge region. This last pass establishes the power amplifier output beam. It bypasses mirrors 15C and is directed by mirrors (not shown) to the pulse multiplier unit (also not shown).

In each of the above three layouts provisions are preferably made to permit the output beam to exit at the left of the laser enclosure or the right of the enclosure in order to accommodate customer preference without major design changes.

In each of the above layouts some improvement in performance could be achieved by combining the commutator and the compression head into a single module. Applicants have resisted this combination in the past because any component failure requires replacement of the entire module. However, Applicants experience is that these units are extremely reliable so that the combined module is now feasible. In fact, one of the few causes of failure in the pulse power units has been failure of the electrical cable connecting the two modules. This cable would not be needed in the combined module.

The design and operation of the preferred laser systems and the modules referred to above are described in more detail below.

The Master Oscillator

Figure 2:
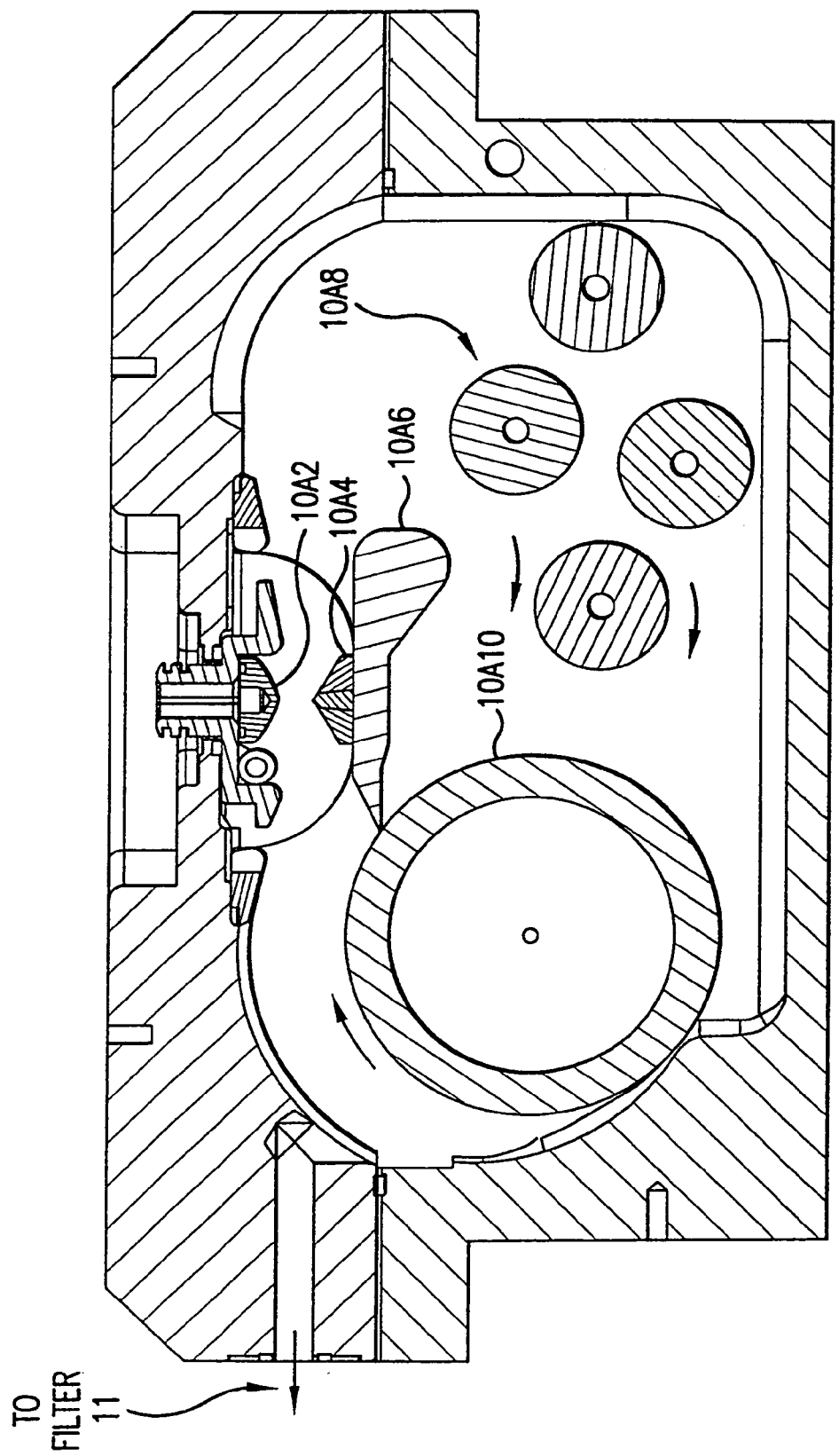
FIGS. 2 and 3 show chamber features.
Figure 3:
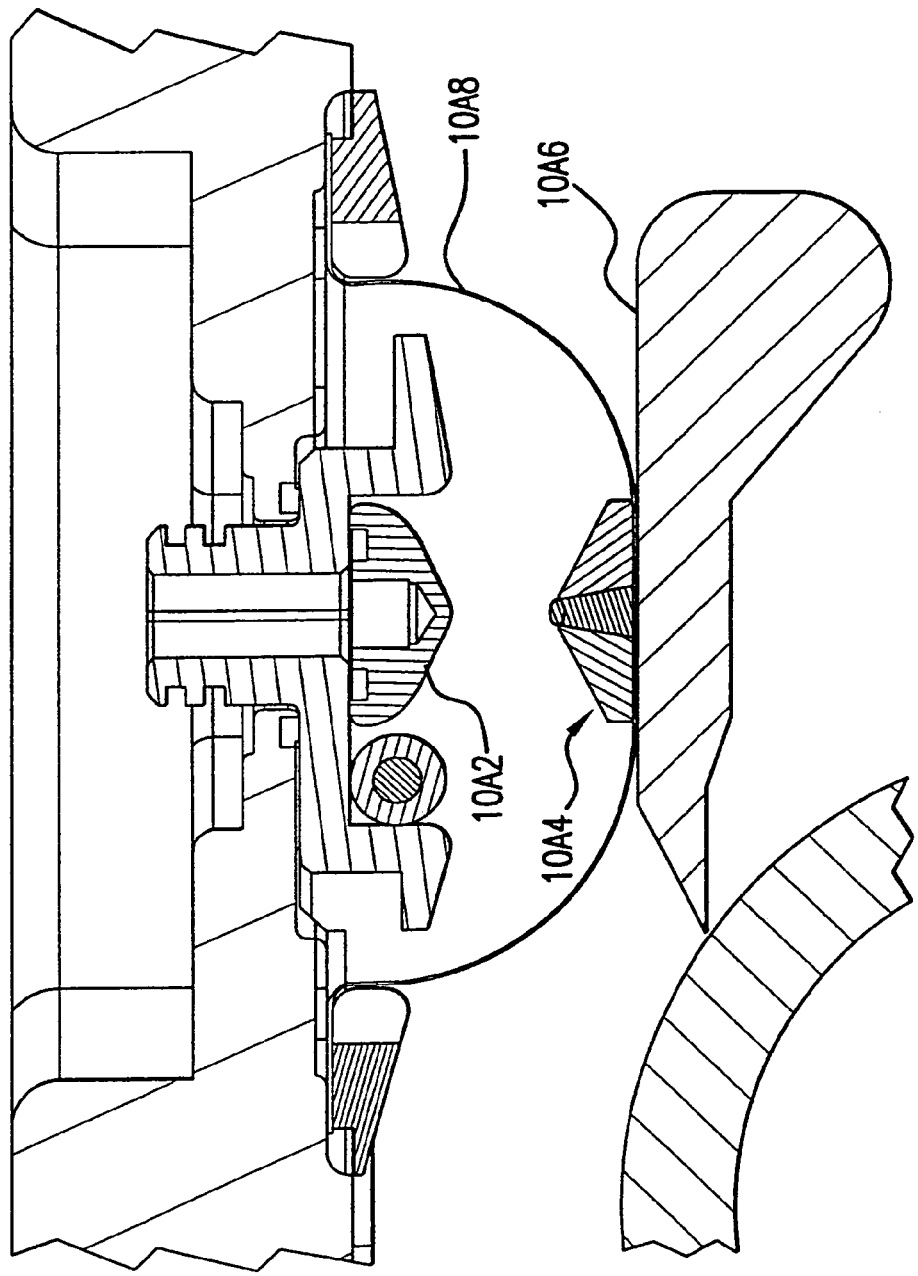

The master oscillator 10 shown in FIGS. 1 and 1C is in many ways similar to prior art ArF lasers such as described in the '884 patent and in U.S. Pat. No. 6,128,323 and the ArF laser described in U.S. patent application Ser. No. 09/854,097 except the chamber and resonant cavity optics are configured for F2 laser operation at the 157.63 nm spectral range. Also, the output pulse energy is about 0.1 mJ to 1.0 mJ instead of about 5 mJ. However, major improvements over the '323 laser are provided to permit operation at 4000 Hz and greater. The master oscillator may be optimized for spectral performance including line width control. The master oscillator comprises discharge chamber 10A as shown in FIG. 1, FIG. 2 and FIG. 3 in which are located a pair of elongated electrodes 10A2 and 10A3, each about 50 cm long and spaced apart by about 12 mm. Anode 10A4 is mounted on flow shaping anode support bar 10A6. Four separate finned water cooled heat exchanger units 10A–8 are provided. A tangential fan 10A10 is driven by two motors (not shown) for providing a laser gas flow at a velocity of about 80 m/s between the electrodes. The chamber includes window units (not shown) with $CaF_2$ windows positioned at about 47° with the laser beam. An electrostatic filter unit having an intake at the center of the chamber, filters a small portion of the gas flow as indicated at 11 in FIG. 2 and the cleaned gas is directed into window units in the manner described in U.S. Pat. No. 5,359,620 (incorporated herein by reference) to keep discharge debris away from the windows. The gain region of the master oscillator is created by discharges between the electrodes through the laser gas which in this embodiment is comprised of about 0.5% $F_2$ and the rest neon, helium or a combination of helium and neon. The gas flow clears the debris of each discharge from the discharge region prior to the next pulse. The resonant cavity is created at the output side by an output coupler located in LSP 10C. The output coupler is comprised of an uncoated $CaF_2$ reflecting optic mounted perpendicular to the beam direction so as to reflect about 5% of the laser light at about 157 nm and to pass about 95% of the 157 nm light. The opposite boundary of the resonant cavity is a maximum reflection mirror 100 as shown in FIG. 1. The line selection package 10C is described in more detail below with reference to FIG. 16.

In preferred embodiments the main charging capacitor banks for both the master oscillator and the power amplifier are charged in parallel so as to reduce jitter problems. This is desirable because the time for pulse compression in the pulse compression circuits of the two pulse power systems is dependent on the level of the charge of the charging capacitors. Preferably pulse energy output from the power amplifier is controlled on a pulse-to-pulse basis by adjustment of the charging voltage. This limits somewhat the use of voltage to control beam parameters of the master oscillator. However, laser gas pressure and $F_2$ concentration can be easily controlled to achieve desirable beam parameters over a wide range pulse energy. Bandwidth decreases with decreasing $F_2$ concentration and laser gas pressure. For the master oscillator the time between discharge and light-out is a function of $F_2$ concentration (1 ns/kPa), so $F_2$ concentration may also be changed to vary the timing but this may not be desirable since it could complicate other aspects of laser beam control.

Power Amplifier

The power amplifier in each of the three embodiments is comprised of a laser chamber which is very similar to the corresponding master oscillator discharge chamber. Having the two separate chambers allows the pulse energy and integrated energy in a series of pulses (called dose) to be controlled, to a large extent, separately from wavelength and bandwidth. This permits better dose stability. All of the components of the chamber are the same and are interchangeable during the manufacturing process. However, in operation, the gas pressure is preferably substantially lower in the MO as compared to the PA. The compression head 12B of the power amplifier as shown in FIG. 1 is also substantially identical in this embodiment to the 10B compression head and the components of the compression head are also interchangeable during manufacture. One difference is that the capacitors of the compression head capacitor bank are more widely positioned for the MO to produce a substantially higher inductance as compared to the PA. Also, the electrode spacing in the PA is preferably about 8 mm (as compared to about 12 mm for the MO). This close identity of the chambers and the electrical components of the pulse power systems helps assure that the timing characteristics of the pulse forming circuits are the same or substantially the same so that jitter problems are minimized.

The power amplifier is configured for a single pass through the discharge region of the power amplifier discharge chamber in the FIG. 1 and FIG. 1C embodiments and for four passages in its FIG. 1D embodiment as described above. In the FIG. 1 embodiment, line selection takes place in LSP 10C using the five-prism line selector shown in FIG. 16. Line selection is preferably downstream of the gain medium of the MO since in these $F_2$ lasers the gain is very high compared to KrF and ArF lasers. The line selected seed beam is reflected upward by mirror 14A and reflected horizontally for one pass through the power amplifier as discussed above. The charging voltages preferably are selected on a pulse-to-pulse basis to maintain desired pulse and dose energies. $F_2$ concentration and laser gas pressure can be adjusted in the power amplifier to provide a desired operating range of charging voltage. This desired range can be selected to produce a desired value of dE/dV since the change in energy with voltage is a function of $F_2$ concentration and laser gas pressure. The timing of injections is preferable based on charging voltage. The frequency of injections is preferably high to keep laser chamber conditions relatively constant and can be continuous or nearly continuous. Some users of these embodiments may prefer larger durations (such as 2 hours) between $F_2$ injections.

Pulse Power Circuit

Figure 5A:
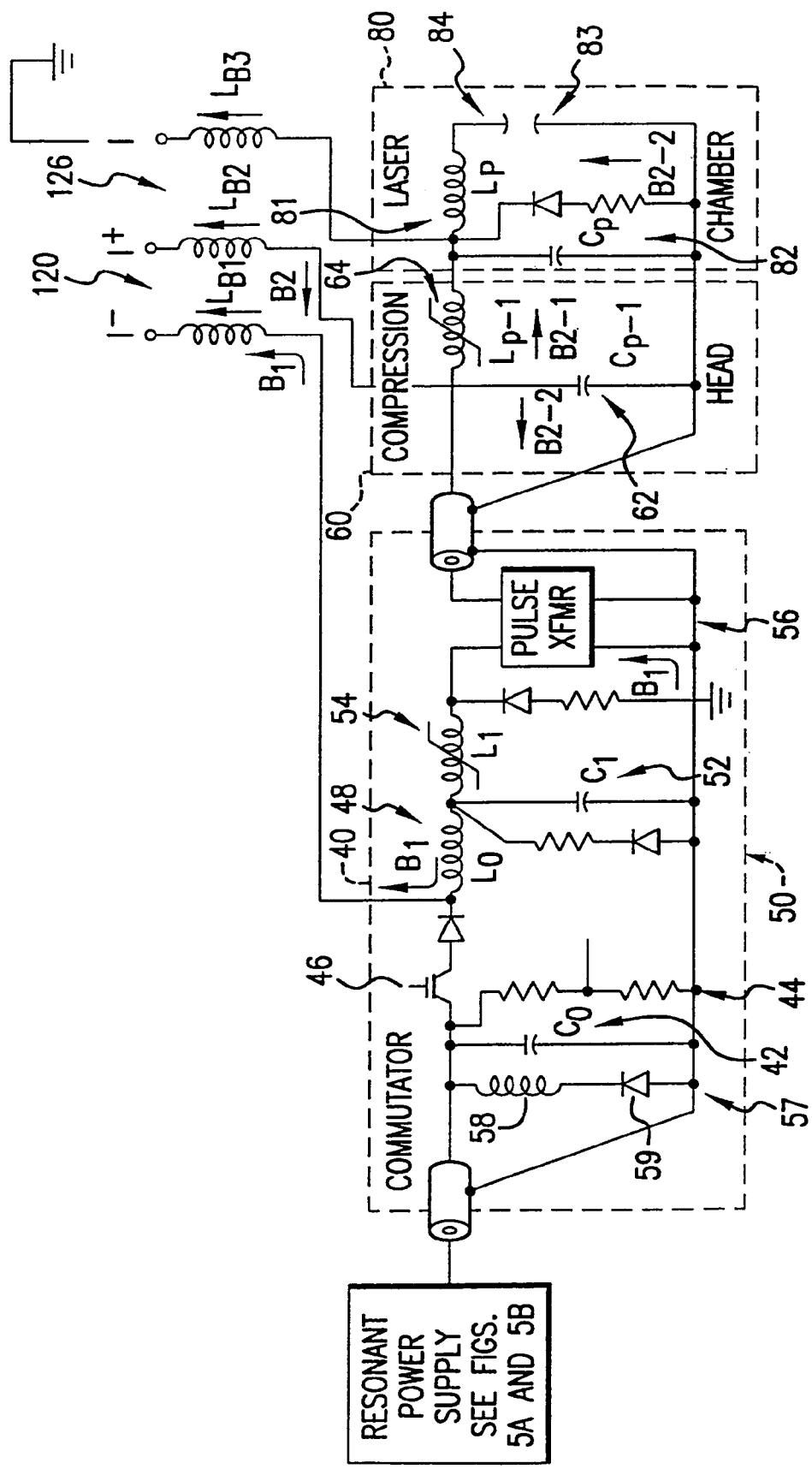
Figure 5B:
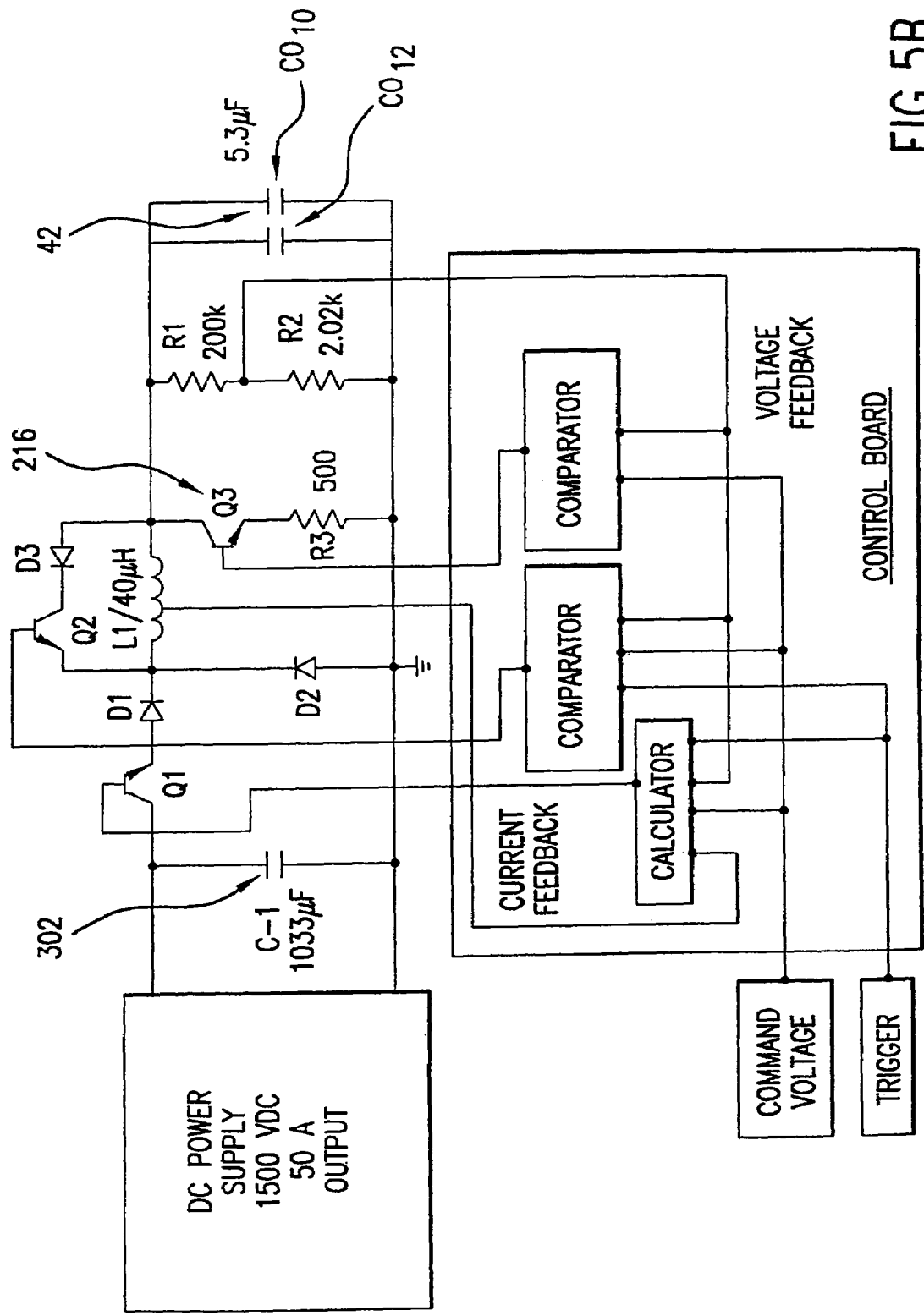

In the preferred embodiment shown in FIGS. 1, 1C and 1D, the basic pulse power circuits are similar to pulse power circuits of prior art excimer laser light sources for lithography. However, separate pulse power circuits downstream of the charging capacitors are provided for each discharge chamber. Preferably a single resonant charger charges two charging capacitor banks connected in parallel to assure that both charging capacitor banks are charged to precisely the same voltage. Important improvements are also provided to regulate the temperature of components of the pulse power circuits. In preferred embodiments the temperatures of the magnetic cores of saturable inductors are monitored and the temperature signals are utilized in a feedback circuit to adjust the relative timing of the discharge in the two chambers. FIGS. 5A and 5B show important elements of a preferred basic pulse power circuit which is used for the MO. The same basic circuit is also used for the PA.

Resonant Charger

A preferred resonant charger system is shown in FIG. 5B. The principal circuit elements are:
I1—A three-phase power supply 300 with a constant DC current output.
C-1—A source capacitor 302 that is an order of magnitude or more larger than the existing $C_0$ capacitor 42.
Q1, Q2, and Q3—Switches to control current flow for charging and maintaining a regulated voltage on $C_0$.
D1, D2, and D3—Provides current single direction flow.
R1, and R2—Provides voltage feedback to the control circuitry.
R3—Allows for rapid discharge of the voltage on $C_0$ in the event of a small over charge.
L1—Resonant inductor between C-1 capacitor 302 and $C_0$ capacitor banks 42 to limit current flow and setup charge transfer timing.
Control Board 304—Commands Q1, Q2, and Q3 open and closed based upon circuit feedback parameters.

This circuit includes switch Q2 and diode D3, together known as a De-Qing switch. This switch improves the regulation of the circuit by allowing the control unit to short out the inductor during the resonant charging process. This "de-qing" prevents additional energy stored in the current of the charging inductor, L1, from being transferred to capacitor $C_0$.

Prior to the need for a laser pulse the voltage on C-1 is charged to 600–800 volts and switches Q1–Q3 are open. Upon command from the laser, Q1 would close. At this time current would flow from C-1 to $C_0$ through the charge inductor L1. As described in the previous section, a calculator on the control board would evaluate the voltage on $C_0$ and the current flowing in L1 relative to a command voltage set point from the laser. Q1 will open when the voltage on the CO capacitor banks plus the equivalent energy stored in inductor L1 equals the desired command voltage. The calculation is:

$$V_f = [V_{C0s}^2 + ((L_1 * I_{L1s}^2)/C_0)]^{0.5}$$

Where:
$V_f$=The voltage on $C_0$ after Q1 opens and the current in L1 goes to zero.
$V_{C0s}$=The voltage on $C_0$ when Q1 opens.
$I_{L1s}$=The current flowing through $L_1$ when Q1 opens.

After Q1 opens the energy stored in L1 starts transferring to the CO capacitor banks through D2 until the voltage on the CO capacitor banks approximately equals the command voltage. At this time Q2 closes and current stops flowing to CO and is directed through D3. In addition to the "de-qing" circuit, Q3 and R3 from a bleed-down circuit allow additional fine regulation of the voltage on CO.

Switch Q3 of bleed down circuit 216 will be commanded closed by the control board when current flowing through inductor L1 stops and the voltage on $C_0$ will be bled down to the desired control voltage; then switch Q3 is opened. The time constant of capacitor $C_0$ and resistor R3 should be sufficiently fast to bleed down capacitor $C_0$ to the command voltage without being an appreciable amount of the total charge cycle.

As a result, the resonant charger can be configured with three levels of regulation control. Somewhat crude regulation is provided by the energy calculator and the opening of switch Q1 during the charging cycle. As the voltage on the CO capacitor banks nears the target value, the de-qing switch is closed, stopping the resonant charging when the voltage on $C_0$ is at or slightly above the target value. In a preferred embodiment, the switch Q1 and the de-qing switch is used to provide regulation with accuracy better than +/−0.1%. If additional regulation is required, the third control over the voltage regulation could be utilized. This is the bleed-down circuit of switch Q3 and R3 (shown at 216 in FIG. 5B) to discharge the CO's down to the precise target value.

Improvements Downstream of the CO's

As indicated above, the pulse power system of the MO and the PA of the present invention each utilizes the same basic design (FIG. 5A) as was used in the prior art systems. However, some significant improvements in that basic design were required for the approximate factor of 3 increase in heat load resulting from the greatly increased repetition rate. These improvements are discussed below.

Detailed Commutator and Compression Head Description

In this section, we describe details of fabrication of the commutator and the compression head.

Solid State Switch

Solid state switch 46 is an P/N CM 800 HA-34H IGBT switch provided by Powerex, Inc. with offices in Youngwood, Pa. In a preferred embodiment, two such switches are used in parallel.

Inductors

Inductors 48, 54 and 64 are saturable inductors similiar to those used in prior systems as described in U.S. Pat. Nos. 5,448,580 and 5,315,611. FIG. 6 shows a preferred design of the $L_0$ inductor 48. In this inductor four conductors from the two IGBT switches 46B pass through sixteen ferrite toroids 49 to form part 48A an 8 inch long hollow cylinder of very high permability material with an ID of about 1 inch and an Od of about 1.5 inch. Each of the four conductors are then wrapped twice around an insulating doughnut shaped core to form part 48B. The four conductors then connect to a plate which is in turn connected to the high voltage side of the $C_1$ capacitor bank 52.

Figure 8:
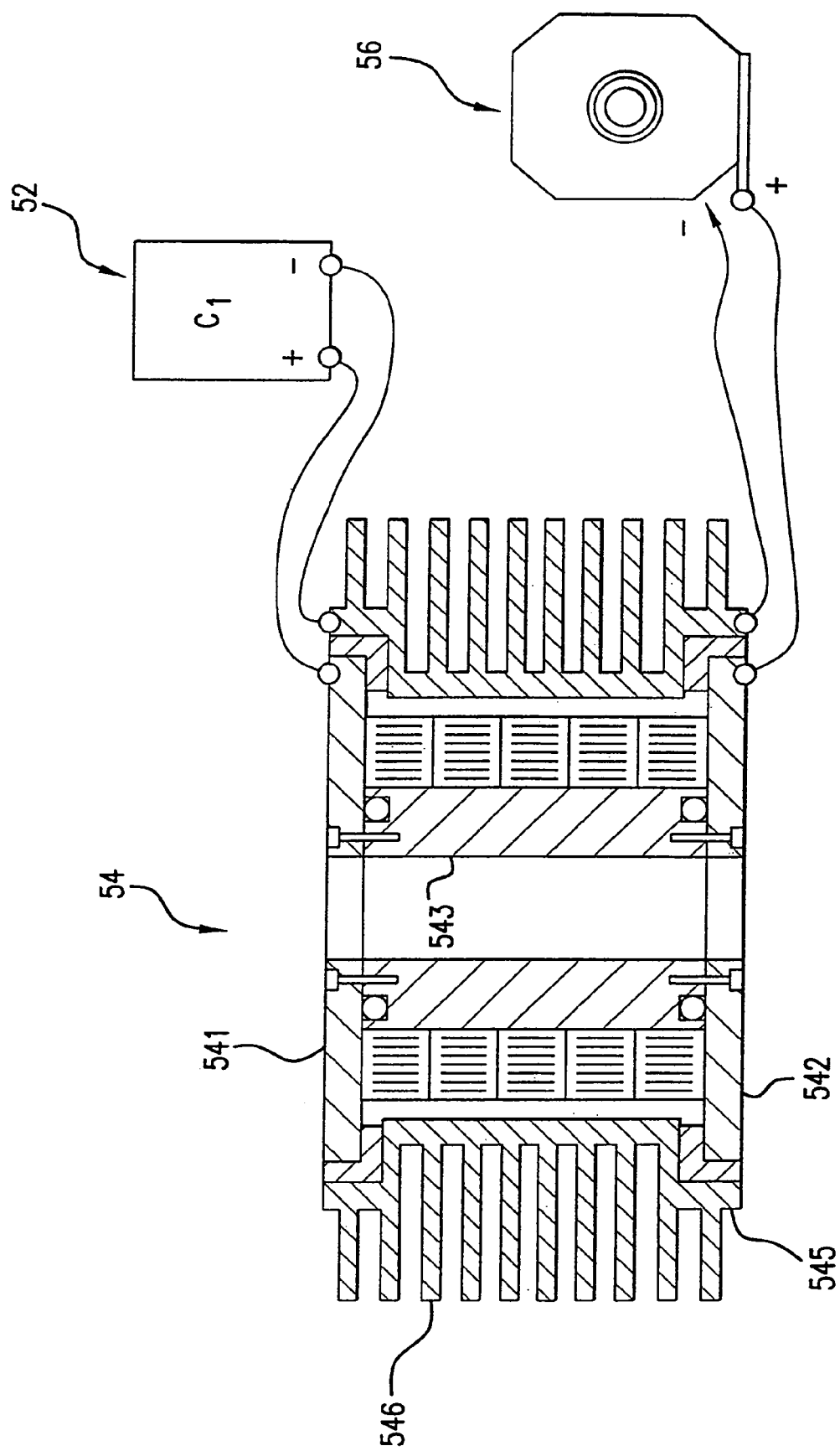

A preferred sketch of saturable inductor 54 is shown in FIG. 8. In this case, the inductor is a single turn geometry where the assembly top and bottom lids 541 and 542 and center mandrel 543, all at high voltage, form the single turn through the inductor magnetic cores. The outer housing 545 is at ground potential. The magnetic cores are 0.0005" thick tape wound 50—50% Ni—Fe alloy provided by Magnetics of Butler, Pa. or National Arnold of Adelanto, Calif. Fins 546 on the inductor housing facilitate transfer of internally dissipated heat to forced air cooling. In addition, a ceramic disk (not shown) is mounted underneath the reactor bottom lid to help transfer heat from the center section of the assembly to the module chassis base plate. FIG. 8 also shows the high voltage connections to one of the capacitors of the $C_1$ capacitor bank 52 and to a high voltage lead on one of the induction units of the 1:25 step up pulse transformer 56. The housing 545 is connected to the ground lead of unit 56.

Figure 9A:
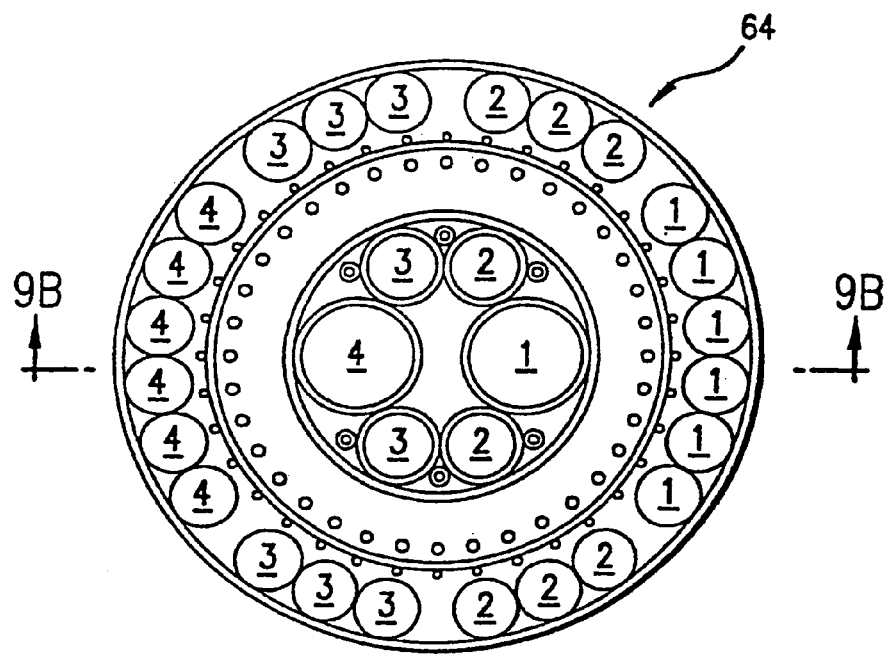
Figure 9B:
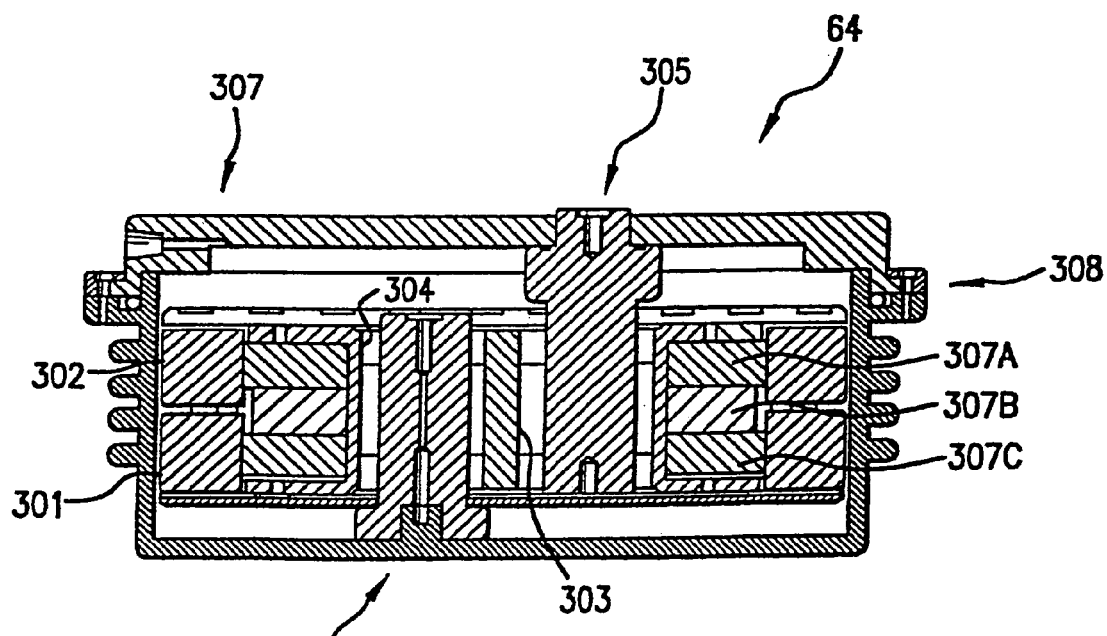

A top and section view of the saturable inductor 64 is shown respectively in FIGS. 9A and 9B. In the inductors of this embodiment, flux excluding metal pieces 301, 302, 303 and 304 are added as shown in FIG. 9B in order to reduce the leakage flux in the inductors. These flux excluding pieces substantially reduce the area which the magnetic flux can penetrate and therefore help to minimize the saturated inductance of the inductor. The current makes five loops through vertical conductor rods in the inductor assembly around magnetic core 307. The current enters at 305 travels down a large diameter conductor in the center labeled "1" and up six smaller conductors on the circumference also labeled "1" as shown in FIG. 9A. The current then flows down two conductors labeled 2 on the inside, then up the six conductors labeled 2 on the outside then down flux exclusion metal on the inside then up the six conductors labeled 3 on the outside, then down the two conductors labeled 3 on the inside, then up the six conductors labeled 4 on the outside, then down the conductor labeled 4 on the inside. The flux exclusion metal components are held at half the full pulsed voltage across the conductor allowing a reduction in the safe hold-off spacing between the flux exclusion metal parts and the metal rods of the other turns. The magnetic core 307 is made up of three coils 307A, B and C formed by windings of 0.0005" thick tape 80-20% Ni—Fe alloy provided by Magnetics, Inc. of Butler, Pa. or National Arnold of Adelanto, Calif. The reader should note that nano-crystoline materials such as VITROPERMθ available from VACUUM SCHITELZE GmbH, Germany and FINEMETθ from Hitachi Metals, Japan could be used for inductors 54 and 64. In prior art pulse power systems, oil leakage from electrical components has been a potential problem. In this preferred embodiment, oil insulated components are limited to the saturable inductors. Furthermore, the saturable inductor 64 as shown in FIG. 9B is housed in a pot type oil containing housing in which all seal connections are located above the oil level to substantially eliminate the possibility of oil leakage. For example, the lowest seal in inductor 64 is shown at 308 in FIG. 8B. Since the normal oil level is below the top lip of the housing 306, it is almost impossible for oil to leak outside the assembly as long as the housing is maintained in an upright condition.

Capacitors

Figure 5D:
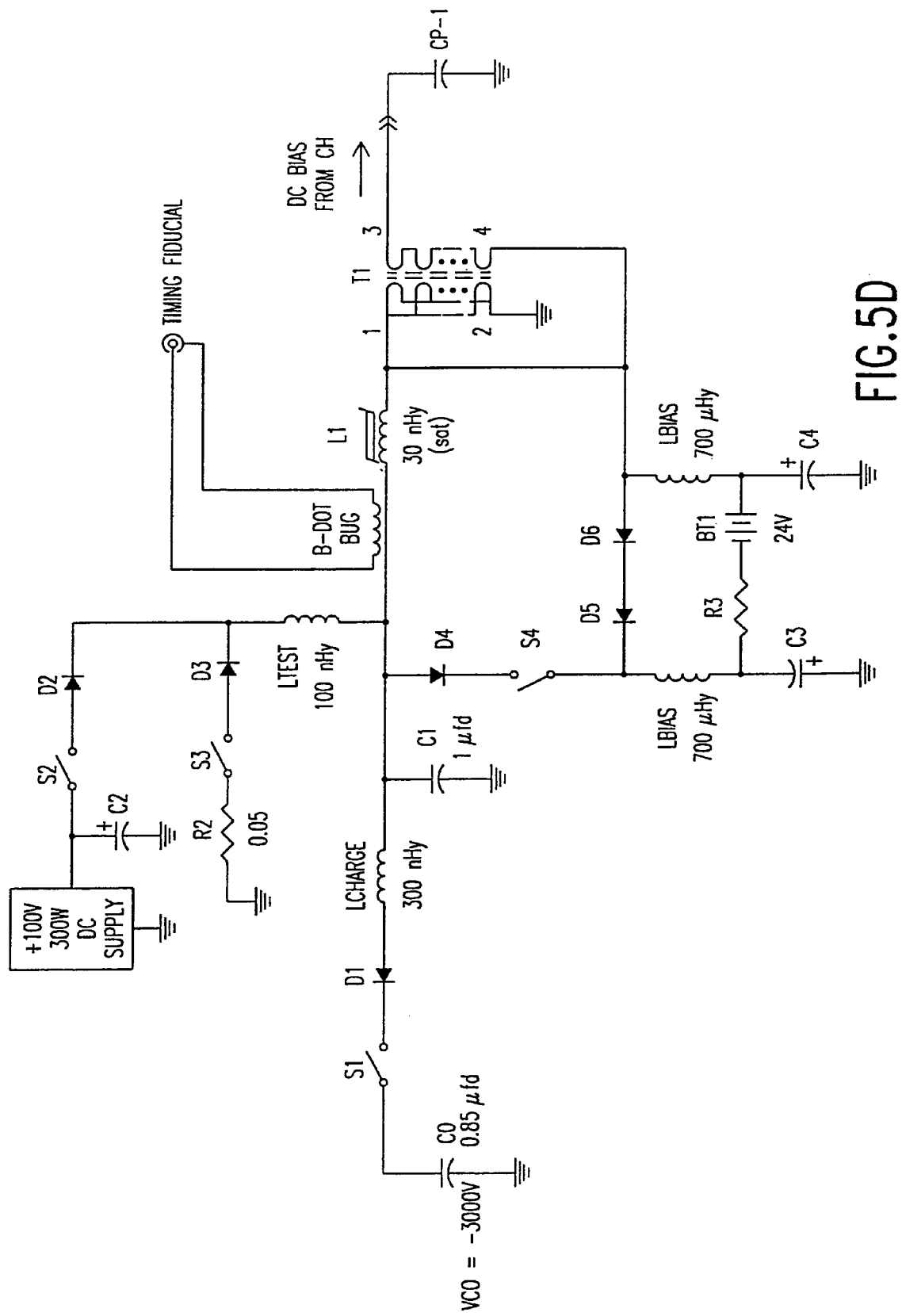

Capacitor banks 42, 52, 62 and 82 (i.e., $C_0$, $C_1$, $C_{p-1}$ and $C_p$) as shown in FIG. 5 are all comprised of banks of off-the-shelf capacitors connected in parallel. Capacitors 42 and 52 are film type capacitors available from suppliers such as Vishay Roederstein with offices in Statesville, N.C. or Wima of Germany.

Applicants preferred method of connecting the capacitors and inductors is to solder them to positive and negative terminals on special printed circuit board having heavy nickel coated copper leads in a manner similar to that described in U.S. Pat. No. 5,448,580. Capacitor bank 62 and 64 is typically composed of a parallel array of high voltage ceramic capacitors from vendors such as Murata or TDK, both of Japan. In a preferred embodiment for use on this ArF laser, capacitor bank 82 (i.e., $C_p$) comprised of a bank of thirty three 0.3 nF capacitors for a capacitance of 9.9 nF; $C_{p-1}$ is comprised of a bank of twenty four 0.40 nF capacitors for a total capacitance of 9.6 nF; $C_1$ is a 5.7:F capacitor bank and $C_0$ is a 5.3:F capacitor bank.

Pulse Transformer

Pulse transformer 56 is also similar to the pulse transformer described in U.S. Pat. Nos. 5,448,580 and 5,313,481; however, the pulse transformers of the present embodiment has only a single turn in the secondary winding and 24 induction units equivalent to 1/24 of a single primary turn for an equivalent step-up ratio of 1:24. A drawing of pulse transformer 56 is shown in FIG. 10. Each of the 24 induction units comprise an aluminum spool 56A having two flanges (each with a flat edge with threaded bolt holes) which are bolted to positive and negative terminals on printed circuit board 56B as shown along the bottom edge of FIG. 10. (The negative terminals are the high voltage terminals of the twenty four primary windings.) Insulators 56C separates the positive terminal of each spool from the negative terminal of the adjacent spool. Between the flanges of the spool is a hollow cylinder 1¹⁄₁₆ inches long with a 0.875 OD with a wall thickness of about ¹⁄₃₂ inch. The spool is wrapped with one inch wide, 0.7 mil thick Metglas™ 2605 S3A and a 0.1 mil thick mylar film until the OD of the insulated Metglas™ wrapping is 2.24 inches. A prospective view of a single wrapped spool forming one primary winding is shown in FIG. 10A.

The secondary of the transformer is a single OD stainless steel rod mounted within a tight fitting insulating tube of PTFE (Teflon7). The winding is in four sections as shown in FIG. 10. The low voltage end of stainless steel secondary shown as 56D in FIG. 10 is tied to the primary HV lead on printed circuit board 56B at 56E, the high voltage terminal is shown at 56F. As a result, the transformer assumes an auto-transformer configuration and the step-up ratio becomes 1:25 instead of 1:24. Thus, an approximately −1400 volt pulse between the + and − terminals of the induction units will produce an approximately −35,000 volt pulse at terminal 56F on the secondary side. This single turn secondary winding design provides very low leakage inductance permitting extremely fast output rise time.

Details of Laser Chamber Electrical Components

The Cp capacitor 82 is comprised of a bank of thirty-three 0.3 nf capacitors mounted on top of the chamber pressure vessel. (Typically an ArF laser is operated with a lasing gas made up of 3.5% argon, 0.1% fluorine, and the remainder neon.) The electrodes are about 28 inches long which are separated by about 0.5 to 1.0 inch preferably about ⅝ inch. Preferred electrodes are described below. In this embodiment, the top electrode is referred to as the cathode and the bottom electrode is connected to ground as indicated in FIG. 5 and is referred to as the anode.

Discharge Timing

In ArF, KrF and $F_2$ electric discharge lasers, the electric discharge lasts only about 50 ns (i.e., 50 billionths of a second). This discharge creates a population inversion necessary for lasing action but the inversion only exists during the time of the discharge. Therefore, an important requirement for an injection seeded ArF, KrF or $F_2$ laser is to assure that the seed beam from the master oscillator passes through discharge region of the power amplifier during the approximately 50 billionth of a second when the population is inverted in the laser gas so that amplification of the seed beam can occur. An important obstacle to precise timing of the discharge is the fact that there is a delay of about 5 microseconds between the time switch 42 (as shown in FIG. 5) is triggered to close and the beginning of the discharge which lasts only about 40–50 ns. It takes this approximately 5 microseconds time interval for the pulse to ring through the circuit between the $C_o$'s and the electrodes. This time interval varies substantially with the magnitude of the charging voltage and with the temperature of the inductors in the circuit.

Nevertheless in the preferred embodiment of the present invention described herein, Applicants have developed electrical pulse power circuits that provide timing control of the discharges of the two discharge chambers within a relative accuracy of less than about 2 ns (i.e., 2 billionths of a second). A block diagram of the two circuits are shown in FIG. 4.

Applicants have conducted tests which show that timing varies with charging voltage by approximately 5–10 ns/volt. This places a stringent requirement on the accuracy and repeatability of the high voltage power supply charging the charging capacitors. For example, if timing control of 5 ns is desired, with a shift sensitivity of 10 ns per volt, then the resolution accuracy would be 0.5 Volts. For a nominal charging voltage of 1000 V, this would require a charging accuracy of 0.05% which is very difficult to achieve especially when the capacitors must be charged to those specific values 4000 times per second.

Figure 4:
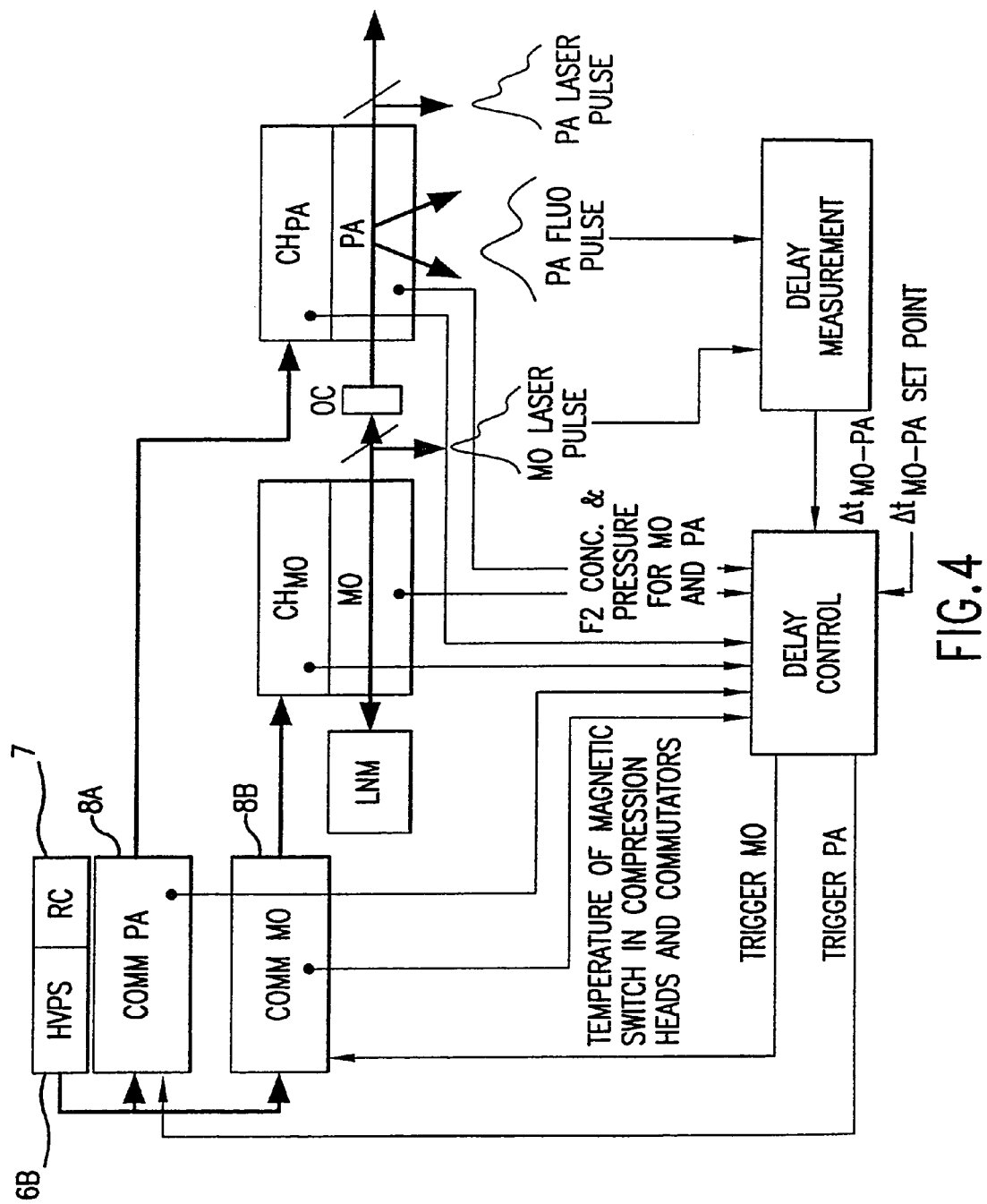
Figure 4B:
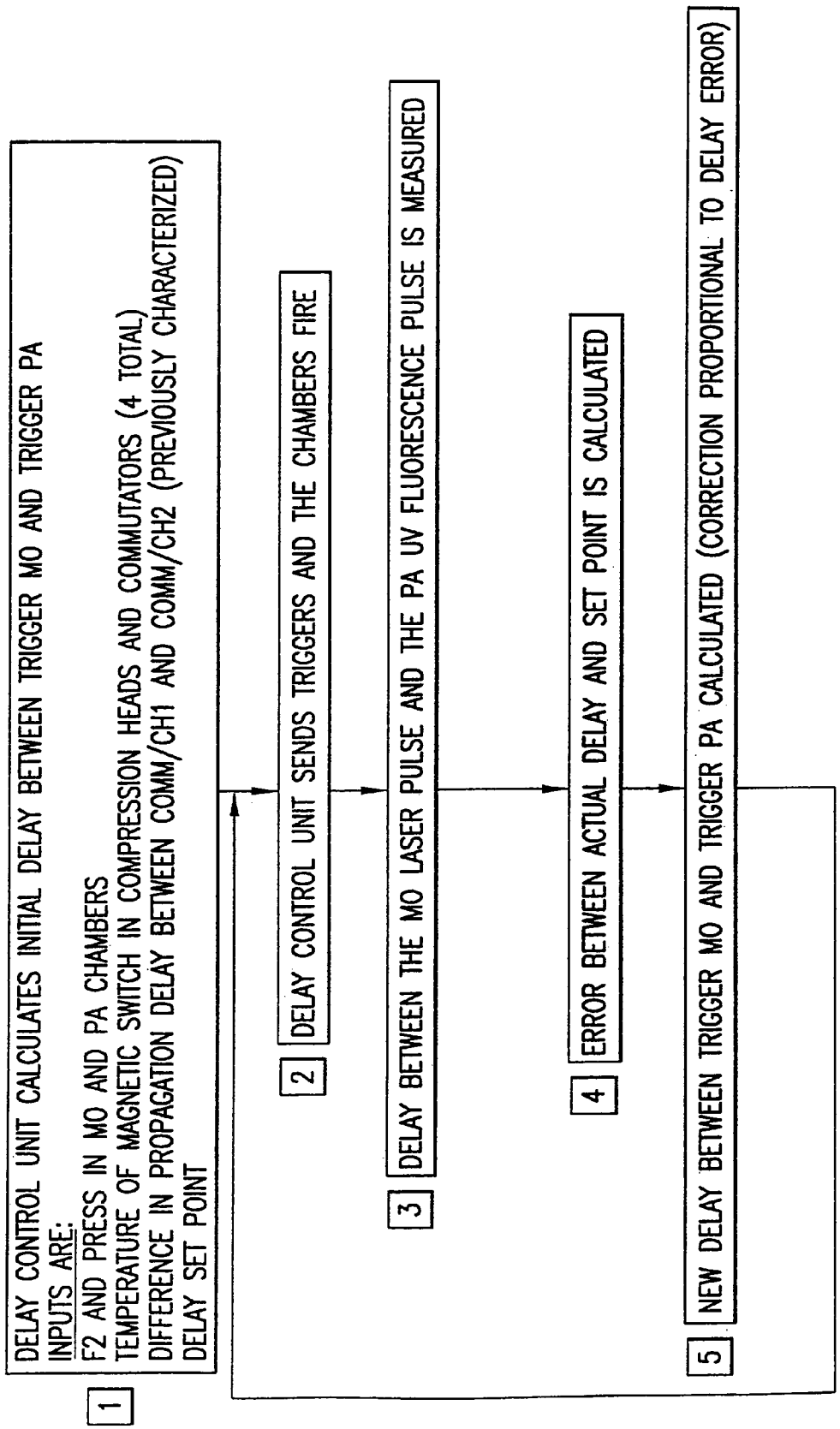
Figure 4C:
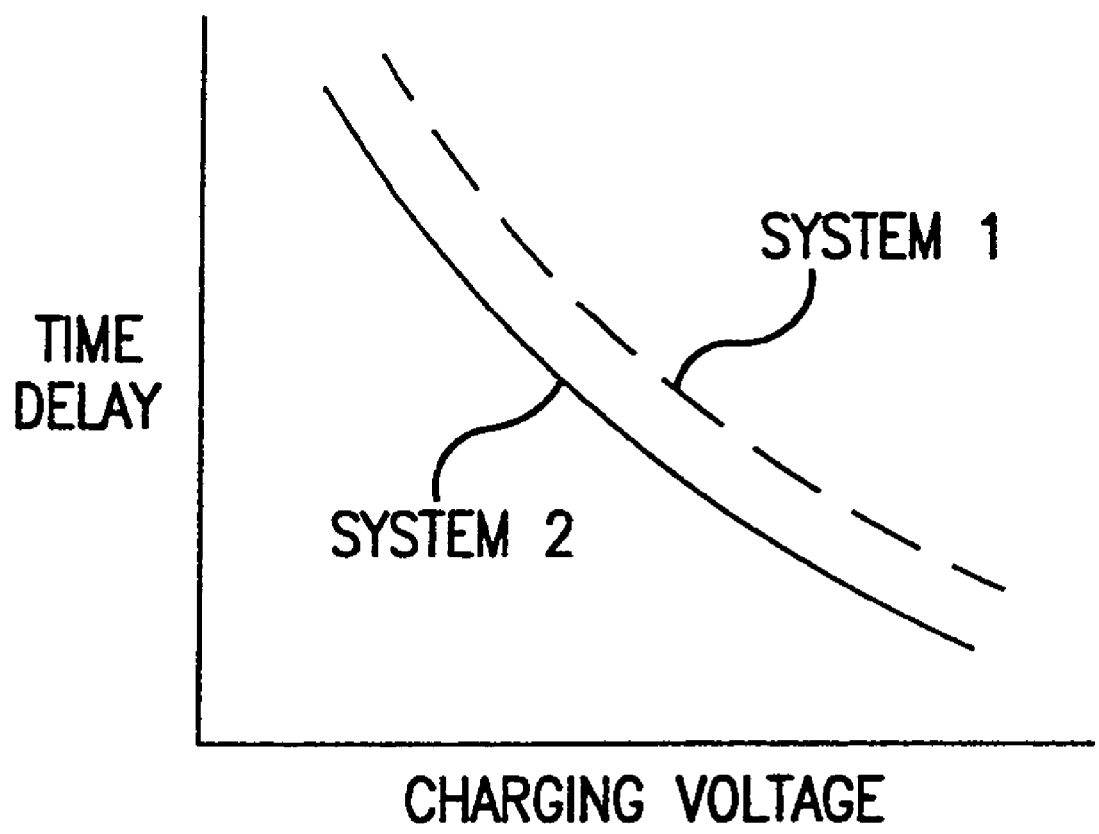

Applicants' preferred solution to this problem is to charge the charging capacitor of both the MO and the PA in parallel from the single resonant charger 7 as indicated in FIG. 1 and FIG. 4 and as described above. It is also important to design the two pulse compression/amplification circuits for the two systems so that time delay versus charging voltage curves match as shown in FIG. 4A. This is done most easily by using to the extent possible the same components in each circuit.

Thus, in order to minimize timing variations (the variations are referred to as jitter) in this preferred embodiment, Applicants have designed pulse power components for both discharge chambers with similar components and have confirmed that the time delay versus voltage curves do in fact track each other as indicated in FIG. 4A. Applicants have confirmed that over the normal operating range of charging voltage, there is a substantial change in time delay with voltage but the change with voltage is virtually the same for both circuits. Thus, with both charging capacitors charged in parallel charging voltages can be varied over a wide operating range without changing the relative timing of the discharges.

Temperature control of electrical components in the pulse power circuit is also important since temperature variations can affect pulse compression timing (especially temperature changes in the saturable inductors). Therefore, a design goal is to minimize temperature variations and a second approach is to monitor temperature of the temperature sensitive components and using a feedback control adjust the trigger timing to compensate. Controls can be provided with a processor programmed with a learning algorithm to make adjustments based on historical data relating to past timing variations with known operating histories. This historical data is then applied to anticipate timing changes based on the current operation of the laser system.

Trigger Control

The triggering of the discharge for each of the two chambers is accomplished separately utilizing for each circuit a trigger circuit such as one of those described in U.S. Pat. No. 6,016,325. These circuits add timing delays to correct for variations in charging voltage and temperature changes in the electrical components of the pulse power so that the time between trigger and discharge is held as constant as feasible. As indicated above, since the two circuits are basically the same, the variations after correction are almost equal (i.e., within about 2 ns of each other).

As indicated in FIGS. 6C, D, and E, performance of this preferred embodiment is greatly enhanced if the discharge in the power amplifier occurs about 40 to 50 ns after the discharge in the master oscillator. This is because it takes several nanoseconds for the laser pulse to develop in the master oscillator and another several nanoseconds for the front part of the laser beam from the oscillator to reach the amplifier and because the rear end of the laser pulse from the master oscillator is at a much narrower bandwidth than the front part. For this reason, separate trigger signals are provided to trigger switch 46 for each chamber. The actual delay is chosen to achieve desired beam quality based on actual performance curves such as those shown in FIGS. 6C, D and E. The reader should note, for example, that narrower bandwidth and longer pulses can be obtained at the expense of pulse energy by increasing the delay between MO trigger and PA trigger.

Other Techniques To Control Discharge Timing

Since the relative timing of the discharges can have important effects on beam quality as indicated in the FIGS. 6C, D and E graphs, additional steps may be justified to control the discharge timing. For example, some modes of laser operation may result in wide swings in charging voltage or wide swings in inductor temperature. These wide swings could complicate discharge timing control.

Monitor Timing

The timing of the discharges can be monitored on a pulse-to-pulse basis and the time difference can be used in a feedback control system to adjust timing of the trigger signals closing switch 42. Preferably, the PA discharge would be monitored using a photocell to observe discharge fluorescence (called ASE) rather than the laser pulse since very poor timing could result if no laser beam being produced in the PA. For the MO either the ASE or the seed laser pulse could be used.

Bias Voltage Adjustment

The pulse timing can be increased or decreased by adjusting the bias currents through inductors $L_{B1}$ $L_{B2}$ and $L_{B3}$ which provide bias for inductors 48, 54 and 64 as shown in FIG. 5. Other techniques could be used to increase the time needed to saturate these inductors. For example, the core material can be mechanically separated with a very fast responding PZT element which can be feedback controlled based on a feedback signal from a pulse timing monitor.

Adjustable Parasitic Load

An adjustable parasitic load could be added to either or both of the pulse power circuits downstream of the CO's.

Additional Feedback Control

Charging voltage and inductor temperature signals, in addition to the pulse timing monitor signals can be used in feedback controls to adjust the bias voltage or core mechanical separation as indicated above in addition to the adjustment of the trigger timing as described above.

Burst Type Operation

Feedback control of the timing is relatively easy and effective when the laser is operating on a continuous basis. However, normally lithography lasers operate in a burst mode such as the following to process 20 areas on each of many wafers:

Off for 1 minute to move a wafer into place
4000 Hz for 0.2 seconds to illuminate area 1
Off for 0.3 seconds to move to area 2
4000 Hz for 0.2 seconds to illuminate area 2
Off for 0.3 seconds to move to area 3
4000 Hz for 0.2 seconds to illuminate area 3
. . .
4000 Hz for 0.2 seconds to illuminate area 199
Off for 0.3 seconds to move to area 200
4000 Hz for 0.2 seconds to illuminate area 200
Off for one minute to change wafers
4000 Hz for 0.2 seconds to illuminate area 1 on the next wafer, etc.

This process may be repeated for many hours, but will be interrupted from time-to-time for periods longer than 1 minute.

The length of down times will affect the relative timing between the pulse power systems of the MO and the PA and adjustment may be required in the trigger control to assure that the discharge in the PA occurs when the seed beam from the MO is at the desired location. By monitoring the discharges and the timing of light out from each chamber the laser operator can adjust the trigger timing (accurate to within about 2 ns) to achieve best performance.

Preferably a laser control processor is programmed to monitor the timing and beam quality and adjust the timing automatically for best performance. Timing algorithms which develop sets of bin values applicable to various sets of operating modes are utilized in preferred embodiments of this invention. These algorithms are in preferred embodiments designed to switch to a feedback control during continuous operation where the timing values for the current pulse is set based on feedback data collected for one or more preceding pulse (such as the immediately preceding pulse).

No Output Discharge

Figure 4D:
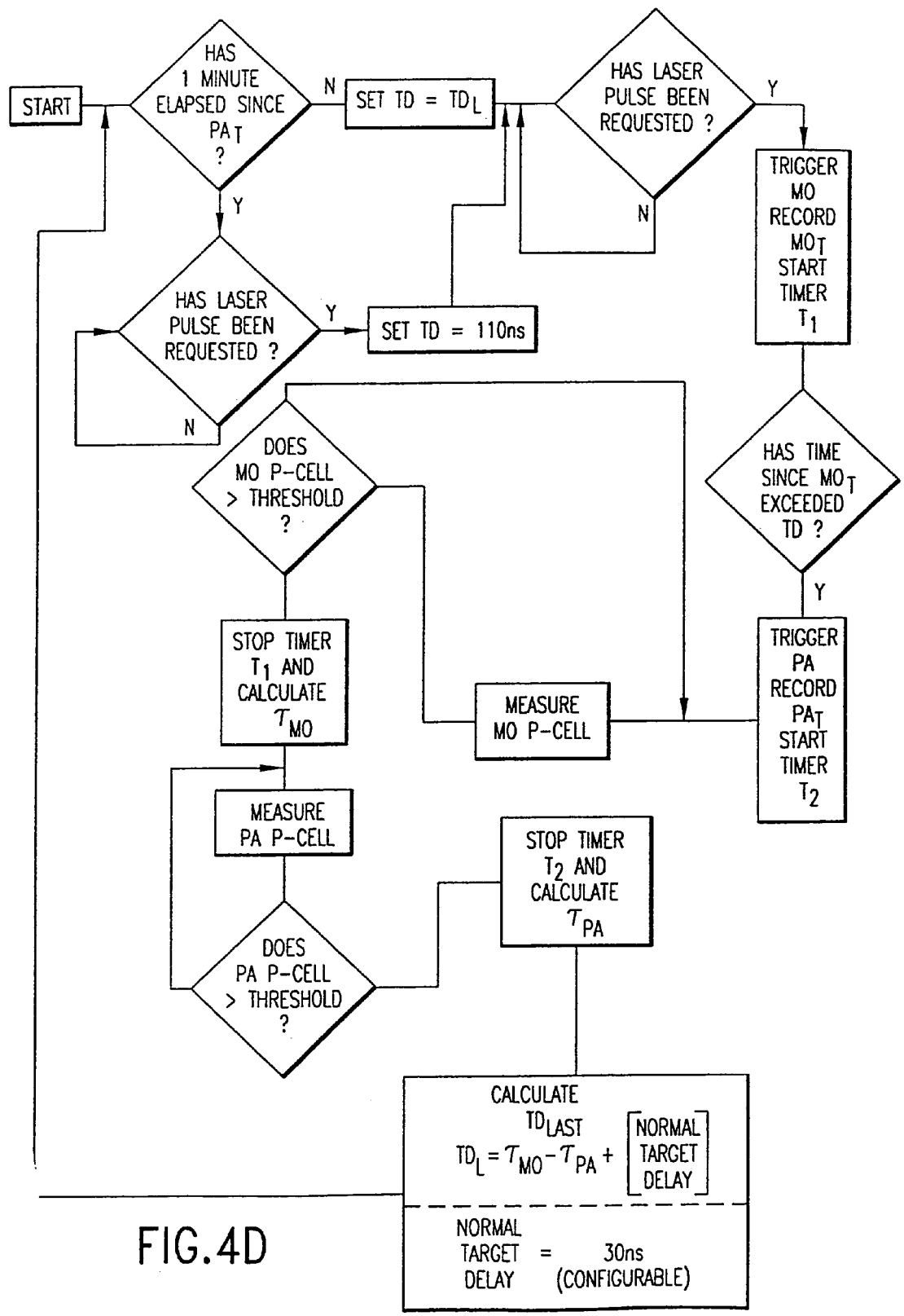
Figures 1, 4E:
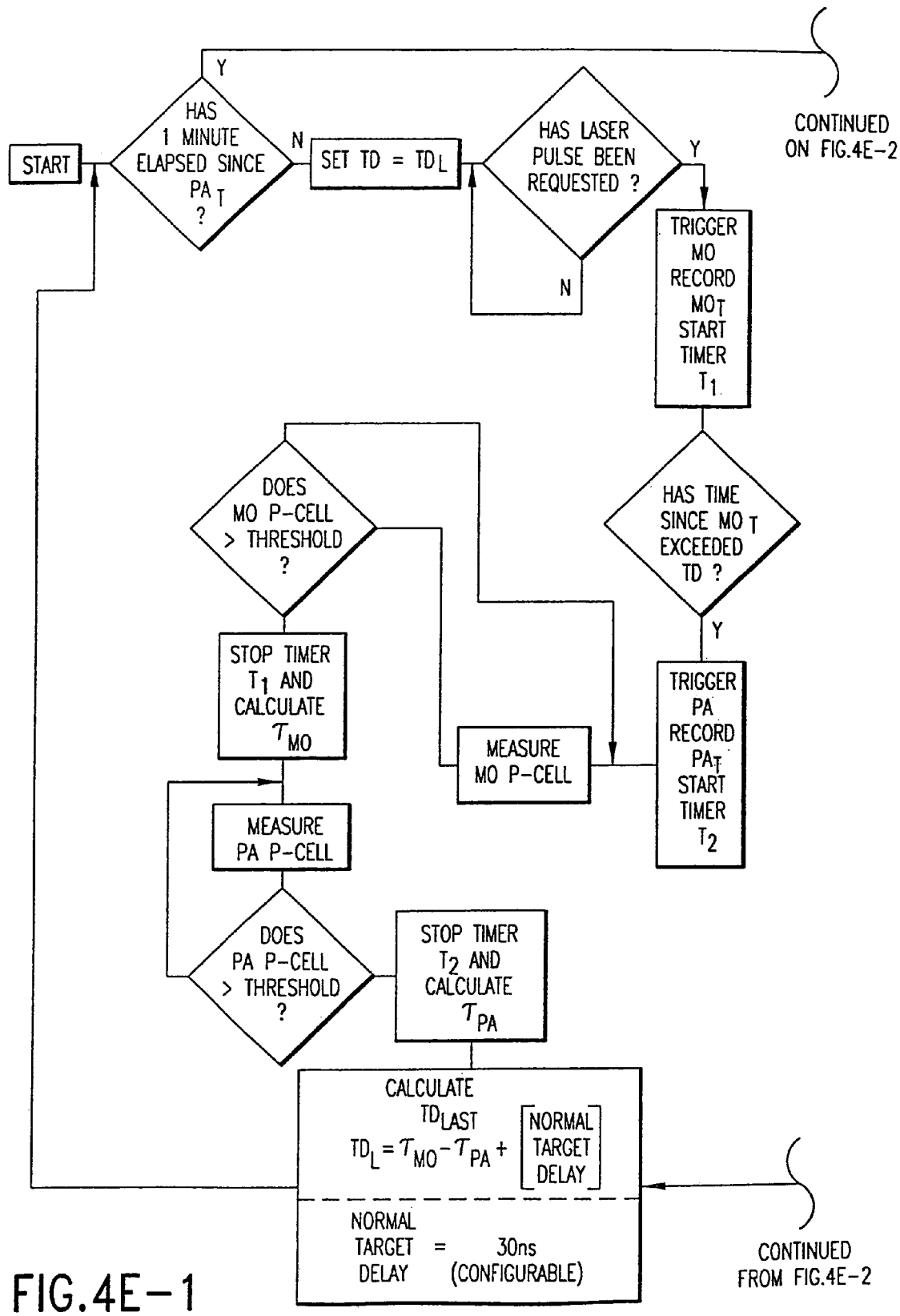
Figures 2, 4E:
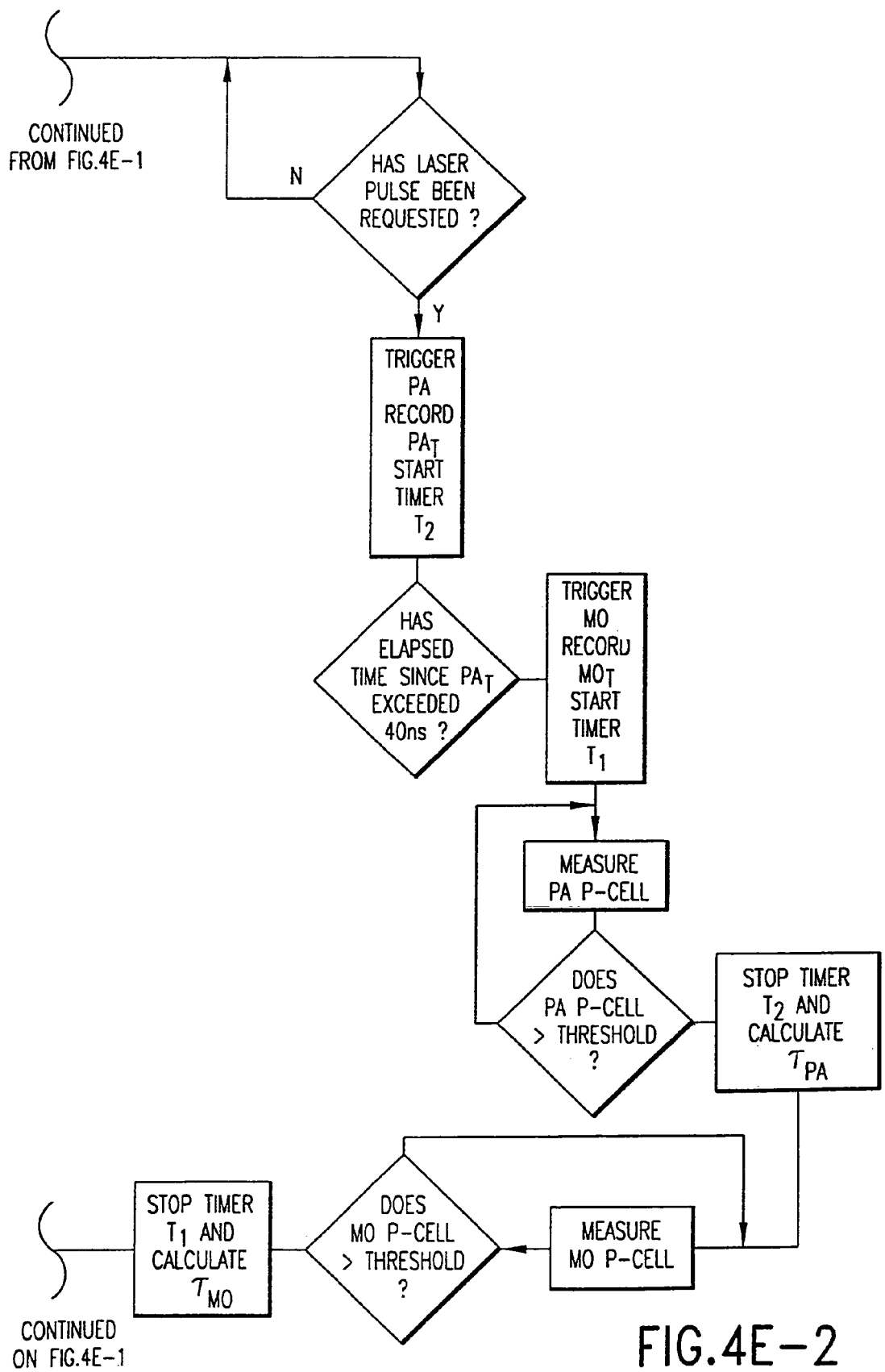
Figures 3, 4E:
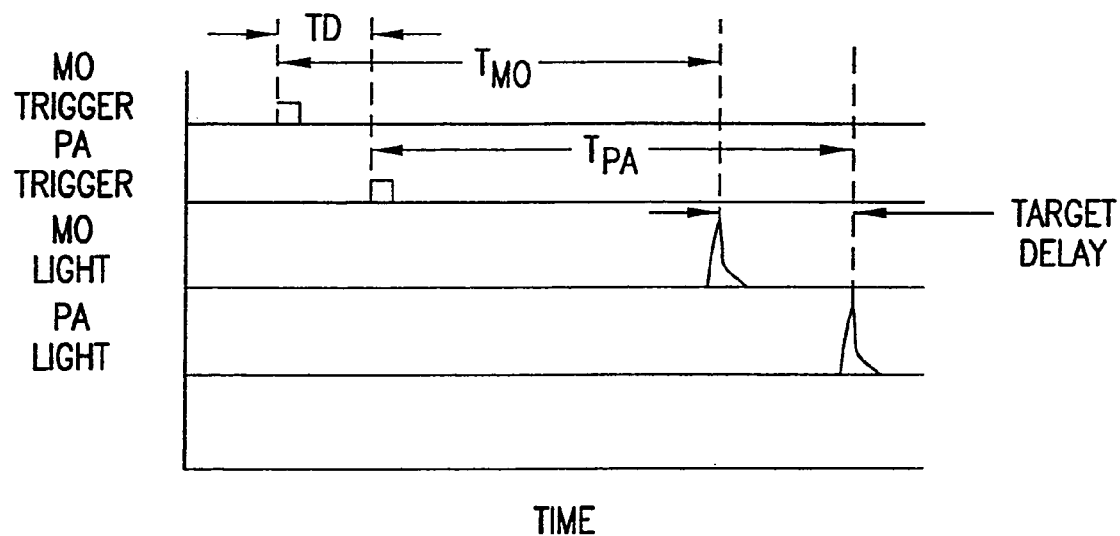

Timing algorithms such as those discussed above work very well for continuous or regularly repeated operation. However, the accuracy of the timing may not be good in unusual situations such as the first pulse after the laser is off for an unusual period of time such as 5 minutes. In some situations imprecise timing for the first one or two pulses of a burst may not pose a problem. A preferred technique is to preprogram the laser so that the discharges of the MO and the PA are intentionally out of sequence for one or two pulses so that amplification of the seed beam from the MO is impossible. For example, laser could be programmed to trigger the discharge of the PA 80 ns prior to the trigger of the MO. In this case, there will be no significant output from the laser but the laser metrology sensors can determine the timing parameters so that the timing parameters for the first output pulse is precise. Alternatively, the MO could be triggered early enough relative to the triggering of the PA so that the MO beam passes through the PA prior to the PA discharge. FIGS. 4D, 4D1, 4E and 4E1 are flow charts showing possible control algorithms using these techniques.

Water Cooling of Components

To accommodate greater heat loads water cooling of pulse power components is provided in addition to the normal forced air cooling provided by cooling fans inside the laser cabinet in order to support operation pulse rates of 4 KHz or greater.

One disadvantage of water cooling has traditionally been the possibility of leaks near the electrical components or high voltage wiring. This specific embodiment substantially avoids that potential issue by utilizing a single solid piece of cooling tubing that is routed within a module to cool those components that normally dissipate the majority of the heat deposited in the module. Since no joints or connections exist inside the module enclosure and the cooling tubing is a continuous piece of solid metal (e.g. copper, stainless steel, etc.), the chances of a leak occurring within the module are greatly diminished. Module connections to the cooling water are therefore made outside the assembly sheet metal enclosure where the cooling tubing mates with a quick-disconnect type connector.

Saturable Inductor

Figure 11:
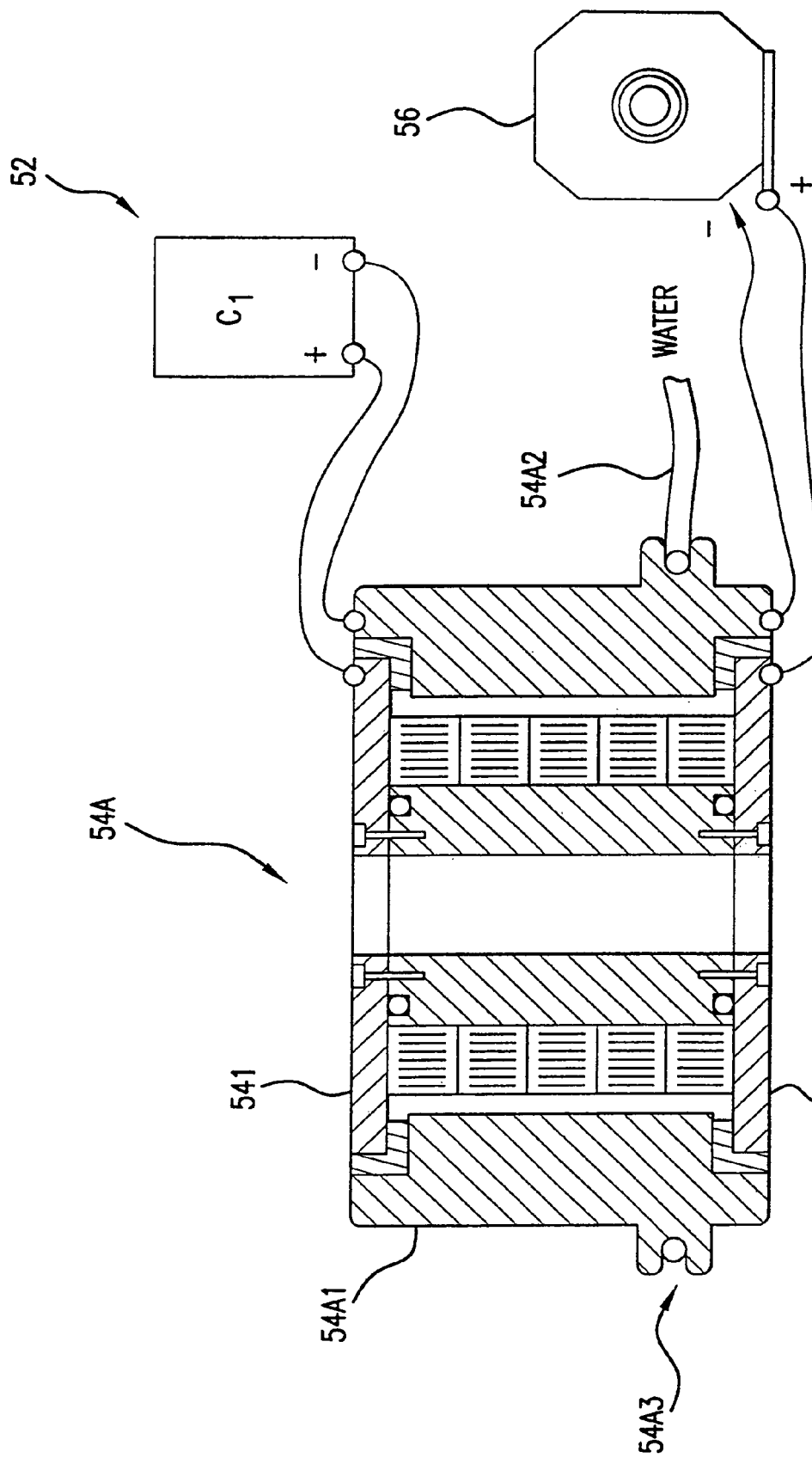

In the case of the commutator module a water cooled saturable inductor 54A is provided as shown in FIG. 11 which is similar to the inductor 54 shown in FIG. 8 except the fins of 54 are replaced with a water cooled jacket 54A1 as shown in FIG. 11. The cooling line 54A2 is routed within the module to wrap around jacket 54A1 and through aluminum base plate where the IGBT switches and Series diodes are mounted. These three components make up the majority of the power dissipation within the module. Other items that also dissipate heat (snubber diodes and resistors, capacitors, etc.) are cooled by forced air provided by the two fans in the rear of the module.

Since the jacket 54A1 is held at ground potential, there are no voltage isolation issues in directly attaching the cooling tubing to the reactor housing. This is done by press-fitting the tubing into a dovetail groove cut in the outside of the housing as shown at 54A3 and using a thermally conductive compound to aid in making good thermal contact between the cooling tubing and the housing.

Cooling High Voltage Components

Although the IGBT switches "float" at high voltage, they are mounted on an aluminum base electrically isolated from the switches by a 1/16 inch thick alumina plate. The aluminum base plate which functions as a heat sink and operates at ground potential and is much easier to cool since high voltage isolation is not required in the cooling circuit. A drawing of a water cooled aluminum base plate is shown in FIG. 7. In this case, the cooling tubing is pressed into a groove in an aluminum base on which the IGBT's are mounted. As with the inductor 54a, thermally conductive compound is used to improve the overall joint between the tubing and the base plate.

The series diodes also "float" at high potential during normal operation. In this case, the diode housing typically used in the design provides no high voltage isolation. To provide this necessary insulation, the diode "hockey puck" package is clamped within a heat sink assembly which is then mounted on top of a ceramic base that is then mounted on top of the water-cooled aluminum base plate. The ceramic base is just thick enough to provide the necessary electrical isolation but not too thick to incur more than necessary thermal impedance. For this specific design, the ceramic is 1/16" thick alumina although other more exotic materials, such as beryllia, can also be used to further reduce the thermal impedance between the diode junction and the cooling water.

A second embodiment of a water cooled commutator utilizes a single cold plate assembly which is attached to the chassis baseplate for the IGBT's and the diodes. The cold plate may be fabricated by brazing single piece nickel tubing to two aluminum "top" and "bottom" plates. As described above, the IGBT's and diodes are designed to transfer their heat into the cold plate by use of the previously mentioned ceramic disks underneath the assembly. In a preferred embodiment of this invention, the cold plate cooling method is also used to cool the IGBT and the diodes in the resonant charger. Thermally conductive rods or a heat pipe can also be used to transfer heat from the outside housing to the chassis plate.

Detailed Compression Head Description

Figure 12:
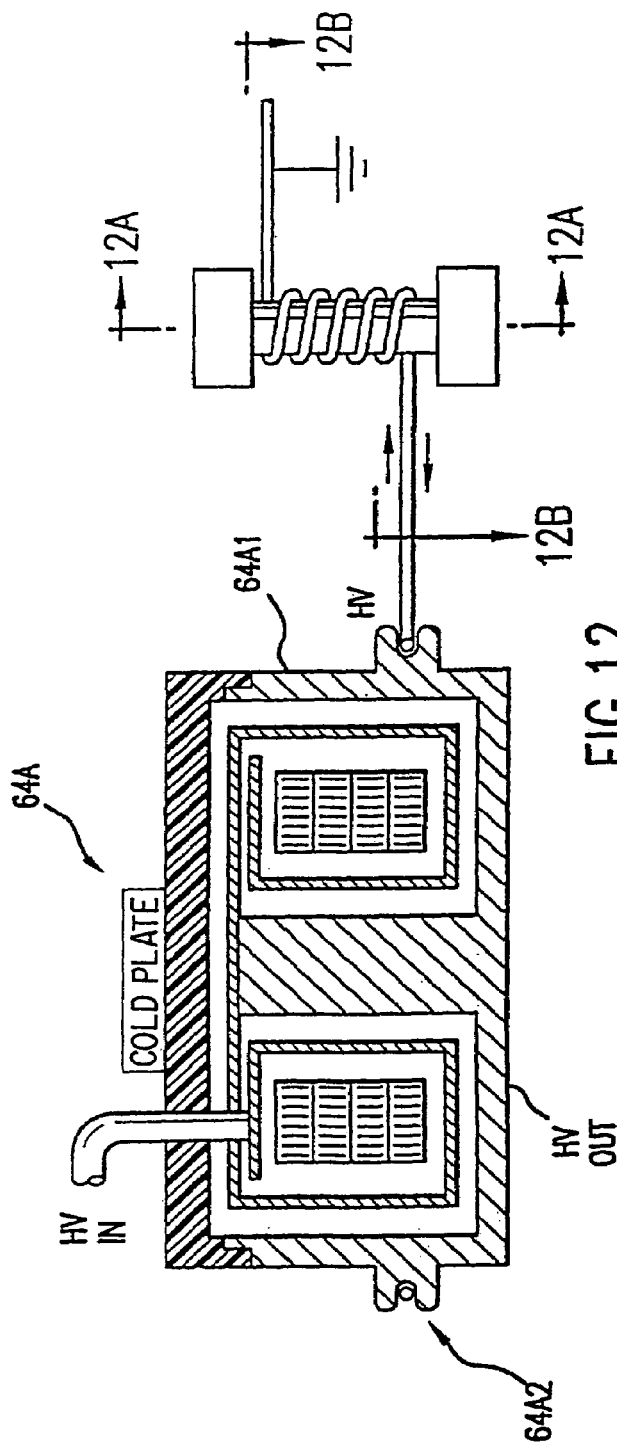
Figure 12B:
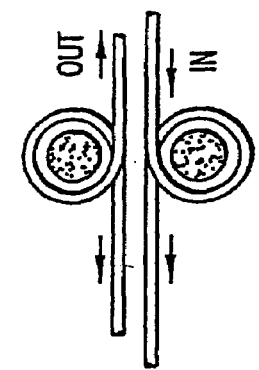
Figure 12A:
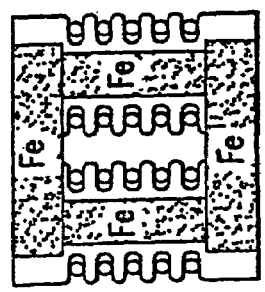

The water-cooled compression head is similar in the electrical design to a prior art air-cooled version (the same type ceramic capacitors are used and similar material is used in the reactor designs). The primary differences in this case are that the module must run at higher rep-rates and therefore, higher average power. In the case of the compression head module, the majority of the heat is dissipated within the modified saturable inductor 64A. Cooling the subassembly is not a simple matter since the entire housing operates with short pulses of very high voltages. The solution to this issue as shown in FIGS. 12, 12A and 12B is to inductively isolate the housing from ground potential. This inductance is provided by wrapping the cooling tubing around two cylindrical forms that contain a ferrite magnetic core. Both the input and output cooling lines are coiled around cylindrical portions of a ferrite core formed of the two cylindrical portions and the two ferrite blocks as shown in FIGS. 12, 12A and 12B.

The ferrite pieces are made from CN-20 material manufactured by Ceramic Magnetics, Inc. of Fairfield, N.J. A single piece of copper tubing (0.187" diameter) is press fit and wound onto one winding form, around the housing 64A1 of inductor 64A and around the second winding form. Sufficient length is left at the ends to extend through fittings in the compression head sheet metal cover such that no cooling tubing joints exist within the chassis.

The inductor 64A comprises a dovetail groove as shown at 64A2 similar to that used in the water-cooled commutator first stage reactor housing. This housing is much the same as previous air-cooled versions with the exception of the dovetail groove. The copper cooling-water tubing is press fit into this groove in order to make a good thermal connection between the housing and the cooling-water tubing. Thermally conductive compound is also added to minimize the thermal impedance.

The electrical design of inductor 64A is changed slightly from that of 64 shown in FIGS. 9A and 9B. Inductor 64A provides only two loops (instead of five loops) around magnetic core 64A3 which is comprised of four coils of tape (instead of three).

As a result of this water-cooled tubing conductive path from the output potential to ground, the bias current circuit is now slightly different. As before, bias current is supplied by a dc-dc converter in the commutator through a cable into the compression head. The current passes through the "positive" bias inductor $L_{B2}$ and is connected to the Cp-1 voltage node. The current then splits with a portion returning to the commutator through the HV cable (passing through the transformer secondary to ground and back to the dc-dc converter). The other portion passes through the compression head reactor Lp-1 (to bias the magnetic switch) and then through the cooling-water tubing "negative" bias inductor $L_{B3}$ and back to ground and the dc-dc converter. By balancing the resistance in each leg, the designer is able to ensure that sufficient bias current is available for both the compression head reactor and the commutator transformer.

The "positive" bias inductor $L_{B2}$ is made very similarly to the "negative" bias inductor $L_{B3}$. In this case, the same ferrite bars and blocks are used as a magnetic core. However, two 0.125" thick plastic spacers are used to create an air gap in the magnetic circuit so that the cores do not saturate with the dc current. Instead of winding the inductor with cooling-water tubing, 18 AWG teflon wire is wound around the forms.

Quick Connections

In this preferred embodiment, three of the pulse power electrical modules utilize blind mate electrical connections so that all electrical connections to the portions of the laser system are made merely by sliding the module into its place in the laser cabinet. These are the AC distribution module, the power supply module and the resonant charges module. In each case a male or female plug on the module mates with the opposite sex plug mounted at the back of the cabinet. In each case two approximately 3-inch end tapered pins on the module guide the module into its precise position so that the electrical plugs properly mate. The blind mate connectors such as AMP Model No. 194242-1 are commercially available from AMP, Inc. with offices in Harrisburg, Pa. In this embodiment connectors are for the various power circuits such as 208 volt AC, 400 volt AC, 1000 Volt DC (power supply out and resonant charges in) and several signal voltages. These blind mate connections permit these modules to be removed for servicing and replacing in a few seconds or minutes. In this embodiment blind mate connections are not used for the commutator module the output voltage of the module is in the range of 20 to 30,000 volts. Instead, a typical high voltage connector is used.

Discharge Components

Figure 13:
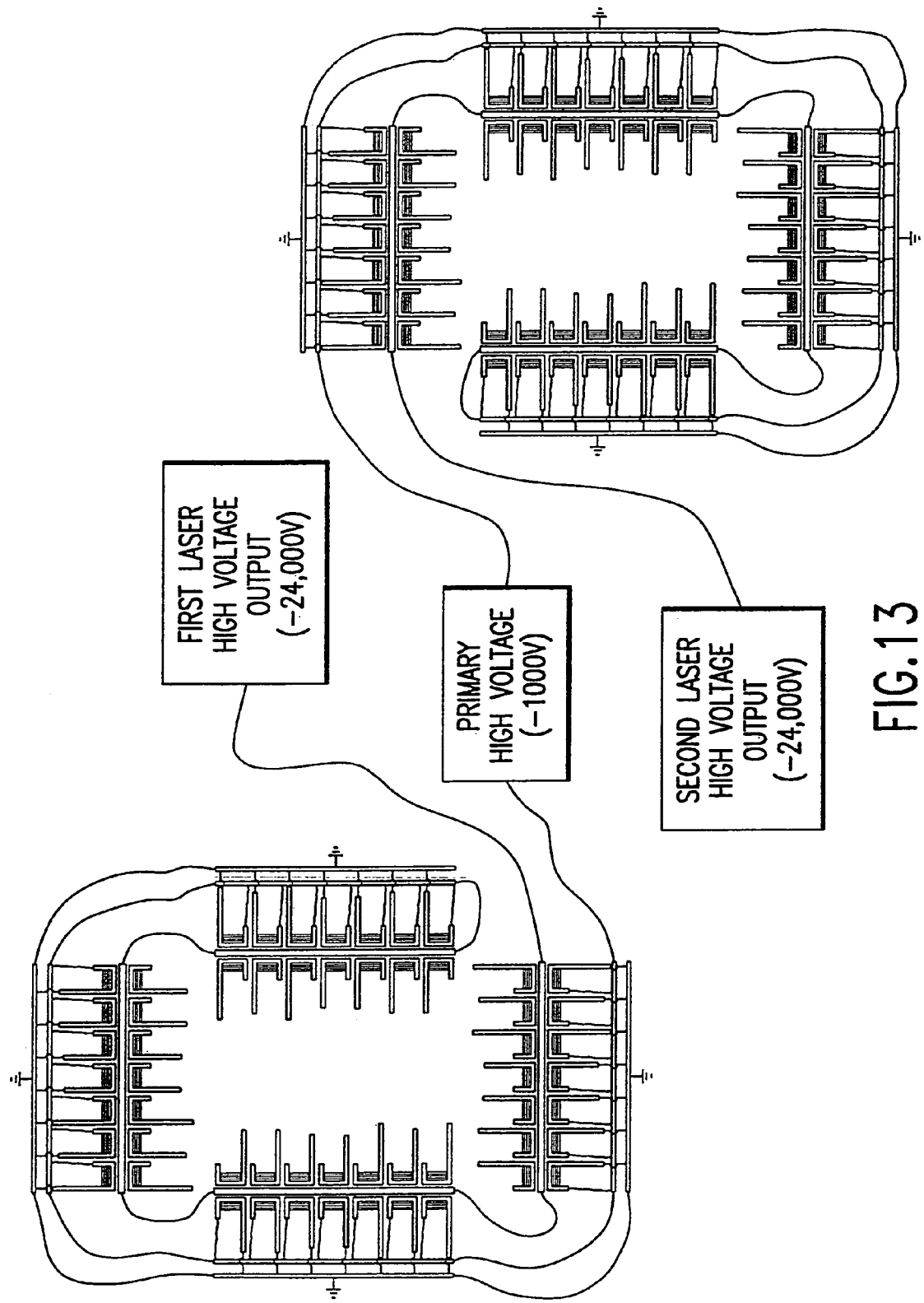
FIG. 13 shows a technique for minimizing jitter problems.
Figure 14:
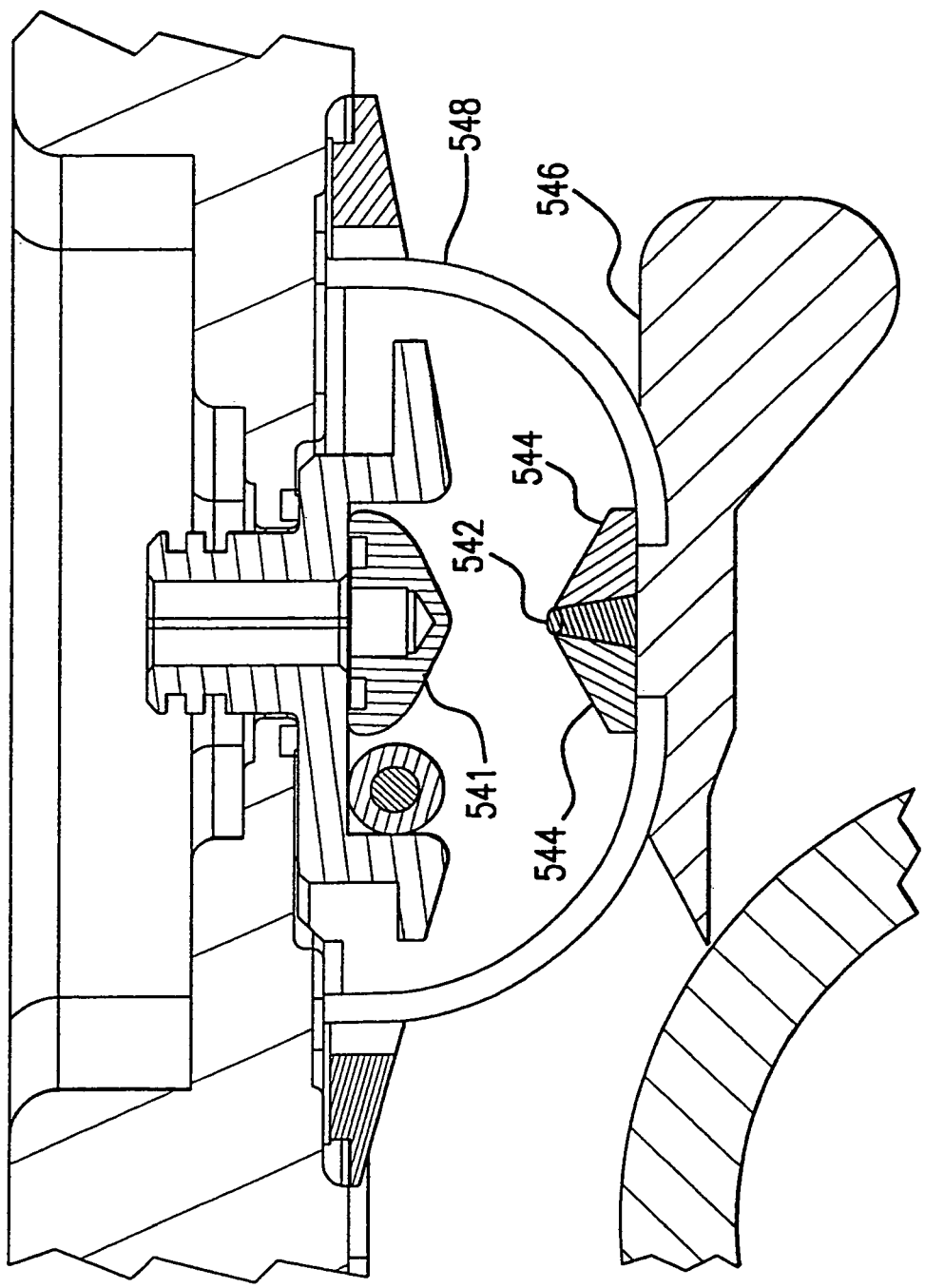
FIGS. 14 and 15 show electrode features.
Figure 15:
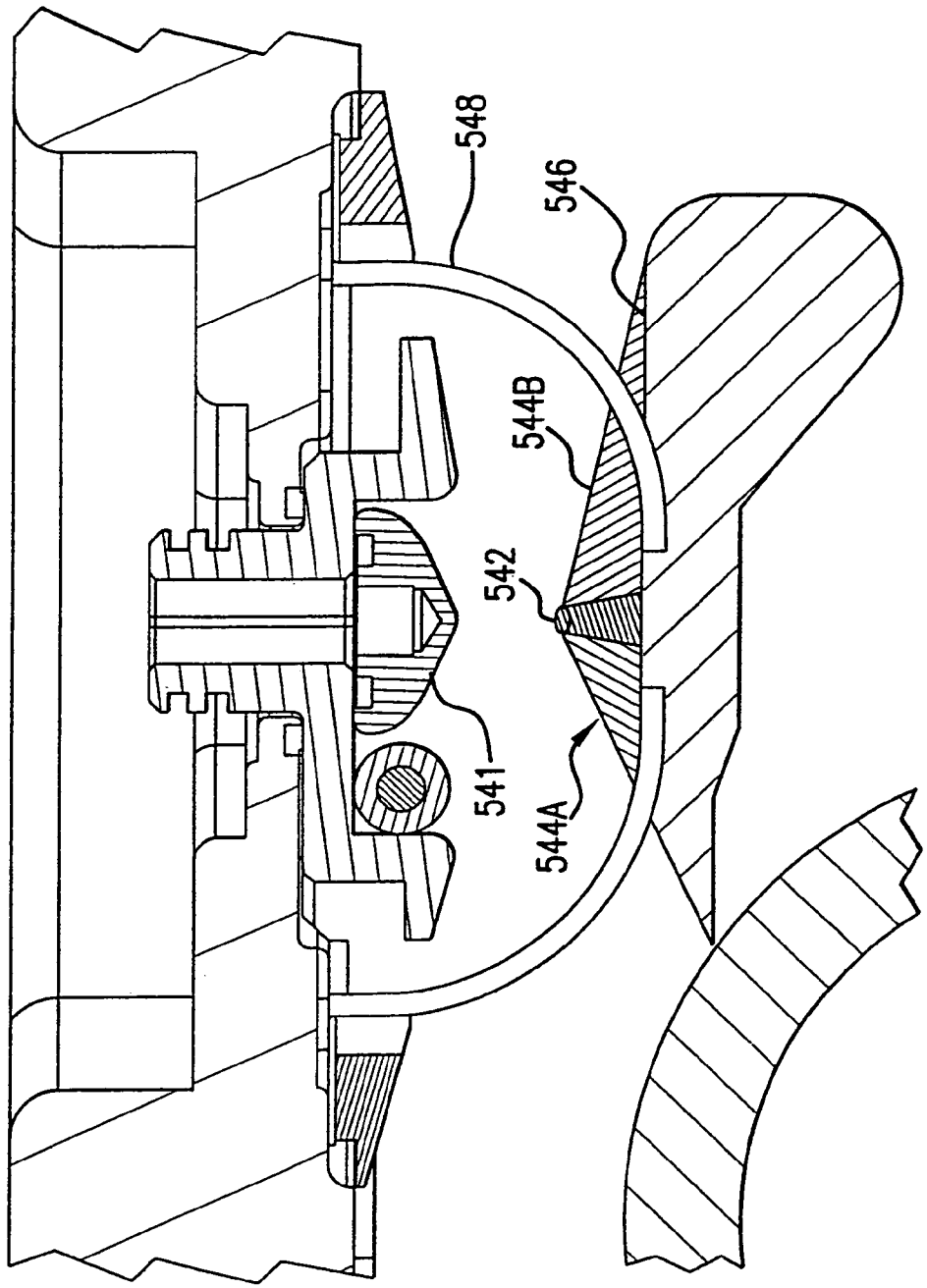

FIGS. 13 and 13A(1) show details of an improved discharge configuration utilized in preferred embodiments of the present invention. This configuration includes an electrode configuration that Applicants call a blade-dielectric electrode. In this design, the anode 540 comprises a blunt blade shaped electrode 542 with dielectric spacers 544 mounted on both sides of the anode as shown to improve the gas flow in the discharge region. The spacers are attached to anode support bar 546 with screws at each end of the spacers beyond the discharge region. The screws allow for thermal expansion slippage between the spacers and the bar. The anode is 26.4 inches long and 0.439 inches high. It is 0.284 inches wide at the bottom and 0.141 inches wide at the top. It is attached to flow shaping anode support bar 546 with screws through sockets that allow differential thermal expansion of the electrode from its center position. The anode is comprised of a copper based alloy preferably C36000, C95400, or C19400. Cathode 541 has a cross section shape as shown in FIG. 13A. A preferred cathode material is C36000. Additional details of this blade dielectric configuration are provided in U.S. patent application Ser. No. 09/768,753 incorporated herein by reference. The current return 548 in this configuration is comprised of a whale bone shaped part with 27 ribs equally spaced along the length of electrode 542, the cross section of which is shown in FIG. 13A (1). As described above, the current return is fabricated from sheet metal and the whale-bone ribs (each having cross-section dimensions of about 0.15 inch×0.09 inch) are twisted so that the long dimension of each rib is in the direction of current flow.

An alternative dielectric spacer design for the anode is shown in FIG. 13A2 to improve flow even more. In this case the spacers mate more perfectly with the flow shaping anode support bar to provide a better gas flow path. Applicants call this their "fast back" blade dielectric anode design.

Alternate Pulse Power Circuit

A second preferred pulse power circuit is shown in FIGS. 5C1, 5C2 and 5C3. This circuit is similar to the one described above but utilizes a higher voltage power supply for charging $C_0$ to a higher value. As in the above described embodiments, a high voltage pulse power supply unit operating from factory power at 230 or 460 volts AC, is power source for a fast charging resonant charger as described above and designed for precise charging two 2.17: F at frequencies of 4000 to 6000 Hz to voltages in the range of about 1100 V to 2250 V. The electrical components in the commutator and compression head for the master oscillator are as identical as feasible to the corresponding components in the power amplifier. This is done to keep time responses in the two circuits as identical as feasible. Switches 46 are banks of two IGBT switches each rated at 3300 V and arranged in parallel. The $C_0$ capacitor banks 42 is comprised of 128 0.068: F 1600 V capacitors arranged in 64 parallel legs to provide the 2.17: F $C_0$ bank. The $C_1$ capacitor banks 52 are comprised of 136 0.068: F 1600 V capacitors arranged in 68 parallel legs to provide a bank capacitance of 2.33: F. The $C_{p-1}$ and $C_p$ capacitor banks are the same as those described above with reference to FIG. 5. The 54 saturable inductors are single turn inductors providing saturated inductance of about 3.3 nH with five cores comprised of 0.5 inch thick 50%—50% Ni—Fe with 4.9 inch OD and 3.8 inch ID. The 64 saturable inductors are two turn inductors providing saturated inductance of about 38 nH each comprised of 5 cores, 0.5 inch thick made with 80%-20% Ni—Fe with an OD of 5 inches and an ID of 2.28 inches. Trigger circuits are provided for closing IGBT's 46 with a timing accuracy of two nanoseconds. The master oscillator is typically triggered about 40 ns prior to the triggering of the IGBT 46 for power amplifier. However, the precise timing is preferably determined by feedback signals from sensors which measure the timing of the output of the master oscillator and the power amplifier discharge.

Pulse Length

The output pulse length measured in tests conducted by Applicants on these $F_2$ lasers is in the range of about 12 ns and is to some extent a function of the relative timing of the two discharges. A longer pulse length (other things being equal) can increase the lifetime of optical components of lithography equipment.

Applicants have identified several techniques for increasing pulse length. As indicated above, the relative time between discharges can be optimized for pulse length. The pulse power circuits of both the MO and the PA could be optimized for longer pulses using techniques such as those described in U.S. patent application Ser. No. 09/451,995 incorporated herein by reference. An optical pulse multiplier system such as one of those described in U.S. Pat. No. 6,067,311, incorporated by reference herein, could be added downstream of the PA to reduce the intensity of individual pulses. A preferred pulse multiplier unit (also called a pulse stretcher) is described in the next section. This pulse multiplier could be made a part of the beam path to lens components of a lithography tool. The chamber could be made longer and the electrodes could be configured to produce traveling wave discharges designed for longer pulse lengths.

Pulse Multiplier Unit

A preferred pulse multiplier unit is shown in FIG. 22A. Light beam 20 from laser 50 hits the beam splitter 22. Beam splitter has a reflectivity of about 40%. About 40% of the light reflects a first portion of the output beam 30. The rest of the incoming beam transmits through the beam splitter 22 as beam 24. The beam is reflected back at a small angle by a mirror 26, which is a spherical mirror with the focal length equal the distance from beam splitter 22 to the mirror. So, the beam is focused to a point 27 near the beam splitter 22 but missing it slightly. This beam spreads again and is now reflected by mirror 28, which is also a spherical mirror with the focal length equal the distance from this mirror to point 27. The mirror 28 reflect the beam back at a small angle and also collimates the reflected beam. This reflected beam 32 propagates to the right and is reflected by mirror 29 to beam splitter 22 where about 60% of the beam is transmitted through beam splitter 22 to merge into and become the second portion of output beam 30. A portion (about 40%) of beam 34 is reflected by the beam splitter 22 in the direction of beam 24 for a repeat of the trip of beam 32. As a result, a short input pulse is split into several portions, so that total duration of the beam is increased and its peak intensity is decreased. Mirrors 26 and 28 create a relay system which images the portions of the outcoming beam onto each other. Because of that imaging, each portion of the output beam is virtually the same. (If mirrors 26 and 28 were flat, beam divergence would spread the beam for each subsequent repetition, so beam size would be different for each repetition.) The total optical path length from beam splitter 22 to mirror 26 to mirror 28 to mirror 27 and, finally, to beam splitter 22 determines the time delay between repetitions. FIG. 22B1 shows the pulse profile of a typical pulse produced by an ArF excimer laser. (These results can be applied to an $F_2$ laser except the un-multiplied pulse for the $F_2$ laser is about 12 ns instead of about 18 ns for the ArF laser.) FIG. 22B2 shows the simulated output pulse profile of a similar ArF laser pulse after being spread in a pulse stretcher built in accordance with FIG. 6. In this example the $T_{is}$, of the pulse was increased from 18.16 ns to 45.78 ns. ($T_{is}$ is a measure of pulse duration used for describing laser pulses. It refers to the integral square pulse duration.)

FIG. 22C shows a layout similar to the FIG. 22A layout but with an additional delay path. In this case, the first beam splitter 22A is designed for a reflection of 25 percent and the second beam splitter 22B is designed for a reflection of 40 percent. The resulting beam shape produced by computer simulation is shown in FIG. 22D. The $T_{is}$ for this stretched pulse is about 73.2 ns. In the FIG. 22C embodiment, the portions of the beam is transmitted through beam splitter 22B are flipped in orientation when they return and are joined into exit beam 30. This reduces significantly the spatial coherence of the beam.

FIGS. 22E and F show beam splitter designs which use optical elements without coatings. FIG. 22E shows a beam splitter design to take advantage of frustrated internal reflection and FIG. 22F shows a transparent uncoated plate tilted to produce a Fresnel reflection from both sides of the plate to achieve the desired reflection-transmission ratio.

The pulse stretcher unit could be installed in the back of vertical optical table 11 as suggested above or it could be installed on top of the table or even inside of it.

Pulse and Dose Energy Control

Pulse energy and dose energy are preferably controlled with a feedback control system and algorithm such as that described above. The pulse energy monitor can be at the laser as closer to the wafer in the lithography tool. Using this technique charging voltages are chosen to produce the pulse energy desired. In the above preferred embodiment, both the MO and the PA are provided with the same charging voltage since the CO's are charged in parallel.

As discussed above, Applicants have determined that this technique works very well and greatly minimize timing jitter problems. This technique, however, does reduce to an extent the laser operator's ability to control the MO independently of the PA. However, there are a number of operating parameters of the MO and the PA that can be controlled separably to optimize performance of each unit. These other parameters include: laser gas pressure, $F_2$ concentration and laser gas temperature. These parameters preferably are controlled independently in each of the two chambers and regulated in a processor controlled feedback arrangement.

Additional Optical Quality Improvement

The present invention provides a laser system capable of much greater pulse energy and output power than prior art single chamber high repetition rate gas discharge lasers. With this system the master oscillator to a large extent determines the wavelength and the bandwidth and the power amplifier primarily controls the pulse energy. The pulse energy needed for an efficient seeding of the power amplifier is can be as low as a small fraction of a mJ as shown in FIG. 6B. Since the master oscillator type of laser is easily capable of producing 5 mJ pulses, it has energy to spare. This additional pulse energy provides opportunities for using certain techniques for improving beam quality which are not particularly energy efficient.

Figure 23:
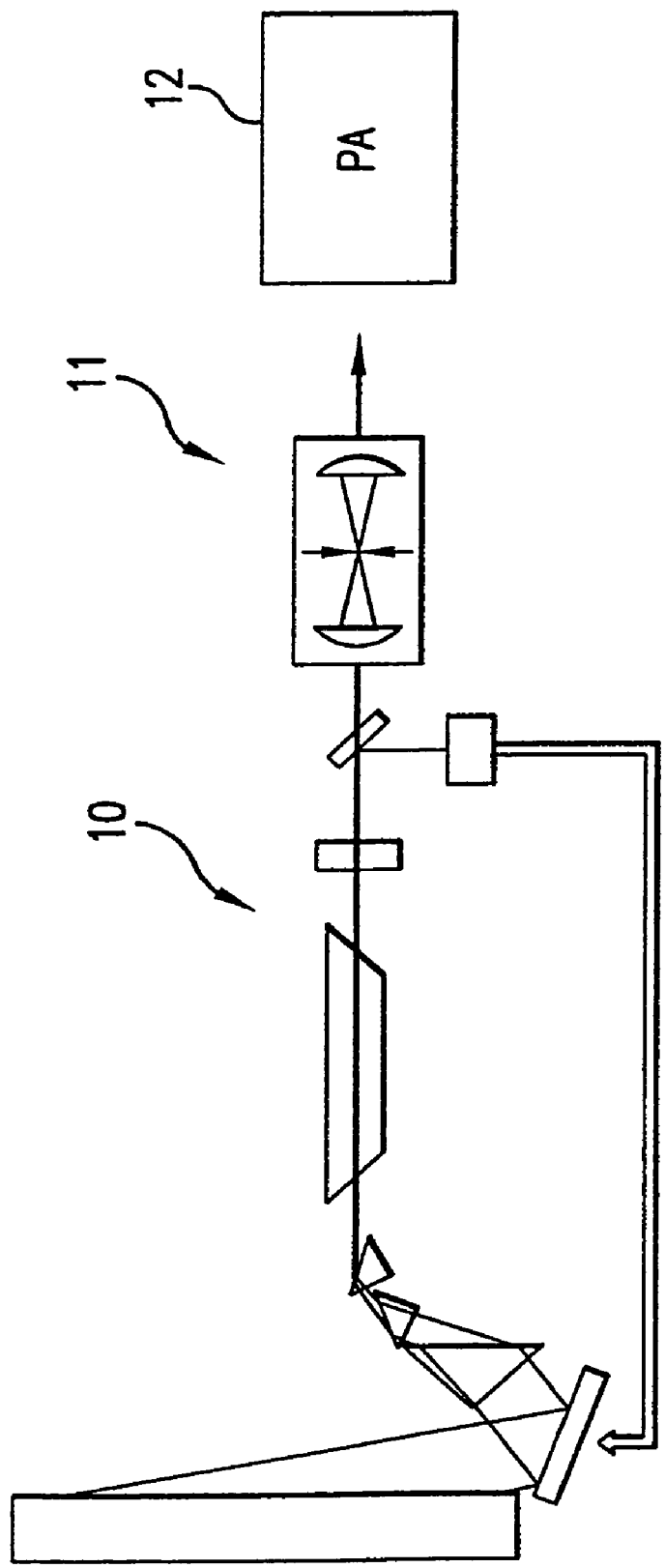
FIGS. 23, 23A and 23B show techniques for spatially filtering a seed beam.
Figure 23A:
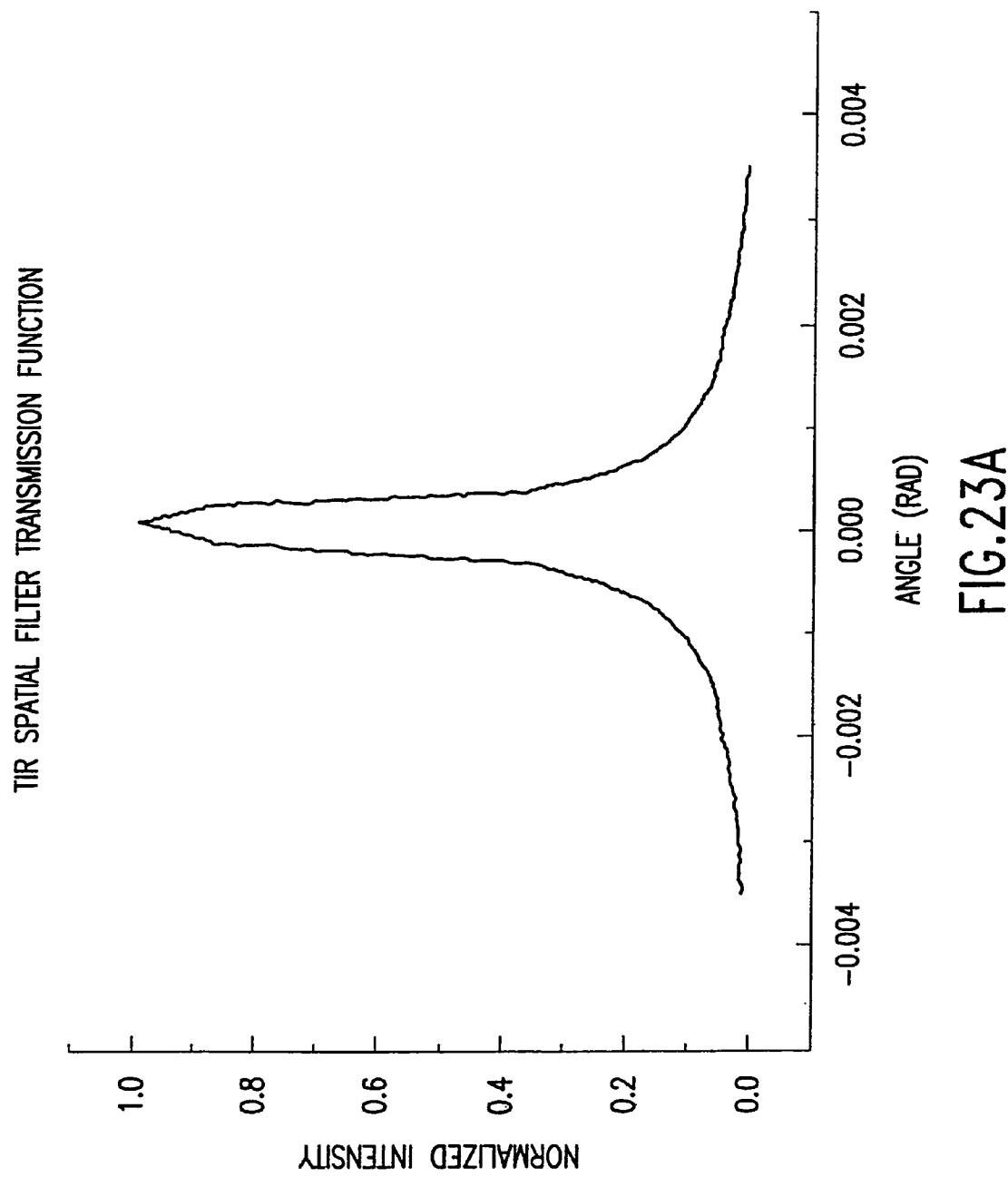

These techniques include:
Pulse trimming as described in U.S. Pat. No. 5,852,621, incorporated herein by reference. The pulse energy is monitored, the pulse is delayed and a portion of the delayed pulse is trimmed using a very fast optical switch such as a Pockels cell.
Using line-narrowing module with very high beam expansion and small apertures, as described later in this application.
Wavefront engineering
Intercavity wavefront correction can be added to the master oscillator or downstream of the master oscillator. This could include use of a grating with one or more bends as described in U.S. patent application Ser. No. 09/703,317 incorporated herein by reference, a deformable mirror wavefront correction can also be a static correction such as a non-flat mirror non-flat prism face configured to correct a known wavefront distortion.
Beam filtering
Beam filters such as a spatial filter as described in U.S. patent application Ser. No. 09/309,478, incorporated by reference herein, and shown at 11 in FIG. 23 could be added to reduce bandwidth. Beam filters could be within the MO resonance cavity or between the MO and the PA. The could also be added downstream of the PA. A preferred spatial filter which does not require the beam to propogate through a focus is a total internal spatial filter and is described in the following section.
Coherence control
Coherence of the laser beam can be a problem for integrated circuit fabricators. Gas discharge lasers typically produce a laser beam which has low coherence. However, as the bandwidth is made very narrow, a consequence is greater coherence of the output beam. For this reason, some induced spatial in-coherence may possibly be desired. Preferably optical components for reducing the coherence would be added either in the MO resonance cavity or between the MO and the PA. Several optical components are known for reducing coherence such as moving phase plates or acoustic-optic devices.
Aperturing
Beam quality of the seed beam can also be improved by tighter aperturing of the beam.

Total Internal Reflecting Spatial Filter

Spatial filtering is effective at reducing the integrated 95% bandwidth. However, all direct spatial filtering techniques previously proposed required at least concentrating the beam and in most cases actually focusing the beam. Additionally all previous designs required multiple optical elements. A simple, compact spatial filter, that does not require a focused beam, would be more readily adaptable for incorporation inside the laser resonator if spatial filtering is desired.

A preferred filter is a single prism approximately 2 inches in length. The entrance and exit faces of the prism are parallel to each other and normal to the incident beam. Two other faces would be parallel to each other but orientated at an angle equal to the critical angle with respect to the entrance and exit faces. At a wavelength of about 157 nm the critical angle in $CaF_2$ is 39.89 degrees. The only coatings required would be normal incidence anti-reflection coatings on the entrance and exit faces of the prism.

The spatial filter would work in the following manner. The beam would enter at normal incidence to the entrance face of the prism. The beam would then propagate to the critical angle face of the prism. If the beam was collimated all rays would be incident at the critical angle at this second face. However, if the beam if diverging or converging some of the rays will strike this face at angles greater than and less than the critical angle. All rays striking this face at or greater than the critical angle will be reflected at 100%. Rays striking this face at an angle less than the critical angle will be reflected at values less than 100% and will be attenuated. All rays that are reflected will be incident at the opposite face of the prism at the same angle where they will also be attenuated by the same amount. In the design proposed there will be a total of six reflections for each pass. The reflectivity for p-polarized light at an angle of 1 mrad less than the critical angle is about 71%. Therefore, all rays with incident angles that differ from the critical angle by 1 mrad or more will be transmitted at the exit face at less than 13% of their original intensity.

However, a single pass of this filter will only be one sided. All rays that are incident at angles greater than the critical angle reflect at 100%. Once exiting the spatial filter prism, the beam will be incident upon a mirror. Inside the laser resonator this mirror could be the output coupler. After reflecting off the mirror, the rays will re-enter the spatial filter prism, but with one critical difference. All rays that exited the spatial filter at angles that were greater than the critical angle will be inverted after reflecting off the mirror. These rays will now re-enter the prism at values less than the critical angle and will be attenuated. It is this second pass through the prism that changes the transmission function of the prism from a one sided filter into a true bandpass filter.

Figure 23B:
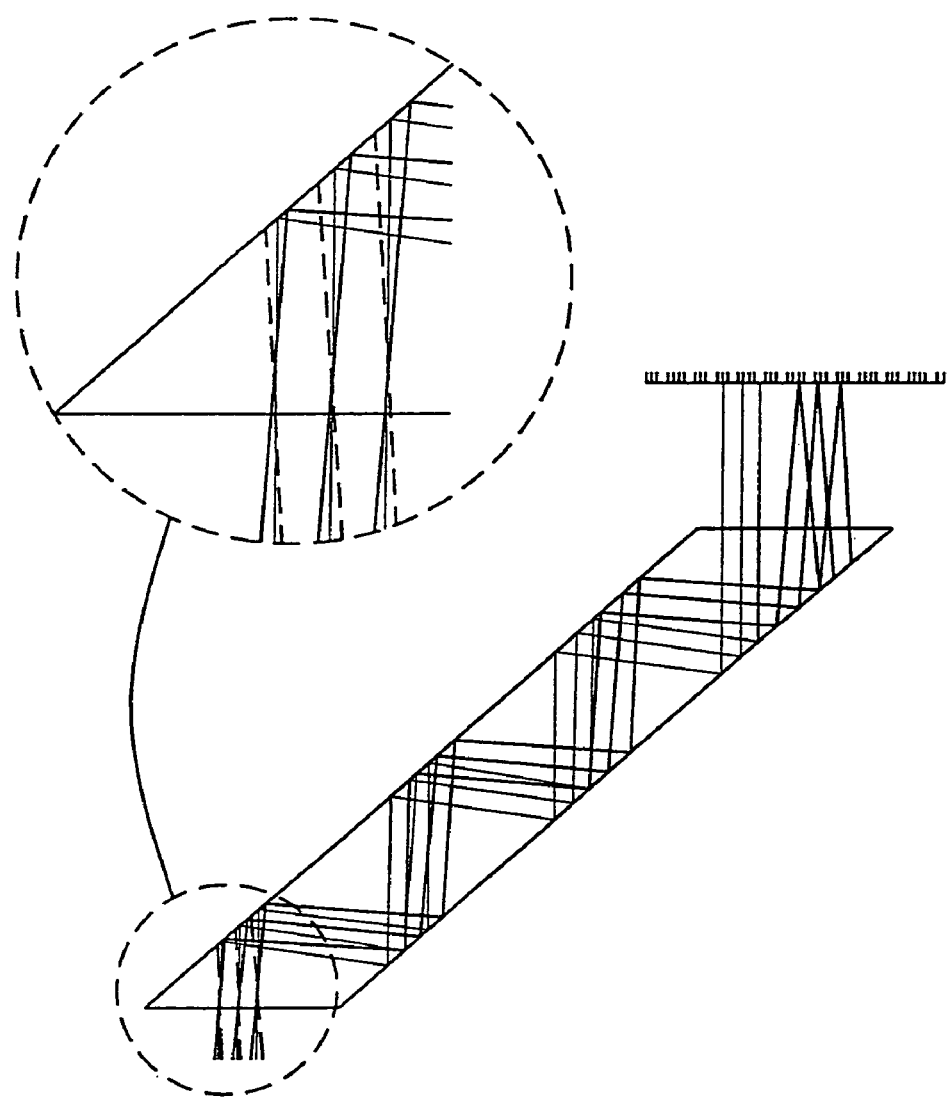

FIG. 23B shows the design of the spatial filter. The input and output faces of the prism are ½ inch. The critical angle faces are about 2 inches. The input beam width is 2.6 mm and represents the width of the beam in the short axis. The prism would have a height of 1 inch in the plane of the drawing. The figure shows three sets of rays. The first set of rays is collimated and strikes the surfaces at the critical angle. These are the green rays. A second set of rays is incident at the surface less than the critical angle and is terminated at the first reflection. They are the blue rays. These rays are more visible in the magnified section. They represent the rays that are attenuated on the first pass. The final set of rays is incident at an angle greater than the critical angle. These rays propagate through the entire first pass but are terminated at the first reflection of the second pass. They represent the rays that are attenuated on the second pass.

Telescope between Chambers

In preferred embodiments a cylindrical refractive telescope is provided between the output of the master oscillator and the input of the power amplifier. This controls the horizontal size of the beam entering the power amplifier. This telescope can also be designed using well known techniques to control the horizontal divergence.

Metrology

In preferred embodiments of the present invention pulse energy is monitored controlled on a pulse to pulse basis with feedback from a fast photodiode energy monitor. In many applications, pulse-by-pulse monitoring of wavelength and bandwidth are not provided since the natural centerline wavelength and bandwidth of the major F2 line is relatively invariable. If desired, however, both wavelength and bandwidth could be monitored generally in the same manner as in prior art excimer lasers but at the 157 nm wavelength range.

Preferably power monitors (p-cells) should be provided at the output of the master oscillator, after the power amplifies and after the pulse multiplies. Preferably a p-cell should also be provided for monitoring any back reflections into the master oscillator. Such back reflections could be amplified in the oscillator and damage the master oscillator optical components. The back reflection signal from the back reflection monitor is used to shut the laser down if a danger threshold is exceeded. Also, the system should be designed to avoid glint in the beam path that might cause any significant back reflection.

The beam parameter measurement and control for this laser is described below. The wavemeter used in the present embodiment is similar to the one described in U.S. Pat. No. 5,978,394 and some of the description below is extracted from that patent. At wavelengths in the range of 157 nm, wavelength and bandwidth metrology components are subject to radiation damage so Applicants recommend that these measurements be made periodically rather than on a pulse to pulse basis. For example, wavelength and bandwidth could be monitored for 30 pulses once each 10 minute period. At this rate the metrology components for the F2 lasers should have lifetimes at least comparable to KrF and ArF lasers. To accomplish this a shutter should be provided for the wavemeter to block the beam access to the wavelength and bandwidth metrology components.

The optical equipment in these units measure pulse energy, wavelength and bandwidth. These measurements are used with feedback circuits to maintain pulse energy and wavelength within desired limits.

A small portion of the laser beam is reflected to an energy detector which comprises a very fast photo diode which is able to measure the energy of individual pulses occurring at the rate of 4,000 pulses per second. The pulse energy is about 10 mJ, and the output of detector 69 is fed to a computer controller which uses a special algorithm to adjust the laser charging voltage to precisely control the pulse energy of future pulses based on stored pulse energy data in order to limit the variation of the energy of individual pulses and the integrated energy of bursts of pulses.

Based on the measurement of pulse energy of each pulse as described above, the pulse energy of subsequent pulses are controlled to maintain desired pulse energies and also desired total integrated dose of a specified number of pulses all as described in U.S. Pat. No. 6,005,879, Pulse Energy Control for Excimer Laser which is incorporated by reference herein.

Line Selection

Prism Based Line Selector

In preferred embodiments, the strongest of the natural F2 resonant lines is selected using a five-prism line selector as shown in FIGS. 16A and B. These five prisms 112 A–E are precisely mounted on a single prism plate not shown which is located in LSP 10C as shown in FIG. 1. This LSP is located downstream of the master oscillator a short distance downstream of the master oscillator output coupler. Each of the five prisms are 65 degree (apex angle) prisms and are arranged horizontally as shown in FIG. 16A. The angle of incidence of the prisms for this particular embodiment are as follows for prisms 112A through E respectively: 79.6°, 61.4°, 47.7°, 71.7° and 42.1°. (Many other prism configurations could provide similar results.)

Mirror 114B is positioned to reflect the beam upward to mirror 114C which is positioned to reflect the beam through an aperture (not shown) into the discharge region of the power amplifier as shown 12A as shown in FIG. 1. The five-prism line selector produces an angular spread of 10.56 milli-radians between the 157.63 nm and the 157.52 nm $F_2$ lines which produces a spatial separation of about 5.5 mm at a distance of about 0.5 meters downstream at the aperture in front of the power amplifier. This spread is easily sufficient to separate out the 157.52 nm line.

Ring Line Selector

Figure 16E:
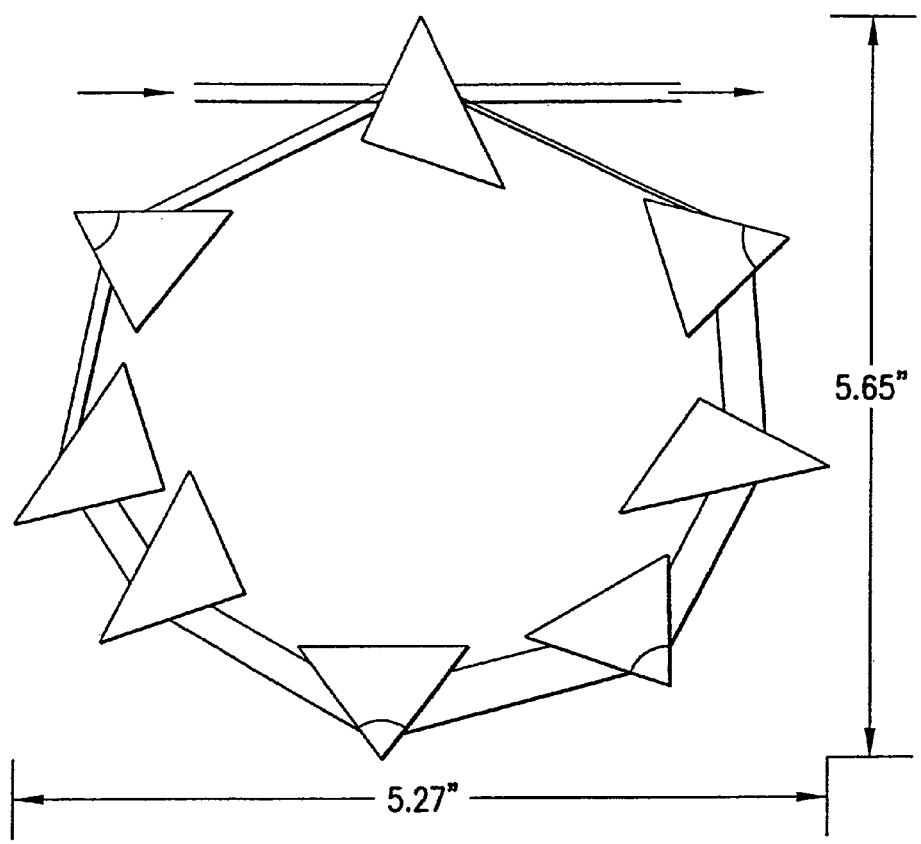

An alternate prism line selection unit is shown in FIG. 16E. This is a ring configuration. It can be inserted in the beam path without disturbing the beam direction. In this embodiment, the ring is comprised of four 45° apex angle prisms and four 65° angle prisms.

Lyot Filter

An alternate to the prism based line selector shown in FIG. 16A is a Lyot filter. This filter uses the dispersion of the birefringence of a non-isotropic crystalline material, such as $MgF_2$, to rotate the polarization of the light depending on the wavelength. By appropriate choice of the thickness of the crystal the total polarization rotation angle of the two VUV wavelengths can be made substantially different. Discrimination of these rotated waves can be achieved by polarization dependent optic elements, such as the Brewster windows of the $F_2$ laser's gas discharge chamber. A single Brewster window of $CaF_2$ material will show a 1:0.7 ratio of intensity transmission between p-polarized and s-polarized waves respectively. The losses for the s-polarized waves are due to reflections on the surfaces. Since the chamber has two windows these values have to be taken to the $4^{th}$ potency to give the correct full round trip ratio of 1:0.24. Optimum discrimination of one of the lines is achieved if the total polarization rotation angle on a double pass through the crystal is exactly 90 degrees. This will be achieved by adjusting the thickness of the crystal to the characteristic quarter wave plate thickness. However, the wavelength of the other line should not undergo such rotation, in fact the total polarization rotation at this wavelength should be a whole multiple of 180 degree (half wave plate) so that the discriminating elements would not affect the transmission of this wave. Thus, the combination of the dispersive birefringent crystal, the polarizing elements (Brewster windows) and the back mirror (for the second pass back through the crystal) suppresses one of the wavelengths while the other remains unaffected.

The advantages of this scheme are its inherent robustness, the ease of adjustment, the reduction of optical elements and the possibility to solely use anti-reflective coatings on the crystal for small (close to zero) incident angles.

FIG. 16C1 shows schematically a line selected F2 laser system with intra-cavity Lyot filter. The resonator is built of high reflective mirror 116A, the birefringent dispersive crystal 116B, the (chamber) Brewster windows 116C and 116D and the output coupling mirror 116E which is partially reflecting. The optical gain is generated within the gas discharge in chamber 116F.

FIG. 16C2 shows another design, which uses one or several additional Brewster elements 116G to increase the discrimination between both p- and s-polarization.

FIG. 16C3 shows an alternative design for the high reflecting mirror and the crystal. In fact, both elements can be combined applying the dielectric reflective coating 116H directly on the rear side of the crystal 116B, which will reduce the amount of optical elements required.

Line Selection At Rear of MO

The embodiment shown in FIG. 1 provides for line selection downstream of the master oscillator with no line selection within the resonant cavity of the master oscillator. Alternate embodiments could include line selection within the resonant cavity such as at the rear of the laser chamber 10A. This line selector could be in addition to or in lieu of the FIG. 16A line selector.

When a prism line selector is used inside the resonant cavity it is more important that optical losses in a selected polarization be minimized. A preferred design of such a line selector comprises five CaF or MgF prisms oriented such that entering and leaving the prisms are at Brewster angle (about 57.3 degrees). This permits use of prisms without anti-reflection coatings. A sketch showing this line selection approach is shown in FIG. 16. This arrangement includes five prisms 118A with apex angles equal to $2 \times (90° - 2_B)$ where $2_B$ is Brewster's angle. The reflection optic 118B is a half prism with a maximum reflection coating 118C on the rear side.

The novel features here are to avoid the need for an anti-reflection coating on the incidence face by using Brewster's angle (providing zero reflection coefficient for appropriately polarized laser) and placing the reflective coating directly on the rear surface of the optic.

Prism Output Coupler

The output coupler of gas discharge lasers configured as oscillators is typically a partially reflecting mirror which is usually a wedge shaped optical element with one surface oriented transverse to the beam path and coated to reflect a desired portion of the beam and transmit the remaining portion. The other surface is often coated with an anti-reflection coating and may be oriented as an angle other than transverse to the beam path so that any reflections from this surface is not returned to the gain region.

Figure 17:
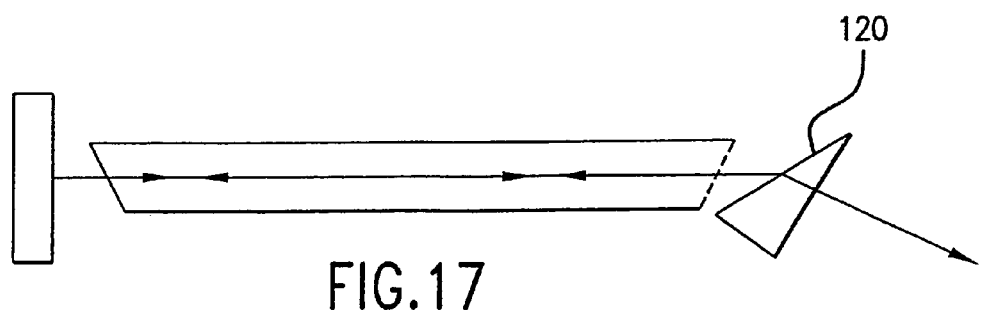
FIG. 17 shows a prism used as an output coupler.

Coated surfaces sometimes provide lifetime problems when used in these high intensity UV applications. A solution is shown in FIG. 17. In this case, the output coupler 120 is prism shaped. The front surface (closest to the gain region) is oriented for the lowest loss angle (for p-polarization) while the second surface is orthogonal to the refracted laser beam to provide the reflected beam for amplification. This design eliminates the need for an AR coating and also provides some additional spectral separation due to dispersions. For this $F_2$ application, the prism is comprised of $CaF_2$ with an apex angle of 32.7 degrees and an angle of incidence of 57.2 degrees. In this preferred embodiment, there is no coating on the second surface and the approximately 4.7 percent Fresnel reflection provides sufficient reflection for the master oscillator.

Beam Steering with Optical Element

In spite of efforts to maintain constant conditions in the beam path, many laser operations such as burst mode operation, such as those described above, produce transient conditions which in some cases cause significant transient steering of the output laser beam. This transient steering can be corrected with an active beam direction control system which includes a beam direction monitor and beam direction control mechanism. In a preferred embodiment the beam direction monitor is a split detector, also known as a bi-cell detector or segmented detector. This type of detector has two distinct photosensitive elements separated by a small gap. The ratio of the outputs of the two elements is a measure of the beam direction. The beam direction control mechanism can be a pivot mirror preferably in the line selection package 10C in FIG. 1. Alternatively, one of the prisms in the line selector unit shown in FIG. 16A could be pivoted. If all of the prisms in the selector unit are mounted on a prism plate, the plate itself could be pivoted. The driver producing the pivot preferably is a piezoelectric driver or it could be a voice coil or a stepper motor drive unit or any of other similar drive units. Controls for the direction control mechanism should preferably include a processor programmed with an appropriate feedback algorithm and also additional electronic control and software permitting operator adjustment of the beam direction.

Beam Steering Compensation with Purge Pressure

As indicated above, a small amount of beam steering in the beam path can result from operations such as burst mode operation commonly used in laser integrated circuit lithography. Even very minor changes in the beam direction can be extremely undesirable. As indicated above, techniques can be utilized to eliminate the causes of beam steering. Also, pivoting of optical elements such as prisms or mirrors could correct for unwanted changes in beam directions. Another approach is to correct for unwanted beam direction changes by controlling the purge gas pressure in portions of the beam path. In a preferred embodiment the purge pressure in the line selection package is controlled to compensate for beam direction changes. Applicants have determined that for the five-prism line selector shown in FIG. 16A. The output beam direction for this five-prism configuration is related to the purge gas pressure in the range of about 1 atm by the following factor: )N=15 milliradians per atmosphere. Preferably the beam direction is monitored by a split detector as discussed above and a feedback signal regulates the pressure in the LSP by controlling a purge gas flow valve. Another approach is to use a temperature sensor to provide a feedback signal.

Gas Control

The preferred embodiment of this invention has a gas control module as indicated in FIG. 1 and it is configured to fill each chamber with appropriate quantities of laser gas. Preferably appropriate controls and processor equipment is provided to maintain continuous flow of gas into each chamber so as to maintain laser gas concentrations constant or approximately constant at desired levels. This may be accomplished using techniques such as those described in U.S. Pat. No. 6,028,880 or U.S. Pat. No. 6,151,349 or U.S. Pat. No. 6,240,117 (of which are incorporated hereby reference).

Another technique for providing continuous flow of laser gas into the chambers which Applicants call its binary fill technique is to provide a number (such as 5) fill lines each successive line orificed to permit double the flow of the previous line with each line having a shut off valve. The lowest flow line is orificed to permit minimum equilibrium gas flow. Almost any desired flow rate can be achieved by selecting appropriate combinations of valves to be opened. Preferably a buffer tank is provided between the orificed lines and the laser gas source which is maintained at a pressure at about twice the pressure of the laser chambers.

Vertical Optical Table

In preferred embodiments the two chambers and the laser optics are mounted on a vertically oriented optical table. The table is preferably supported in the laser frame with a three-point kinematic mount. One preferred embodiment arrangement is shown in FIG. 1C1. Metal straps are provided on table 11 at locations A, B, and C where the table is mounted to the laser frame 4 (not shown in FIG. 1C1). A swivel joint is provided at location A which anchors the table but permits it to swivel. A ball and V-groove is provided at location B which restricts rotation in the plane of the bottom surface of the table and rotation in the plane of the table front surface. A ball and slot groove is provided at location C which restricts rotation around the A–B axis.

Laser Chambers

Four Kilo Hertz Operation

Preferred embodiments are designed to operate at pulse repetition rates of 4,000 pulses per second. Clearing the discharge region of discharge affected gas between pulses requires a gas flow between the electrodes 18A and 20A of up to about 67 m/s. To achieve these speeds, the diameter of tangential fan unit has been set at 5 inches (the length of the blade structure is 26 inches) and the rotational speed has been increased to about 3500 rpm. To achieve this performance the embodiment utilizes two motors which together deliver up to about 4 kw of drive power to the fan blade structure. At a pulse rate of 4000 Hz, the discharge will add about 12 kw of heat energy to the laser gas. To remove the heat produced by the discharge along with the heat added by the fan four separate water cooled finned heat exchanger units 58A are provided. The motors and the heat exchangers are described in detail below.

A preferred embodiment of the present invention utilizes four finned water cooled heat exchangers 58A shown generally in FIG. 4. Each of these heat exchangers is somewhat similar to the single heat exchangers shown at 58 in FIG. 1 having however substantial improvements.

Heat Exchanger Components

Figure 21A:
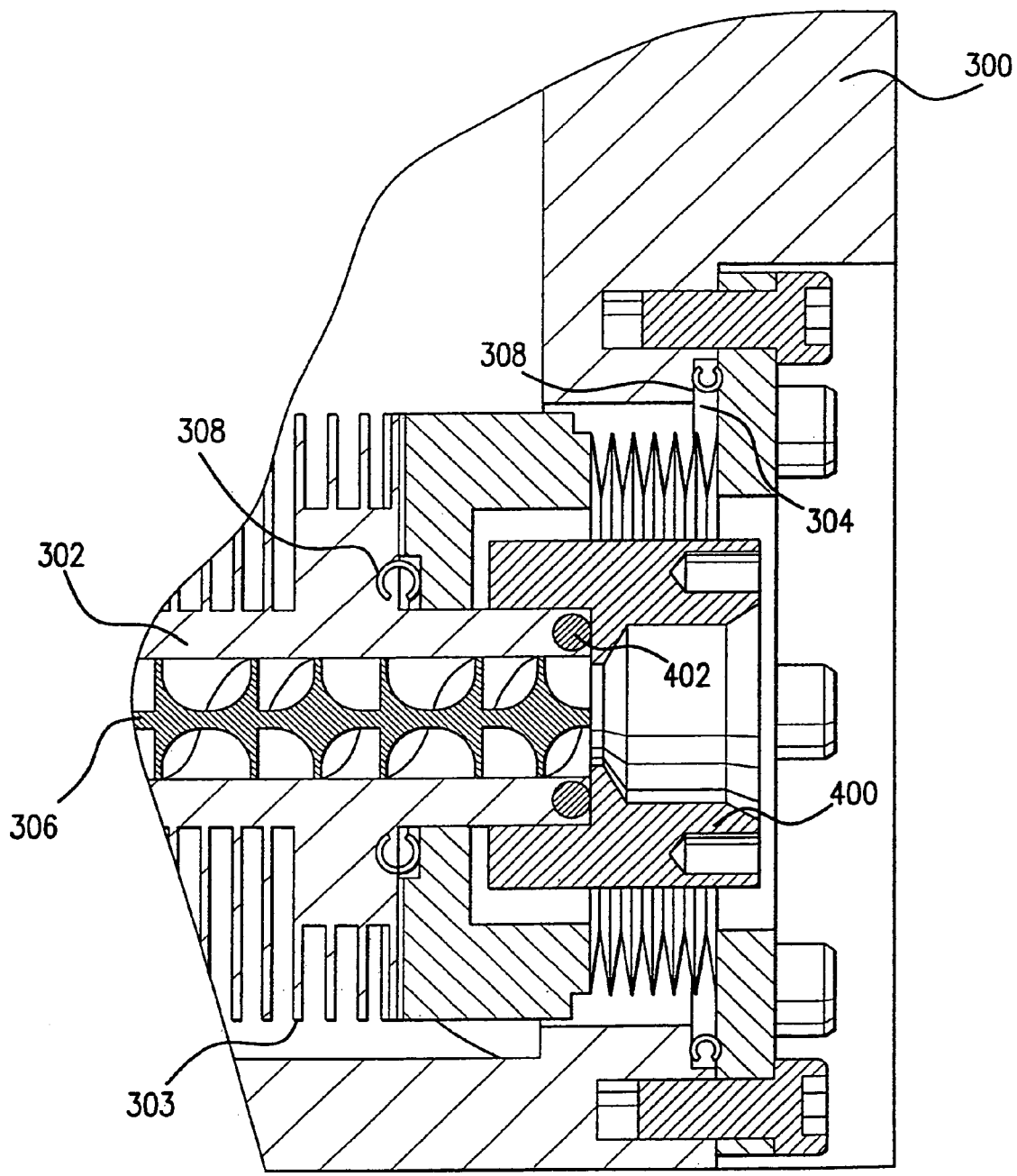

A cross sectional drawing of one of the heat exchangers is shown in FIG. 21. The middle section of the heat exchanger is cut out but both ends are shown. FIG. 21A shows an enlarged view of the end of the heat exchanger which accommodates thermal expansion and contraction.

The components of the heat exchanger includes a finned structure 302 which is machined from solid copper (CU 11000) and contains twelve fins 303 per inch. Water flow is through an axial passage having a bore diameter of 0.33 inch. A plastic turbulator 306 located in the axial passage prevents stratification of water in the passage and prevents the formation of a hot boundary layer on the inside surface of the passage. A flexible flange unit 304 is a welded unit comprised of inner flange 304A, bellows 304B and outer flange 304C. The heat exchanger unit includes three c-seals 308 to seal the water flowing in the heat exchanger from the laser gas. Bellows 304B permits expansion and contraction of the heat exchanger relative to the chamber. A double port nut 400 connects the heat exchanger passage to a standard 5/16 inch positional elbow pipe fitting which in turn is connected to a water source. O-ring 402 provides a seal between nut 400 and finned structure 302. In preferred embodiments cooling flow direction in two of the units is opposite the other two minimizing axial temperature gradients.

The Turbulator

In a preferred embodiment, the turbulator is comprised of four off-the-shelf, long in-line mixing elements which are typically used to mix epoxy components and are available from 3M Corporation (Static Mixer, Part No. 06-D1229-00). The in-line mixers are shown at 306 in FIGS. 21 and 21A. The in-line mixers force the water to flow along a generally helical path which reverses its clockwise direction about every pitch distance (which is 0.3 inch). The turbulator substantially improves heat exchanger performance. Tests by Applicants have shown that the addition of the turbulator reduces the required water flow by a factor of roughly 5 to maintain comparable gas temperature conditions.

Flow Path and Acoustic Effects

In this preferred embodiment, gas flow into and out of the discharge region has been greatly improved over prior art laser chambers. The region upstream of the discharge and adjacent to the exit of the cross flow fan is shaped to form a smooth transition from a large cross section to the small cross section of the discharge. The cross section of the region directly downstream of the discharge increases smoothly for the small value of the discharge to a much greater value before the gas is forced to turn 90° into the heat exchangers. This arrangement minimizes the pressure drop and associated turbulence caused by high velocity flow over sharp steps. Providing this smooth gradually expanding flow path in the direction away from the laser also reduces adverse acoustic effects resulting from acoustic waves from a pulse reflecting back to the discharge region at the time of a subsequent pulse. Techniques for reducing these effects are described in U.S. Pat. No. 6,212,211 and U.S. Pat. No. 6,317,447 both of which are incorporated herein by reference. The time required for an acoustic wave to return to the discharge region is dependent to a significant extent. The result is reflection from a particular surface could be a problem only at a particular combination of repetition rate and gas temperature. If this reflecting surface cannot be easily eliminated an alternate solution could be to avoid operation at the problem temperature-repetition rate combination. One solution could be to program the laser controller to automatically change the gas temperature as necessary to avoid operation at a problem combination.

Blower Motors and Large Blower

This first preferred embodiment of the present invention provides a large tangential fan driven by dual motors for circulating the laser gas. This preferred arrangement as shown in FIG. 24 provides a gas flow between the electrode of 67 m/sec which is enough to clear a space of about 1.7 cm in the discharge region between 4,000 Hz pulses.

A cross section blade structure of the fan is shown as 64A in FIG. 4. A prospective view is shown in FIG. 18A. The blade structure has a 5 inch diameter and is machined out of a solid aluminum alloy 6061-T6 bar stock. The individual blade in each section is slightly offset from the adjacent section as shown in FIG. 18A. The offset is preferably made non-uniform so as to avoid any pressure wave front creation. As an alternative, the individual blades can be slightly angled with respect to the blade axis (again to avoid creation of pressure wave fronts). The blades also have sharp leading edges to reduce acoustic reflections from the edge of the blade facing the discharge region.

Figure 18:
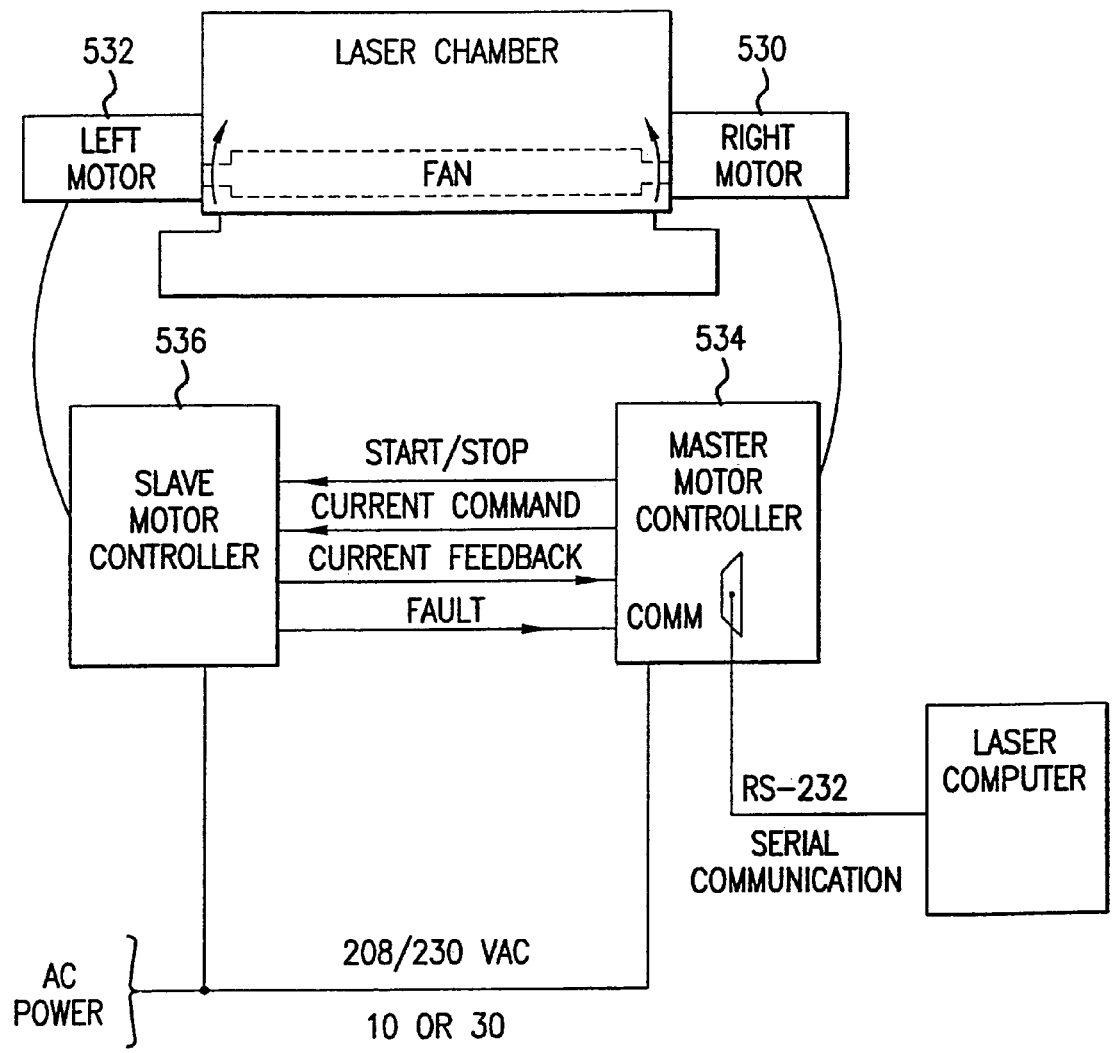
FIG. 18 shows a fan motor drive arrangement.
Figure 18A:
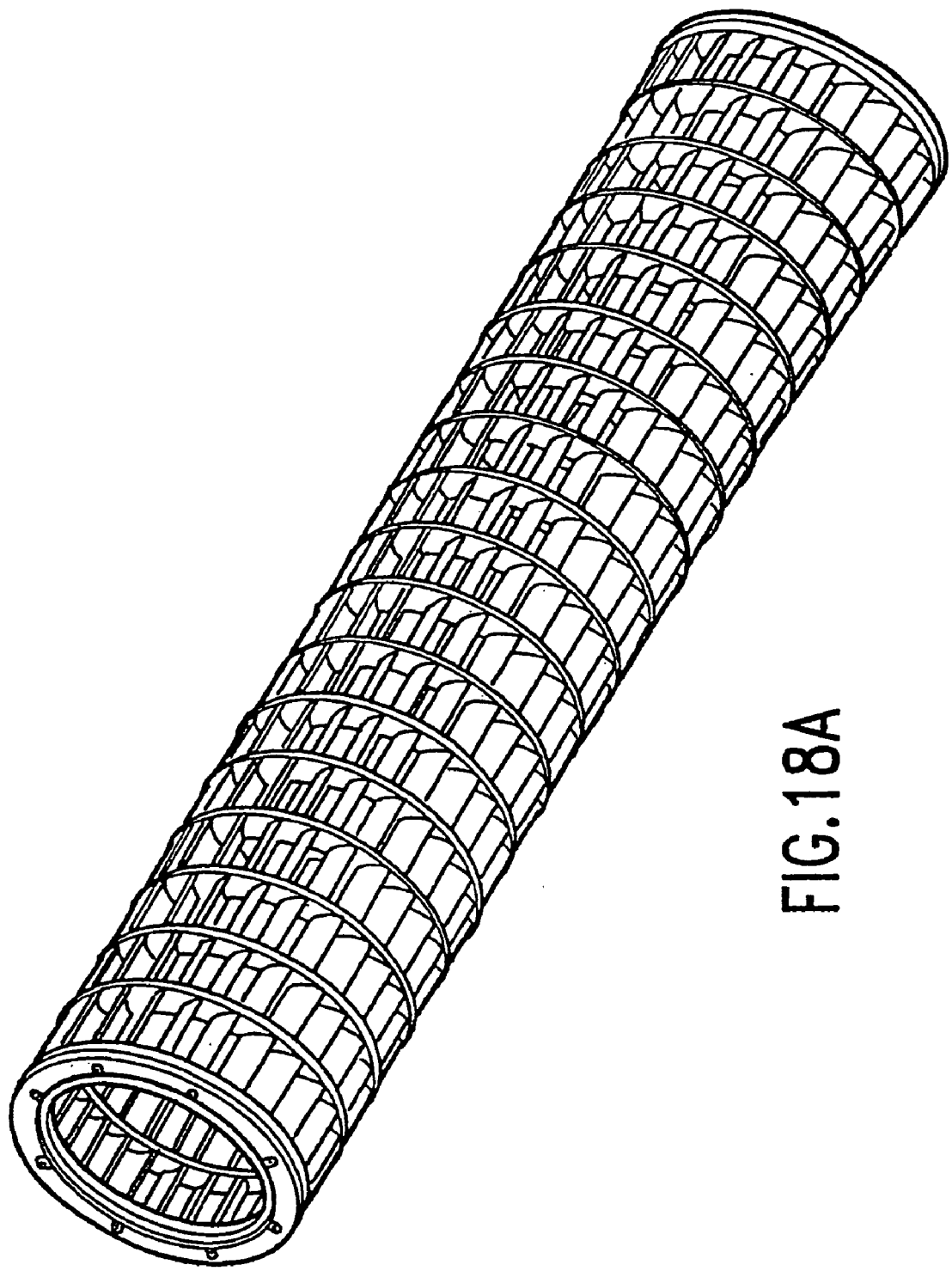
FIG. 18A show a preferred fan blade.

This embodiment as shown in FIG. 18 utilizes two 3 phase brushless DC motors each with a magnetic rotor contained within a metallic pressure cup which separates the stator portion of the motors from the laser gas environment as described in U.S. Pat. No. 4,950,840. In this embodiment, the pressure cup is thin-walled nickel alloy 400, 0.016 inch thick which functions as the laser gas barrier. The two motors 530 and 532 drive the same shaft and are programmed to rotate in opposite directions. Both motors are sensorless motors (i.e., they operate without position sensors). Right motor controller 534 which controls right motor 530 functions as a master controller controlling slave motor controller 536 via analog and digital signals to institute start/stop, current command, current feedback, etc. Communication with the laser controller 24A is via a RS-232 serial port into master controller 534.

Purge System

This first embodiment of the present invention includes an ultra-pure $N_2$ purge system which provides greatly improved performance and substantially increases component lifetime.

FIG. 19 is a block diagram showing important features of a, first preferred embodiment the present invention. Five excimer laser components which are purged by nitrogen gas in this embodiment of the present system are LNP 2P, high voltage components 4P mounted on laser chamber 6P, high voltage cable 8P connecting the high voltage components 4P with upstream pulse power components 10P, output coupler 12P and wavemeter 14P. Each of the components 2P, 4P, 8P, 12P, and 14P are contained in sealed containers or chambers each having only two ports an $N_2$ inlet port and an $N_2$ outlet port. An $N_2$ source 16P which typically is a large $N_2$ tank (typically maintained at liquid nitrogen temperatures) at a integrated circuit fabrication plant but may be a relatively small bottle of $N_2$. $N_2$ source gas exits $N_2$ source 16P, passes into $N_2$ purge module 17P and through $N_2$ filter 18P to distribution panel 20P containing flow control valves for controlling the $N_2$ flow to the purged components. With respect to each component the purge flow is directed back to the module 17P to a flow monitor unit 22P where the flow returning from each of the purge units is monitored and in case the flow monitored is less than a predetermined value an alarm (not shown) is activated.

Figure 19A:
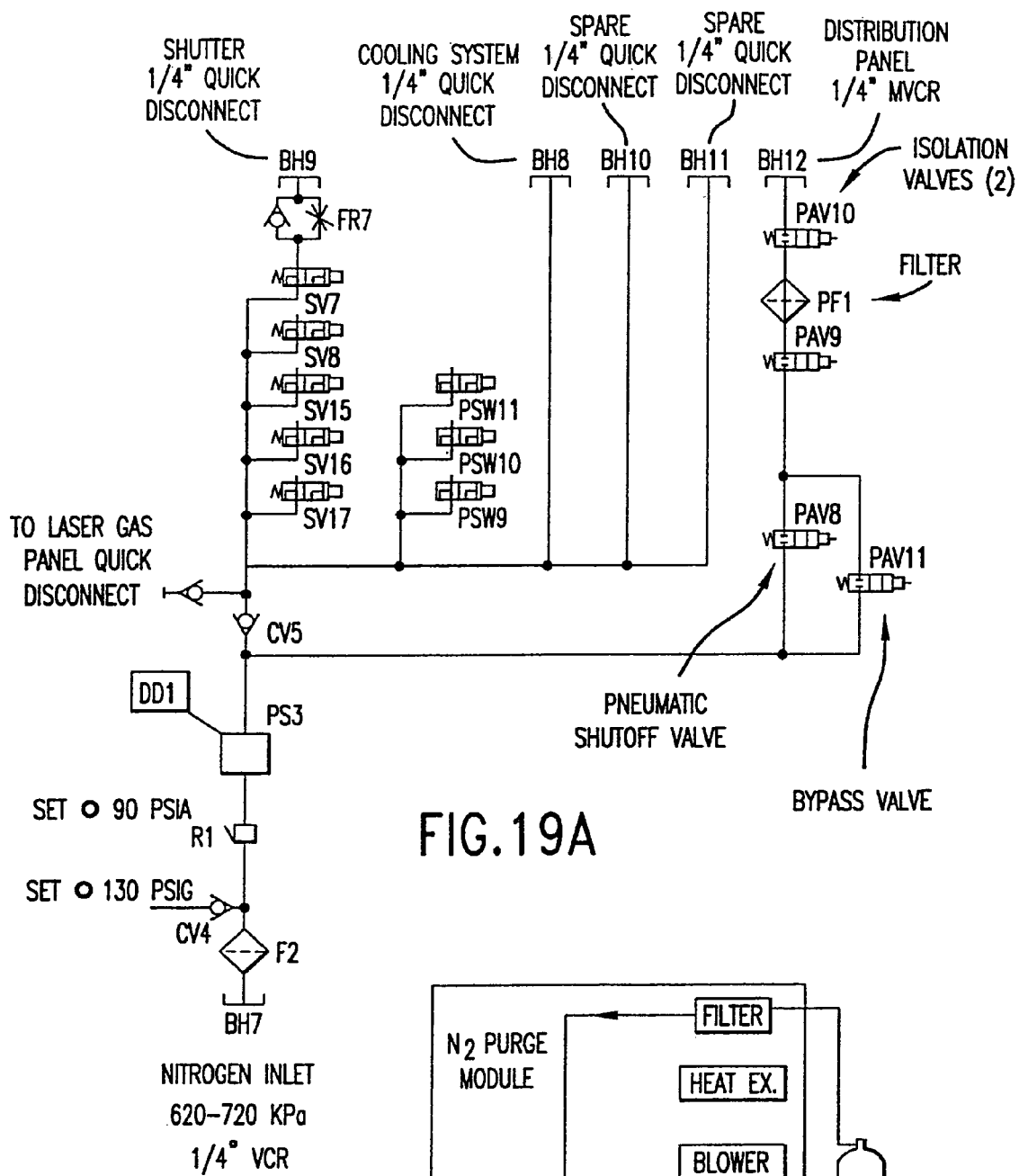

FIG. 19A is a line diagram showing specific components of this preferred embodiment including some additional $N_2$ features not specifically related to the purge features of the present invention.

$N_2$ Filter

An important feature of the present invention is the inclusion of $N_2$ filter 18. In the past, makers of excimer lasers for integrated circuit lithography have believed that a filter for $N_2$ purge gas was not necessary since $N_2$ gas specification for commercially available $N_2$ is almost always good enough so that gas meeting specifications is clean enough. Applicants have discovered, however, that occasionally the source gas may be out of specification or the $N_2$ lines leading to the purge system may contain contamination. Also lines can become contaminated during maintenance or operation procedures. Applicants have determined that the cost of the filter is very good insurance against an even low probability of contamination caused damage.

A preferred $N_2$ filter is Model 500K Inert Gas Purifier available from Aeronex, Inc. with offices in San Diego, Calif. This filter removes $H_2O$, $O_2$, CO, $CO_2$, $H_2$ and non-methane hydrocarbons to sub-parts-per-billion levels. It removes 99.9999999 percent of all particulate 0.003 microns or larger.

Flow Monitors

A flow monitor in unit 22 is provided for each of the five purged components. These are commercially available units having an alarm feature for low flow.

Piping

Preferably all piping is comprised of stainless steel (316SST) with electro polished interior. Certain types of plastic tubing, comprised of PFA 400 or ultra-high purity Teflon, may be also used.

Recirculation and Clean Up

Figure 19B:
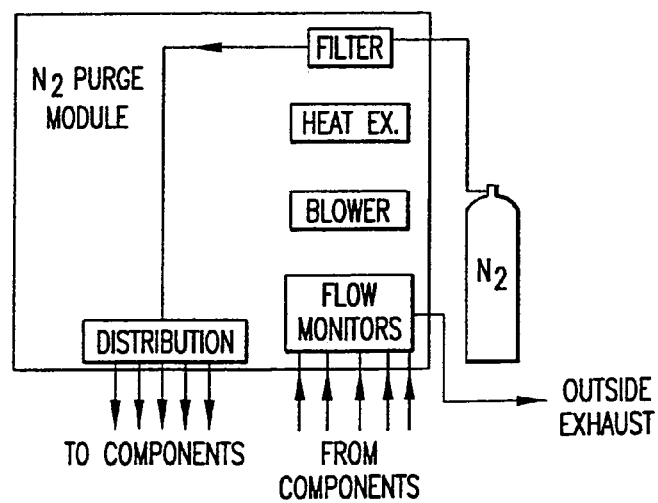

A portion or all of the purge gas could be recirculated as shown in FIG. 19B. In this case, a blower and a water cooled heat exchanger is added to the purge module. For example, purge flow from the optical components could be recirculated and purge flow from the electrical components could be exhausted or a portion of the combined flow could be exhausted. Also, an ozone clean-up element could be added to remove ozone from the enclosed beam path. This could include a filter made of one of several materials reactive with $O_3$.

Helium Purge of LSP

In preferred embodiments the line selection package is purged with helium and the remainder of the beam path is purged with nitrogen. Helium has a much lower index of refraction than nitrogen so thermal effects in the LNP are minimized with the use of helium. However, helium is about 1000 times more expensive than nitrogen. Also, control of beam steering by charging purge pressure would be more difficult with helium.

Improved Seals

Preferred techniques for enclosing the beam path are described in U.S. patent application Ser. No.10/000,991, filed Nov. 14, 2001, entitled "Gas Discharge Laser With Improved Beam Path" which is incorporated by reference herein. FIGS. 19F 1, 2, 3, 4 and 5 show easy sealing bellows seal used to provide seals between the laser modules but allowing quick easy decoupling of the modules to permit quick module replacement.

Easy Sealing Bellows Seal

Applicants have developed an easy sealing bellows seals to permit quick sealing of the beam path to a vacuum compatible seal when reinstalling laser modules in the beam path. The reader should note that although the seals provide vacuum quality seals of the respective sealed portions of the beam path, the path is not operated as a vacuum but typically at pressures slightly in excess of atmospheric.

Fast sealing is important since there is a great need that these modules be replaceable within a few minutes. The basic design of the easy sealing bellows seal is shown in FIGS. 8A–E. The easy sealing bellows seals are a four part seal. These four paths are (1) bellows part 93A shown in FIG. 8A, flange part 93B shown in FIGS. 8A and 8B metal c seal ring 93C shown in FIG. 8A and a first compression ring clamp 93D shown in FIG. 8C. An alternate second compression ring clamp is shown in FIG. 8E. An easy seal bellows is shown assembled in FIG. 8D. Two additional metal C-seals may be used to seal flange part 93B to a first laser part 93E and to seal bellows portion 93A to a second laser part 93F. These additional seals are placed in slots 102 and 104. Flange part 93B is sealed against the first laser part with screws through counter sunk holes 106 and which are tightened with an allen wrench through holes 108.

Flange part 93B comprises tapered flange 120. This flange has a 20° taper as shown in FIG. 8A. Flange 114 also has a 20° taper. Compression clamp 93D is then opened up by unscrewing finger bolt 118 and placed around tapered flanges 120 and 114. Compression clamp 93D has hinge section 122 and a bolt section 124. It has a tapered slotted inner circumference matching the type of flanges 114 and 120. The diameter of the slot with bolt 118 fully inserted is slightly smaller than the matching slanted surfaces of flanges 114 and 120 so that as bolt 118 is tightened the two flanges are forced together compressing c seal 93C between them to produce a vacuum compatible seal. Applicants have determined that 400 pounds of compression is preferred to assure the desired vacuum seal. This requires a torque of about 40 inch-pounds applied to the handle of bolt 118 of the first compression ring clamp. In this preferred embodiment, the handle is only 1-inch long so a speed wrench (or similar tool) would be needed by most technicians to provide the 40 inch pounds. If a two inch handle is provided the seal could be made with finger force. The second compression ring clamp shown in FIG. 8E forces the two tapered flanges together when curved lever arm 119 is pushed into position against the circumference of the ring. The clamp is opened by rotating the arm out from the ring circumference and then the two halves of the ring clamp can be separated. Applicants have estimated that a 40 pound force applied to the end of lever arm 119 results in a compressive force of about 400 pounds on C-seal 93C. This clamp design is based on the design of commercially available clamps known as "pull action toggle clamps".

Important advantages of this seal system are:
(1) The time to make the seal is insignificant (about 1 to 2 minutes);
(2) An excellent vacuum seal is produced;
(3) Substantial vibrational coupling between the chamber and optical components is avoided; and
(4) The seal is inexpensive compared to most other vacuum sealing techniques.

The seal is made between flange part 93B and 93A with metal c seal 93C sandwiched in between the two parts as indicated in FIG. 8A using compression ring clamp 93D as shown in FIG. 8D. The metal seal fits into slot 110. The seal in these embodiments are made slightly oval to fit in the circular slot 110. The longer diameter of the c seal ring is 1.946 inches and the shorter diameter is 1.84 inches. Spring force in the oval shaped c seal ring produces forces against the edge of slot 110 which prevents the c seal ring from falling out during assembly. Bellows part 93A comprises circular ridge 112 which protects seal ring 93C from being scratched by part 93B while the two parts are slid against each other during assembly.

Transverse Purge Gas Flow

Applicants have discovered through experiments with F2 lasers at high repetition rates, such as 4000 Hz, several milli Joule per pulse beam will suffer divergence and deflectance transients due to beam interaction with the purge gas. Applicants have also determined that these effects can be minimized by producing purge flows transverse to the beam path. Applicants have identified several techniques for doing this. Four such techniques are shown in FIGS. 19C1, 19C2, 19C3, and 19C4. FIGS. 19C1 and 2 show baffles in the beam path which encourage transverse purge flow. FIG. 19C3 show a fan in the purge line for recirculating the purge gas and in 19C4 the purge flow is directed by purge nozzles transverse to the beam path.

Alignment Laser

Providing a confined vacuum type purge path complicates alignment of the laser optics. In prior art systems, the purge path had to be broken to insert a small visible light alignment laser. In preferred embodiments, a small visible light laser may be included as a permanent part of the beam path which is very useful during maintenance operations. Preferably, the alignment laser is a helium-neon laser or small diode laser mounted on the rear side of high reflectance mirror 10D which for this design should be comprised of a CaF plate having a dielectric reflecting coating designed to reflect a very high portion of 157 nm ultraviolet light but transmit a high portion of visible light. The alignment laser can then be used for alignment of the entire beam path through the MO, the PA and the beam stretcher, all without breaking the purge path. (The reader should understand that any line selection optics will alter the direction of the alignment laser. The line selection optics could be removed to align the rest of the system or the direction of the alignment laser beam could be adjusted to take into account the line selection optics.)

Advantages of the Vacuum Quality Beam Path

The vacuum quality purge system described herein represents a major improvement in long term excimer laser performance especially for $F_2$ lasers. Contamination problems are basically eliminated which has resulted in substantial increases in component lifetimes and beam quality. In addition, since leakage has been eliminated except through outlet ports the flow can be controlled to desired values which has the effect of reducing $N_2$ requirements by about 50 percent.

Sealed Shutter Unit with Power Meter

This first preferred embodiment includes a sealed shutter unit 500 with a built in power meter as shown in FIGS. 20, 20A and 20B. With this important improvement, the shutter has two functions, first, as a shutter to block the laser beam and, second, as a full beam power meter for monitoring beam power whenever a measurement is needed.

FIG. 20 is a top view showing the main components of the shutter unit. These are shutter 502, beam dump 504 and power meter 506. The path of the laser output beam with the shutter in the closed position is shown at 510 in FIG. 20. The path with the beam open is shown at 512. The shutter active surface of beam stop element 516 is at 45° with the direction of the beam exiting the chamber and when the shutter is closed the beam is both absorbed in the shutter surface and reflected to beam dump 504. Both the beam dump active surface and the shutter active surface is chrome plated for high absorption of the laser beam. In this embodiment, beam stop element 516 is mounted on flexible spring steel arm 518. The shutter is opened by applying a current to coil 514 as shown in FIG. 20B which pulls flexible arm 518 and beam stop element 516 to the coil removing beam stop element 516 from the path of the output laser beam. The shutter is closed by stopping the current flow through coil 514 which permits permanent magnets 520 to pull beam stop element 516 and flexible arm 518 back into the close position. In a preferred embodiment the current flow is carefully tailored to produce an easy transmit of the element and arm between the open and close positions.

Power meter 506 is operated in a similar fashion to place pyroelectric photo detector in the path of the output laser beam as shown in FIGS. 20 and 20A. In this case, coil 520 and magnets 522 pull detector unit 524 and its flexible arm 526 into and out of the beam path for output power measurements. This power meter can operate with the shutter open and with the shutter closed. Current to the coil is as with the shutter controlled to provide easy transit of unit 524 into and out of the beam path.

Improved Polarization with Chamber Windows Angle Greater Than Brewster

Prior art chamber windows are often placed at Brewster's angle which results in about 100% transmission of the polarization direction at about 58 percent in the p-polarization direction. In other prior art designs, the windows are placed at bout 45 degrees in which case transmission of the s-polarization is a little less and the p a little more than the above values.

For $F_2$ lasers, Applicants have determined that with the chamber windows at somewhat less than Brewster's, there is substantial competition in the gain region between the s and p polarization. This is because there typically is very high gain in the discharge region of the $F_2$ lasers compared to prior art KrF and ArF lasers. This competition is not desirable because in most applications light at s-polarization is not useful and is typically lost as undesirable heat. Thus, there is a need to minimize the amount of s-polarization produced in the laser.

A preferred technique which can be relatively easily accomplished is to increase the angle of incidence of the chamber windows substantially above the Brewster's angle. For example, at Brewster's angle for a 157 nm $F_2$ beam about 100% of the p-polarization is transmitted and about 83% of the s-polarization is transmitted. If we increase the angle of incident to 64° the p-polarization transmission is reduced to about 99% but only 76% of the s-polarization is transmitted. Since in the master oscillator the light output from the gain region has made about two passes through each of the two windows (for 4 window passes and 2 surfaces for each window) the ratio of the two polarizations in the output beam (assuming 64° window angles) is:

$$\text{Polarization Extinction Ratio} = \frac{1}{1+\left(\frac{I_s}{I_p}\right)^8} = \frac{1}{1+\left(\frac{0.76}{0.99}\right)^8} = 89\%$$

Applicants tests with 47° windows about 72% of the light is p-polarization and 28% at s-polarization.

By changing the angle of the windows to 64° and adding an additional window at 64° in front of the high reflection mirror 10D in FIG. 1 the percent of s-polarization in the output beam is reduced to about 4% and the remaining 96% of the light is at p-polarization.

Various modifications may be made to the present invention without altering its scope. Those skilled in the art will recognize many other possible variations. For example, the pulse power circuit could be a common circuit up to the output of pulse transformer 56 as shown in FIG. 5. This approach provides for a further reduction in jitter as explained in U.S. patent application Ser. No. 09/848,043 which is incorporated herein by reference. FIG. 3B of that patent application showing the input and output to the pulse transformer is included herein as FIG. 13 for the convenience of the reader. Other heat exchanger designs should be obvious modifications to the one configuration shown herein. For example, all four units could be combined into a single unit. There could be significant advantages to using much larger fins on the heat exchanger to moderate the effects of rapid changes in gas temperature which occurs as a result of burst mode operation of the laser. The reader should understand that at extremely high pulse rates the feedback control on pulse energy does not necessarily have to be fast enough to control the pulse energy of a particular pulse using the immediately preceding pulse. For example, control techniques could be provided where measured pulse energy for a particular pulse is used in the control of the second or third following pulse. Many other layout configurations other than the one shown in FIG. 1 could be used. For example, the chambers could be mounted side-by-side or with the PA on the bottom. Also, the second laser unit could be configured as a slave oscillator by including an output coupler such as a partially reflecting mirror. Other variations are possible. Fans other than the tangential fans could be used. This may be required at repetition rates much greater than 4 kHz. The fans and the heat exchanger could be located outside the discharge chambers. Pulse timing techniques described in U.S. patent application Ser. No. 09/837,035 (incorporated by reference herein) could also be utilized. Line selection techniques other than the five-prism design described above could be used. For example, the strong line could be selected using 3, 4 or 6 prisms and applying the design techniques discussed above. Measurement of the bandwidth with precision may be desired. This could be done with the use of an etalon having a smaller free spectral range than the etalons described above. Other techniques well known could be adapted for use to precisely measure the bandwidth. Accordingly, the above disclosure is not intended to be limiting and the scope of the invention should be determined by the appended claims and their legal equivalents.

We claim:

1. A very narrow band two chamber high repetition rate $F_2$ gas discharge laser system comprising:
  A) a first laser unit comprising:
    1) a first discharge chamber containing;
      a) a first laser gas
      b) a first pair of elongated spaced apart electrodes defining a first discharge region,
    2) a first fan producing sufficient gas movement of said first laser gas in said first discharge region to clear from said first discharge region, following each gas discharge, substantially all discharge produced ions prior to a next gas discharge when operating at a repetition rate in the range of 4,000 gas discharges per second or greater,
    3) a first heat exchanger system removing heat energy from said first laser gas,
  B) a line selection unit minimizing energy outside of a single selected line spectrum,
  C) a second laser unit comprising:
    1) a second discharge chamber containing:
      a) a second laser gas,
      b) a second pair of elongated spaced apart electrodes defining a second discharge region
    2) a second fan for producing sufficient gas movement of said second laser gas in said second discharge region to clear from said second discharge region, following each gas discharge, substantially all discharge produced ions prior to a next gas discharge when operating at a repetition rate in the range of 4,000 gas discharges per second or greater,
    3) a second heat exchanger system removing heat energy from said second laser gas,
  D) a pulse power system configured to provide electrical pulses to said first pair of electrodes and to said second pair of electrodes sufficient to produce laser output pulses at rates of about 4,000 laser output pulses per second with precisely controlled laser output pulse energies in excess of about 5 mJ,
  E) a laser beam measurement and control system for measuring the laser output pulse energy of laser output pulses produced by said two chamber laser system and controlling said laser output pulses in a feedback control arrangement, and wherein output laser beams from said first laser unit are utilized as a seed beam for seeding said second laser unit.

2. A laser system as in claim 1 wherein said first laser unit is configured as a master oscillator and said second laser unit is configured as a power amplifier.

3. A laser system as in claim 2 wherein said first laser gas comprises fluorine and neon.

4. A laser system as in claim 3 wherein said first and second laser gas comprises fluorine and a buffer gas chosen from a group consisting of neon, helium or a mixture of neon and helium.

5. A laser system as in claim 3 wherein said power amplifier provides a single beam pass through the second discharge region.

6. A laser system as in claim 2 wherein said power amplifier is provides a plurality of passes through the second discharge region.

7. A laser system as in claim 2 wherein said first laser gas comprises fluorine and helium.

8. A laser as in claim 2 wherein said master oscillator comprises optical components providing a resonant path making two passes through said first discharge region.

9. A laser as in claim 2 wherein said master oscillator comprises optical components providing a resonant path making two passes through said first discharge region and wherein said power amplifier comprises optical components providing a plurality of beam passes through the second discharge region.

10. A laser as in claim 2 and wherein first and second said chambers each comprises a vane structure downstream of said discharge region normalizing gas velocity downstream of said discharge region.

11. A laser as in claim 1 wherein said first fan and said second fan each are tangential fans and each comprises a shaft driven by two brushless DC motors.

12. A laser as in claim 11 wherein said motors are water cooled motors.

13. A laser as in claim 11 wherein each of said motors comprise a stator and each of said motors comprise a magnetic rotor contained in a pressure cup separating a said stator from said laser gas.

14. A laser as in claim 11 wherein said motors are sensorless motors and further comprising a master motor controller for controlling one of said motors and a slave motor controller for controlling the other motor.

15. A laser as in claim 11 wherein each of said tangential fans comprise blades which are angled with respect to said shaft.

16. A laser as in claim 2 and further comprising a discharge timing controller triggering discharges in said power amplifier to occur between 20 and 60 ns after discharges in said master oscillator.

17. A laser as in claim 2 and further comprising a discharge controller programmed to cause in some circumstances discharges so timed to avoid any significant output pulse energy.

18. A laser as in claim 17 wherein said controller in said some circumstances is programmed to cause discharge in said power amplifier at least 20 ns prior to discharge in said master oscillator.

19. A laser system as in claim 1 and further comprising an optical table supporting resonant cavity optics of said first laser unit independent of said first discharge chamber.

20. A laser system as in claim 19 wherein said optical table is generally U-shaped and defines a U-cavity and wherein said first discharge chamber is mounted within the U-cavity.

21. A laser as in claim 1 and further comprising a vertically mounted optical table with said first and second discharge chambers mounted on said vertical optical table.

22. A laser system as in claim 1 wherein each of said first and second laser chambers define a gas flow path with a gradually increasing cross section downstream of said electrodes to permit recovery of a large percentage of static pressure drop occurring in the discharge regions.

23. A laser as in claim 1 wherein said first and second fans are each tangential fans each comprising a blade structure machined from a single piece of aluminum stock.

24. A laser as in claim 23 wherein said blade structure has an outside diameter of about five inches.

25. A laser as in claim 24 wherein said blade structure comprises blade elements having sharp leading edges.

26. A laser as in claim 1 wherein each heat exchanger system is water cooled.

27. A laser as in claim 26 wherein each heat exchanger system comprises at least four separate water cooled heat exchangers.

28. A laser as in claim 26 wherein each heat exchanger system comprises at least one heat exchanger having a tubular water flow passage wherein at least one turbulator is located in said path.

29. A laser as in claim 28 wherein each of said four heat exchangers comprise a tubular water flow passage containing a turbulator.

30. A laser as in claim 1 wherein said pulse power system comprise water cooled electrical components.

31. A laser as in claim 30 wherein at least one of said water cooled components is a component operated at high voltages in excess of 12,000 volts.

32. A laser as in claim 31 wherein said high voltage is isolated from ground using an inductor through which cooling water flows.

33. A laser as in claim 1 wherein said pulse power system comprises a first charging capacitor bank and a first pulse compression circuit providing electrical pulses to said first pair of electrodes and a second charging capacitor bank and a second pulse compression circuit providing electrical pulses to said second pair of electrodes and a resonant charging system charging in parallel said first and second charging capacitor banks to a precisely controlled voltage.

34. A laser as in claim 33 wherein said resonance charging system comprises a De-Qing circuit.

35. A laser as in claim 33 wherein said resonance charging system comprises a bleed circuit.

36. A laser as in claim 33 wherein said resonant charging system comprises a De-Qing circuit and a bleed circuit.

37. A laser as in claim 1 wherein said pulse power system comprises a charging system comprised of at least three power supplies arranged in parallel.

38. A laser as in claim 1 wherein said line selection unit is located downstream of said master oscillator.

39. A laser as in claim 38 wherein said line selection unit comprises a plurality of prisms.

40. A laser as in claim 39 wherein said plurality of prisms is five prisms.

41. A laser as in claim 39 wherein said plurality of prisms are arranged in a loop so as to cause laser beams from the first laser unit to make a 360° turn prior to entering the second laser unit.

42. A laser as in claim 1 and further comprising a visible light alignment laser.

43. A laser as in claim 1 wherein said line selection unit comprises a Lyot filter.

44. A laser as in claim 1 wherein said first discharge chamber and said second discharge chamber comprise chamber windows positioned so that the incident angles of laser beams on said windows are all greater than Brewster's angle.

45. A laser as in claim 1 and further comprising a beam steering means for steering laser beams produced in said first laser unit.

46. A laser as in claim 45 wherein said steering means comprises a means for pivoting an optical element.

47. A laser as in claim 45 wherein said beam steering means comprises a means for adjusting the pressure in said line selection unit.

48. A laser as in claim 1 wherein said laser system comprises prism output coupler in part defining a resonant cavity for said first laser unit, said prism output coupler comprising two surfaces, a first surface oriented at a low loss angle for p-polarization and a second surface located orthogonal to laser beams from said first laser unit.

49. A laser as in claim 1 and further comprising: A) a first temperature monitor for monitoring gas temperature in said 50. A laser as in claim 1 and further comprising: A) a second temperature monitor for monitoring gas temperature in said second discharge chamber, B) a second gas temperature control system where gas temperature control system comprises a control algorithm for adjusting gas temperature to avoid adverse acoustic effects resulting from reflected acoustic waves.

51. A laser as in claim 1 and further comprising a nitrogen filter.

52. A laser as in claim 1 and further comprising a nitrogen purge system comprising a purge module comprising flow monitors said laser also comprising purge exhaust tubes for transporting exhaust purge gas from said laser.

53. A laser system as in claim 52 wherein said first delay path comprises four focusing mirrors.

54. A laser system as in claim 53 and further comprising said second delay path created by a second beam splitter located in said first delay path.

55. A laser as in claim 1 and further comprising a shutter unit comprising an electrically operated shutter and a power meter which can be positioned in a laser output beam path with a command signal.

56. A laser as in claim 1 and further comprising a beam enclosure system comprising: A) at least one beam seal said beam seals comprising a metal bellows, and B) a purge means for purging said beam enclosure with a purge gas.

57. A laser as in claim 56 wherein said beam enclosure means comprise a flow directing means for producing purge flow transverse to laser beams produced in said second laser unit.

58. A laser as in claim 56 wherein said at least one beam seal permits easy replacement of said laser chamber.

59. A laser as in claim 56 wherein said at least one beam seal contains no elastomer, provides vibration isolation from said chamber, provides beam train isolation from atmospheric gases and permits unrestricted replacement of said laser chamber without disturbance of said line selection unit.

60. A laser as in claim 56 wherein said at least one beam seal is vacuum compatible.

61. A laser as in claim 60 wherein said at least one beam seal is a plurality of beam seals and said plurality of said seals are easy sealing bellows seals easily removed by hand.

62. A laser as in claim 1 wherein said measurement and control system comprises a primary beam splitter for splitting off a small percentage of the laser output beam from said second laser unit and an optical means for directing a portion of said small percentage to a pulse energy detector and an isolation means for isolating a volume bounded at least in part by said primary beam splitter and a window of said pulse energy detector from other portions of said measurement and control system to define an isolated region.

63. A laser system as in claim 1 wherein said system is operates either of a KrF laser system, un ArF laser system or an $F_2$ laser system with minor modifications.

64. A laser system as in claim 1 wherein substantially all components are contained in a laser enclosure but said system comprises an AC/DC module physically separate from the enclosure.

65. A laser as in claim 64 and further comprising a purge means for purging said isolated region with a purge gas.

66. A laser system as in claim 1 wherein said pulse power system comprises a master oscillator charging capacitor bank and a power amplifier charging capacitor bank and a resonant charger configured to charge both charging capacitor banks in parallel.

67. A laser as in claim 66 wherein said pulse power system comprises a power supply configured to furnish at least 2000V supply to said resonant charger.

68. A laser as in claim 1 and further comprising a gas control system controlling $F_2$ concentrations in said first laser gas to control master oscillator beam parameters.

69. A laser as in claim 1 and further comprising a gas control system controlling laser gas pressure in said first laser gas to control master oscillator beam parameters.

70. A laser as in claim 1 and further comprising a pulse multiplier unit for increasing duration of the laser output pulses from the second laser unit.

71. A laser as in claim 70 wherein the pulse multiplier unit is arranged to receive said laser output pulse beam and to multiply the number of pulses per second by at least a factor of two so as to produce a single multiplied laser output pulse beam comprised of a larger number of laser output pulses with substantially reduced intensity values as compared with the laser output pulses, and pulse multiplier unit comprising: (1) a first beam splitter arranged to separate a portion of said laser output pulse beam, the separated portion defining a delayed portion, and the laser output pulse beam defining a beam size and angular spread at said first beam splitter; (2) a first delay path originating and terminating at said first beam splitter said first delay path comprising at least two focusing mirrors, said mirrors being arranged to focus said delayed portion at a focal point within said first delay path and to return said delayed portion to said first beam splitter with a beam size and angular spread equal to or approximately equal to the beam size and angular spread of the laser output pulse beam at said first beam splitter.

72. A laser system as in claim 71 wherein said at least two focusing mirrors are spherical mirrors.

73. A laser system as in claim 72 and further comprising a second delay path comprising at least two spherical mirrors.

74. A laser as in claim 71 wherein said first delay path comprises a second beam splitter and further comprising a second delay path comprising at least two focusing mirrors, said mirrors being arranged to focus said delayed portion at a focal point within said first delay path and to return said delayed portion to said first beam splitter with a beam size and angular spread equal to or approximately equal to the beam size and angular spread of the laser output pulse beam at said first beam splitter.

75. A laser as in claim 71 wherein said first beam splitter is configured to direct a laser beam in at least two directions utilizing the optical property of frustrated internal reflection.

76. A laser as in claim 71 wherein said first beam splitter is comprised of two transparent optical elements each element having a flat surface, said optical elements being positioned with said flat surfaces parallel to each other and separated by less than 200 nm.

77. A laser as in claim 71 wherein said first beam splitter is an uncoated optical element oriented at an angle with said laser output pulse beam so as to achieve a desired reflection-transmission ratio.

* * * * *